US010158037B2

United States Patent
Fafard et al.

(10) Patent No.: US 10,158,037 B2
(45) Date of Patent: Dec. 18, 2018

(54) TRANSDUCER TO CONVERT OPTICAL ENERGY TO ELECTRICAL ENERGY

(71) Applicant: Avago Technologies International Sales Pte. Limited, Singapore (SG)

(72) Inventors: Simon Fafard, Ottawa (CA); Denis Masson, Ottawa (CA)

(73) Assignee: Avago Technologies International Sales Pte. Limited, Singapore (SG)

( * ) Notice: Subject to any disclaimer, the term of this patent is extended or adjusted under 35 U.S.C. 154(b) by 0 days.

(21) Appl. No.: 15/797,827

(22) Filed: Oct. 30, 2017

(65) Prior Publication Data

US 2018/0062020 A1 Mar. 1, 2018

Related U.S. Application Data

(63) Continuation-in-part of application No. 15/609,771, filed on May 31, 2017, which is a continuation-in-part (Continued)

(51) Int. Cl.
*H01L 31/06* (2012.01)
*H01L 31/10* (2006.01)
(Continued)

(52) U.S. Cl.
CPC .......... *H01L 31/10* (2013.01); *H01L 31/0304* (2013.01); *H01L 31/0693* (2013.01);
(Continued)

(58) Field of Classification Search
CPC .. H01L 31/101; H01L 31/0304; H01L 31/028
See application file for complete search history.

(56) References Cited

U.S. PATENT DOCUMENTS 4,127,862 A 11/1978 Ilegems et al.
4,631,352 A * 12/1986 Daud .................. H01L 31/0687
136/249

(Continued)

OTHER PUBLICATIONS

SZE "Photonic Devices," Semiconductor Devices—Physics and Technology, 2nd Ed. Chapter 9, 2002, 6 pages.
(Continued)

*Primary Examiner* — Dale E Page
*Assistant Examiner* — Wasiul Haider
(74) *Attorney, Agent, or Firm* — Sheridan Ross P.C.

(57) ABSTRACT

An optical transducer, optoelectronic device, and semiconductor are disclosed. An illustrative optical transducer is disclosed to include a plurality of p-n stacks, where each p-n stack comprises at least a p-layer and an n-layer, and formed therein a built-in photovoltage between the p-layer and the n-layer. The p-layers and n-layers are disclosed to have substantially the same n-type material in substantially the same composition such that each p-n stack in the plurality of p-n stacks has a substantially similar built-in photovoltage. The optical transducer is further disclosed to include a plurality of connecting layers, each connecting layer in the plurality of connecting layers being sandwiched between two adjacent p-n stacks for electrically connecting the two adjacent p-n stacks. The p-n stacks in the plurality of p-n stacks may be arranged such that the built-in photovoltage of each p-n stack additively contributes to an overall electric potential of the transducer.

19 Claims, 30 Drawing Sheets

Related U.S. Application Data of application No. 14/565,141, filed on Dec. 9, 2014, now Pat. No. 9,673,343.

(60) Provisional application No. 61/913,675, filed on Dec. 9, 2013.

(51) Int. Cl.

| | | |
|---|---|---|
| *H01L 31/0304* | (2006.01) | |
| *H01L 31/0693* | (2012.01) | |
| *H01L 31/0735* | (2012.01) | |
| *H01L 31/103* | (2006.01) | |
| *H01L 31/109* | (2006.01) | |
| *H01L 31/14* | (2006.01) | |
| *H01L 31/18* | (2006.01) | |
| *H02S 40/44* | (2014.01) | |

(52) U.S. Cl.
CPC ........ *H01L 31/0735* (2013.01); *H01L 31/109* (2013.01); *H01L 31/1035* (2013.01); *H01L 31/14* (2013.01); *H01L 31/1852* (2013.01); *H02S 40/44* (2014.12); *Y02E 10/544* (2013.01)

(56) References Cited

U.S. PATENT DOCUMENTS

| | | |
|---|---|---|
| 5,342,451 A | 8/1994 | Virshup |
| 6,903,533 B1 | 6/2005 | Geren et al. |
| 7,812,249 B2 | 10/2010 | King et al. |
| 7,813,646 B2 | 10/2010 | Furey |
| 8,073,645 B2 | 12/2011 | Fafard |
| 8,742,251 B2 | 6/2014 | Werthen et al. |
| 9,673,343 B2 | 6/2017 | Fafard et al. |
| 2008/0197341 A1 | 8/2008 | Mears et al. |
| 2010/0326496 A1 | 12/2010 | Bhattacharya et al. |
| 2012/0186641 A1 | 7/2012 | Sharps et al. |
| 2012/0203387 A1 | 8/2012 | Takayama et al. |
| 2012/0279563 A1 | 11/2012 | Meir et al. |
| 2012/0285519 A1 | 11/2012 | Hoffman et al. |
| 2013/0133730 A1 | 5/2013 | Pan et al. |
| 2013/0337601 A1 | 12/2013 | Kapur et al. |
| 2014/0076388 A1 | 3/2014 | King et al. |
| 2014/0076401 A1 | 3/2014 | King et al. |
| 2017/0271542 A1 | 9/2017 | Fafard et al. |

OTHER PUBLICATIONS

International Search Report and Written Opinion for International Patent Application No. PCT/CA2014/051191, dated Mar. 10, 2015.
Third Party Observation for International Patent Application No. PCT/CA2014/051191, dated Apr. 12, 2016.
Official Action for U.S. Appl. No. 14/565,141, dated Dec. 23, 2015, 21 pages.
Official Action for U.S. Appl. No. 14/565,141, dated Jun. 17, 2016, 18 pages.
Official Action for U.S. Appl. No. 14/565,141, dated Nov. 8, 2016, 19 pages.
Notice of Allowance for U.S. Appl. No. 14/565,141, dated Feb. 3, 2017, 7 pages.
Jasprit Singh, Semiconductor Devices: Basic Principles, 2001, John Wiley, 18 pages.
Horst Zimmermann, Integrated Silicon Optoelectronics, 2000, Springer, 10 pages.
Official Action for U.S. Appl. No. 15/609,771, dated May 16, 2018 11 pages.

\* cited by examiner

TRANSDUCER TO CONVERT OPTICAL ENERGY TO ELECTRICAL ENERGY

CROSS REFERENCE TO RELATED APPLICATIONS

This application is a Continuation-in-Part of U.S. patent application Ser. No. 15/609,771, filed on May 31, 2017, which is a Continuation-in-Part of U.S. patent application Ser. No. 14/565,141, filed on Dec. 9, 2014, which claims the benefit of priority of U.S. Provisional Patent Application No. 61/913,675 filed Dec. 9, 2013; each of which are hereby incorporated herein by reference.

FIELD

The present disclosure relates to devices that convert optical energy into electrical energy.

BACKGROUND

In the technological area of photovoltaics, there exist applications that require the efficient conversion of a narrowband optical input signal into an electrical output signal, for example by producing a direct current (DC) electrical output. In some of these applications, the narrowband optical input signal is provided by a laser or a light emitting diode.

Prior art devices for converting the optical input signal into the electrical output signal include photovoltaic single junction devices, which typically produce a low-voltage electrical output, which can be too constraining for designers. The prior art devices also include photovoltaic multi-junction devices that can have multiple photovoltaic junctions arranged in a same plane and electrically connected to each other in series. Such photovoltaic multi-junction devices can produce higher voltage output signal; however, they require that the multi-junctions have the same dimensions, be arranged symmetrically, and that the impinging narrowband input optical signal be shaped and directed towards the multi-junctions in a way that uniformly illuminates each junction. Further, such photovoltaic multi-junction devices can require complicated fabrication and assembly techniques including, for example, the need for a plurality of deep trenches with high aspect ratio etches in the various semiconductor layers, air bridge metal connectors, multi-level contacts and connections, thick doped semiconductor layers to minimize the sheet resistivity (for example for back contacts or top contacts), etc.

Therefore, improvements in transducer that convert an input optical signal into an output electrical signal are desirable.

SUMMARY

In a first aspect, the present disclosure provides an transducer configured to convert optical energy to electrical energy. The transducer is disclosed to include a plurality of p-n stacks, where each p-n stack includes at least a p-layer and an n-layer, and formed therein a built-in photovoltage between the p-layer and the n-layer. In some embodiments, all of the p-layers include substantially the same p-type material in the same composition and all the n-layers include substantially the same n-type material in the same composition such that each p-n stack has a substantially similar built-in photovoltage. The transducer is further disclosed to include a plurality of connecting layers, each connecting layer being sandwiched between two adjacent p-n stacks for electrically connecting the two adjacent p-n stacks. In some embodiments, each p-n stack is arranged such that the built-in photovoltage of each p-n stack adds up to form an overall electric potential of the transducer.

Other aspects and features of the present disclosure will become apparent to those ordinarily skilled in the art upon review of the following description of specific embodiments in conjunction with the accompanying figures.

BRIEF DESCRIPTION OF THE DRAWINGS

Embodiments of the present disclosure will now be described, by way of example only, with reference to the attached Figures.

DETAILED DESCRIPTION

Generally, the present disclosure provides a Harmonic Photovoltage Up-converter for High-Efficiency Photon to Direct-Current (DC) Phototransducer Power Conversion Applications. A transducer converts one form of energy into another form of energy, for example optical energy into electrical energy. The phototransducer of the present disclosure converts an optical input into and an electrical output preferably with a high conversion efficiency based on a direct current/voltage output. The optical input preferably includes a beam of light, for example a laser light beam. The beam of light is typically propagated from the source to the phototransducer. The propagation of the beam of light can be done with a collimated beam thru free-space, such as air, other gases, or vacuum. Alternatively the propagation of the beam of light can be done through a solid medium such as an optical fiber, a waveguide, or a light guiding medium which can also include liquid a medium, which can all be considered part of the light source. For example the phototransducer of the present disclosure can be placed at the receiving end of a light beam propagated thru an optical fiber to deliver power from a distant source to a remote equipment which will use the voltage or current converted by the phototransducer. For clarity, a light source, preferably in the form of a beam, provides an optical input for the phototransducer of the present disclosure.

Figure 1:
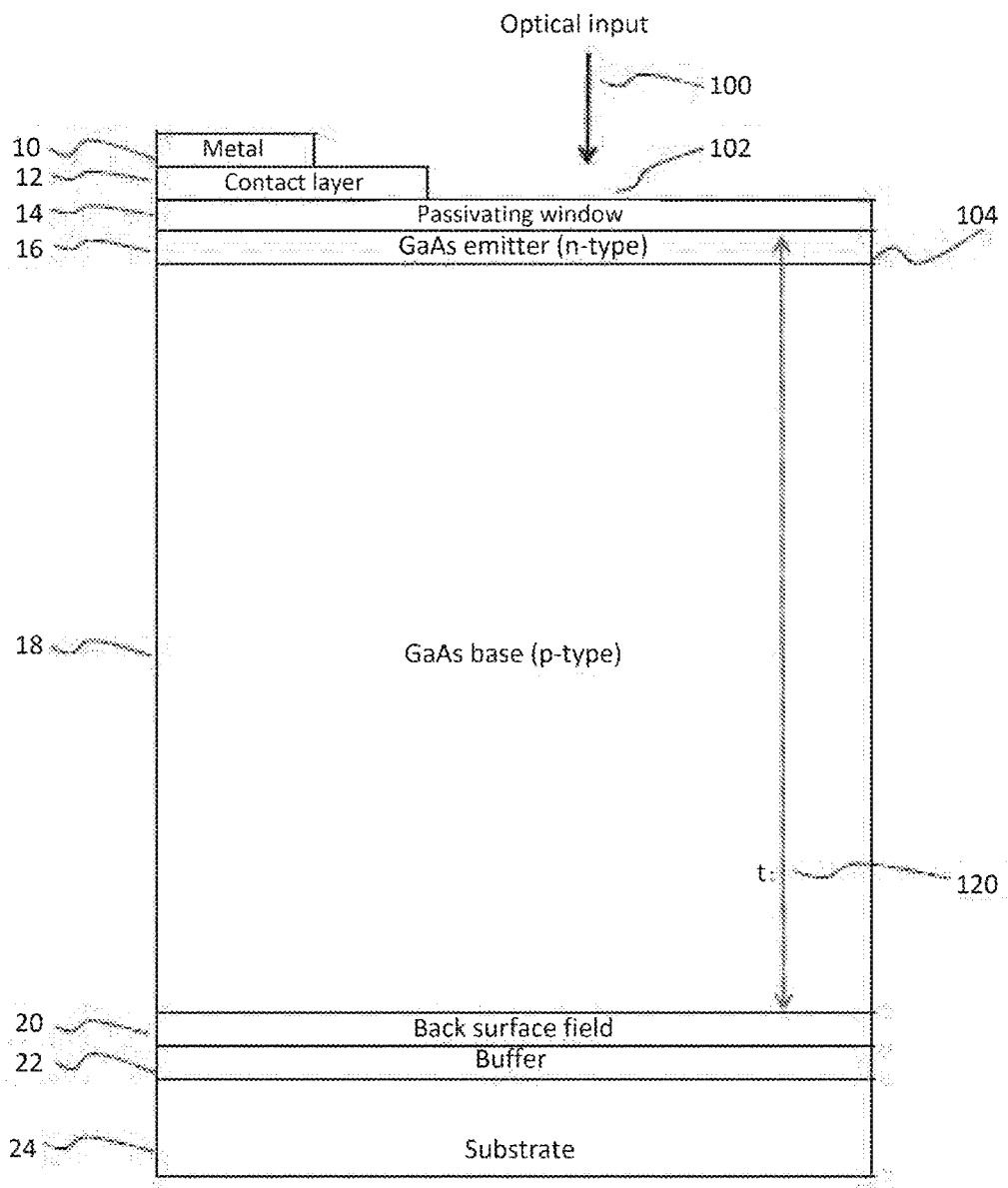
FIG. 1 shows a prior art p-n junction.

State-of-the-art PV devices are most often based on a single p-n junction such as shown in FIG. 1, which includes an emitter 16 and a base 18 made of semiconductors doped with dopants of opposite polarity (p or n). The base 18 and the emitter 16 form a p-n junction 104, and together have a thickness (t) 120 of semiconductor material that absorbs an optical input 100 which is impinging the front surface 102 of the PV device. The performance of the single junction PV device can be improved by using a passivating window 14, doped with the same doping type as the emitter 16 and disposed between the front surface 102 and the emitter 16. A contact layer 12 and/or a metal layer 10 can be used to extract the current and voltage generated by the single junction PV device. The contact layer 12 and/or the metal layer 10 can be patterned using standard photolithography techniques or deposited such that only a fraction of the front surface 102 is covered in order to efficiently let the optical input reach the absorbing thickness 120 of the semiconductor emitter 16 and base 18.

Optically transparent but electrically conducting layers can also be used in conjunction with or in substitution to the contact or metal layers 12, 10. The layers such as the base 18 and the emitter 16 are typically grown on a substrate 24 which can serve as a mechanical support and which can define the lattice constant of the semiconductor crystal grown on the substrate 24. A buffer layer 22 can be disposed between the substrate 24 and the base 18 to adjust the crystal quality and/or for other fabrication, optical, electrical, or crystal growth purposes. For example the buffer 22 can be used to provide electrical conductivity (lateral sheet conductivity or vertical conductivity to extract the current) or to change the optical properties of the single junction PV device. The performance of a single junction PV device can be further improved by using a back surface field (BSF) layer 20, doped with the same doping type as the base 18 and disposed between the substrate 24 and the base 18. The optical input 100 is absorbed within the thickness 120 of the emitter and base, and the minority photo-carriers in the base and in the emitter are swept across the p-n junction 104 developing a photo-current and photo-voltage across an external circuit which can be connected to the top metal 10 and the substrate 24.

For a PV device, the optimum conversion performance, often referred to as the conversion efficiency, defined as the ratio of the optical power impinging from on the PV device to the electrical power output from the PV device, is obtained when the PV device is operated near or at the maximum power point of the current-voltage curve (I-V curve) of the PV device. The maximum power point of the I-V curve corresponds to the point at which the product of the output voltage (Vmax) and the output current (Imax) has reached a maximum. That point defines the fill-factor coefficient (also known has the filling factor coefficient) $FF=(Vmax*Imax)/(Voc*Isc)$, where Voc is the open circuit voltage of the PV device and Isc is the short current value of the PV device. It is sometimes also convenient to define the 'voltage FF' (FFv), and the 'current FF' (FFi) as $FFv=Vmax/Voc$ and $FFi=Imax/Isc$, such that $FF=FFv*FFi$. The PV device can be operated under different current-voltage settings by changing the impedance of the load to which it is electrically connected. For example an external load connected to the PV device with the optimal impedance, also known as the optimum load, optimum impedance, or optimum circuit resistance, will drive the phototransducer to operate near its maximum power point.

The optical input signal has a light wavelength ($\lambda$ or lambda), a light frequency ($\nu$), a light energy (or photon energy) $E=h\nu$ or equivalently $E=hc/\lambda$, where h is Planck's constant and c is the speed of light. The optical input signal can be monochromatic in which case the photons comprising the optical input all have the same wavelength and frequency. The optical input signal can comprise a band of wavelength or colors, in which case the photons comprising the optical input all have a wavelength and frequency around a mean value. The width of the band of wavelength can be referred to as the bandwidth of the optical input signal. For example the optical input signal can be broadband or narrowband. The optical input signal can have more than one band of wavelengths, for example multiple bands each band being centered at a mean frequency. In the case of multiband optical input signals, the PV device can be optimized for one of the band of wavelengths. For the description below, when the light input has a band of frequencies or wavelengths, then the mean frequency or wavelength of that band will be taken as the frequency or the wavelength of the optical input signal. In the case for which the optical input has a band of frequencies or wavelengths, then the PV device can be optimized for a narrow band optical input, for example, for a bandwidth of less than 500 nm, or a bandwidth of less than 100 nm, or a bandwidth of less than 20 nm.

The optical input signal can be said to have an equivalent light photovoltage: $h\nu/e$, where e is the charge of the electron. For example if the optical input has a wavelength of $\lambda=830$ nm, the light energy is $E=1240$ eV*nm/830 nm=1.494 eV. Then the light photovoltage of the optical input signal is 1.494V. The transducer of the present disclosure is capable of converting the optical input signal to voltage that is greater than that of the optical input photovoltage. For example, in some embodiments, the transducer of the present disclosure is capable of converting and optical input signal having a photovoltage of about 1.5 volts into an electrical output voltage comprised between 2V and 20V, or between 2V and 12V, or between 2V and 8V. The output voltage of the transducer can be the maximum power voltage point of the transducer (often labelled Vmpp, or Vmax). Alternatively, the photovoltage output of the phototransducer can be any voltage that the device can produce between 0V and the open circuit voltage Voc. The photocurrent output of the transducer can be the maximum power current point of the transducer (often labelled Impp, or Imax). Alternatively, the photocurrent output of the transducer can be any current that the device can produce between 0 A and the short-circuit current Isc.

Figure 2:
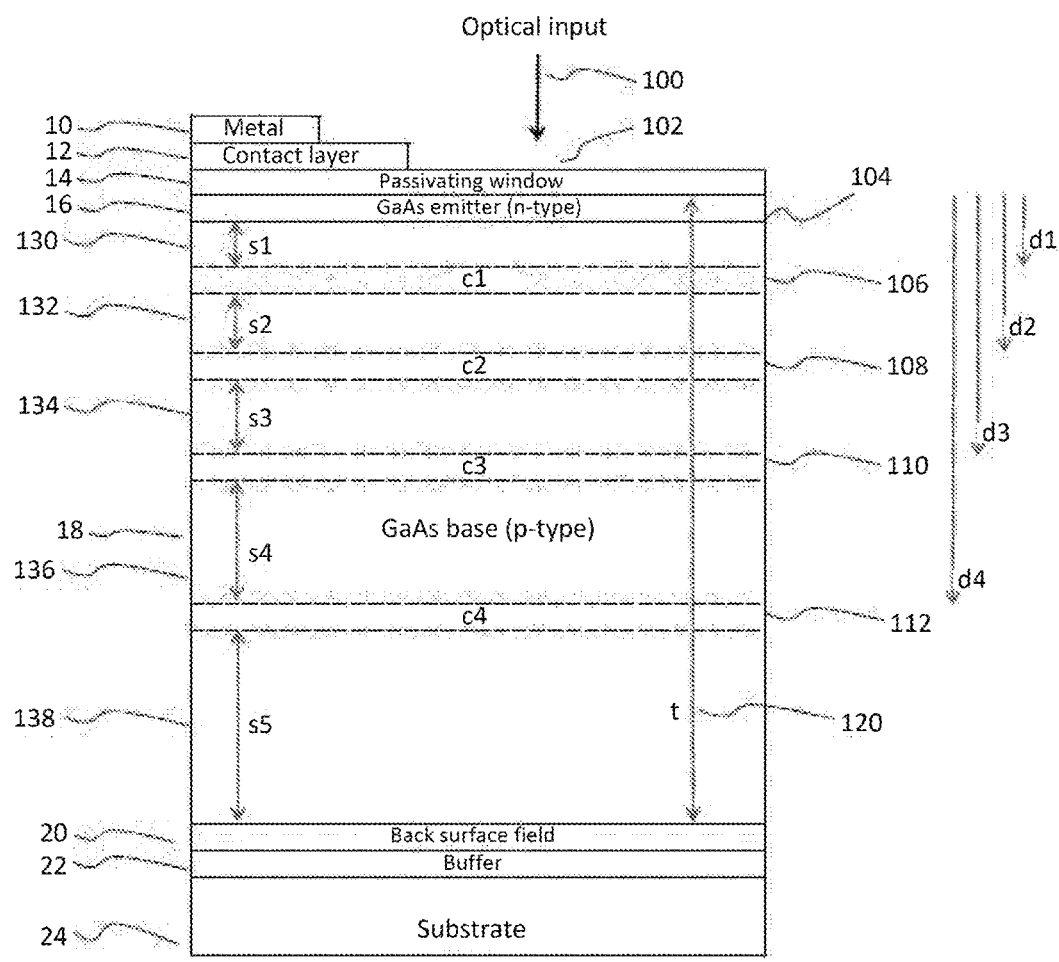
FIG. 2 shows an embodiment of a transducer in accordance with the present disclosure.

An embodiment a transducer of the present disclosure is shown in FIG. 2. Similarly to a state-of-the-art single junction PV device of the prior art shown in FIG. 1, the phototransducer device of the present disclosure in FIG. 2 includes a base 18, and an emitter 16 made of semiconductors doped with dopants of opposite polarity (p or n). The base and the emitter form a p-n junction 104, and together have a thickness (t) 120 of semiconductor material absorbing the optical input signal 100 which is impinging the front surface 102 of the transducer. The present embodiment includes a passivating window 14, doped with the same doping type as the emitter and disposed between the front surface 102 and the emitter 16. A contact layer 12 and/or a metal layer 10 can be used to extract the current and voltage generated by the transducer device. The contact layer and/or the metal layers can be patterned using standard photolithography techniques or deposited such that only a fraction of the front surface 102 is covered in order to efficiently let the optical input reach the absorbing thickness 120 of the semiconductor emitter 16 and base 18. Optically transparent but electrically conducting layers can also be used in conjunction with or in substitution to the contact or metal layers 12, 10. The layers such as the base 18 and the emitter 16 are typically grown on a substrate 24 which serves as a mechanical support and which defines the lattice constant of the semiconductor crystal. A buffer layer 22 can be disposed between the substrate 24 and the base 18 to adjust the crystal quality and or for other fabrication, optical, electrical, or crystal growth purposes. For example the buffer 22 is preferably used to provide electrical conductivity (lateral sheet conductivity or vertical conductivity to extract the current) or to change the optical properties of the PV device. A back surface field (BSF) layer 20 is preferably used, doped with the same doping type as the base 18 and disposed between the substrate 24 and the base 18. The BSF and window layers are preferably used to reflect the minority carriers back toward the p/n junction. For example if the base is p-type, the minority carriers in the base are the photo-electrons, then the emitter would be n-type and the minority carriers in the emitter would be the photo-holes. In that case the window would preferably have a band discontinuity in the valence band to reflect the minority holes in the emitter back toward the p/n junction 104, and the BSF would preferably have a band discontinuity in the conduction band to reflect the minority electrons in the base back toward the p/n junction 104. The optical input 100 is absorbed within the thickness 120 of the emitter and base, and the minority photo-carriers in the base and in the emitter are swept across the p/n junction 104 developing a photo-current and photo-voltage across an external circuit which can be connected to the top metal 10 and the substrate 24.

Furthermore, the embodiment of the present disclosure incorporates connecting elements 106 (c1), 108 (c2), 110 (c3), and 112 (c4). In some embodiments, the connecting elements may be referred to as connecting layers in that one or more layers of material are used to fabricate the connecting elements. The connecting elements are positioned at specific distances away from the surface of the emitter 104 closest to the front surface 102. For example as illustrated in FIG. 2, connecting element c1 106 is positioned at a distance d1 from the emitter and window interface, similarly connecting element c2 108 is positioned at a distance d2 from the emitter and window interface, connecting element c3 110 is positioned at a distance d3 from the emitter and window interface, connecting element c4 112 is positioned at a distance d4 from the emitter and window interface. FIG. 2 exemplifies an embodiment with 4 connecting elements; other embodiments can include more than 4 connecting elements or less than 4 connecting elements without departing from the scope of the present disclosure.

FIGS. 3, 4, 5, and 6 make use of semiconductor band diagrams to illustrate how the electrical output voltage of the transducer can be made higher than the input light photo voltage (hv/e) by using connecting elements in accordance with the present disclosure.

Figure 3:
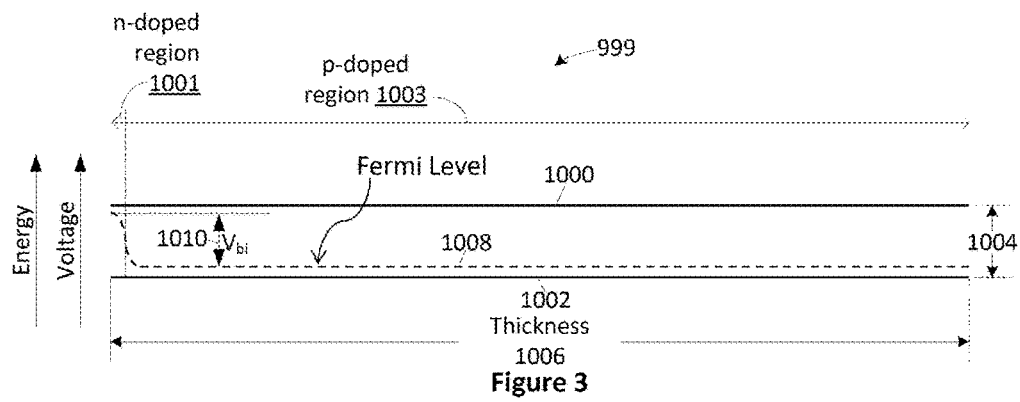
FIG. 3 shows a flat band energy diagram of a homogeneous p-n diode.

FIG. 3 shows a flat band energy diagram of a homogeneous p-n diode 999 in equilibrium with no biasing and no illumination. The lines 1000 and 1002 represent respectively, the conduction band and the valence band. The bandgap energy 1004 is the energy difference between the conduction band 1000 and valence band 1002. The length 1006 of the lines represents the thickness of the semiconductor layers that make up the p-n diode 999. The dotted line 1008 represents the Fermi level (Ef) through the p-n diode 999. The position of the Fermi level 1008 with respect to the conduction and valence band is determined by the doping concentration of the semiconductor material present in the p-n diode 999 and the type of donors, n-type or p-type. The p-n diode 999 has an n-doped region 1001 and a p-doped region 1003. The n-doped region 1001 is the emitter region, the p-doped region is the base region. The Fermi level 1008 is between the valence band 1002 and the conduction band 1000. The doping characteristics of the semiconductor material or materials that make up the p-n diode can be chosen to have the Fermi level 1008 to be within KT~0.025 eV or less from the conduction band in n-type material and similarly within 0.025 eV or less from the valence band in p-type material in order to thermally activate as many donors as possible. "KT" is the product of the Boltzman's constant K and the temperature T in kelvins. This is shown in the flat band energy diagram of FIG. 3, where the Fermi level 1008 shifts its position with respect to the conduction band 1000 and with respect to the valence band 1002 throughout the p-n diode 999 going from the n-doped region 1001 to the p-doped region 1003. The shift or variation in the Fermi level 1008 from the n-doped region 1001 to the p-doped region 1003 can be referred to as a built-in electric potential or as an electric potential 1010, which can be denoted $V_{bi}$. The built-in electric potential 1010 defines the turn-on voltage of the p-n diode. The built-in potential 1010 also defines the voltage produced by the p-n diode 999 upon being illuminated with light having an energy at least equal to that of the bandgap energy 1004. Examples of built-in potentials include, for Si, about 0.7 eV; for GaAs, 1 eV; for InP, 1.3 eV; for Ge, 0.3 eV, for InGaAs, 0.4 eV; for InGaP, 1.4 eV; for AlInP, 2.0 eV; for AlInAs, 1.2 eV; for InAs, less than 0.1 eV. Heterogeneous semiconductors that comprise two or more different semiconductors have built-in potential that are commensurate with their composition.

The p-n diode 999 can absorb light in accordance with an absorption coefficient, which is a function of the materials that make the p-n diode. The total amount of light that can be absorbed by the p-n diode is a function of the absorption coefficient and of the thickness 1006 of the p-n diode.

Figure 4:
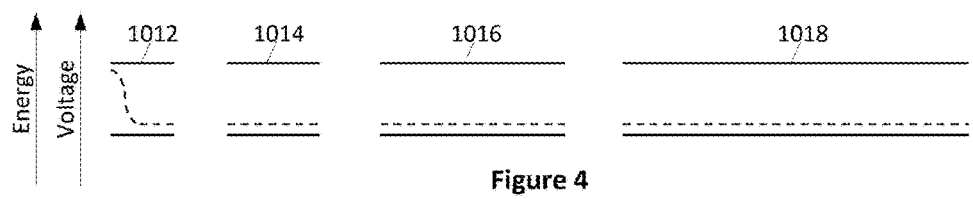
FIG. 4 shows four segments of the p-n diode of FIG. 3.

FIG. 4 shows four segments 1012, 1014, 1016, and 1018 of the p-n diode 999 of FIG. 3. The four segments of FIG. 4 are shown spaced-apart for clarity reasons; however, it is to be understood that the sum of the thicknesses of the segments is equal to the thickness 1006 shown at FIG. 3.

Figure 5:
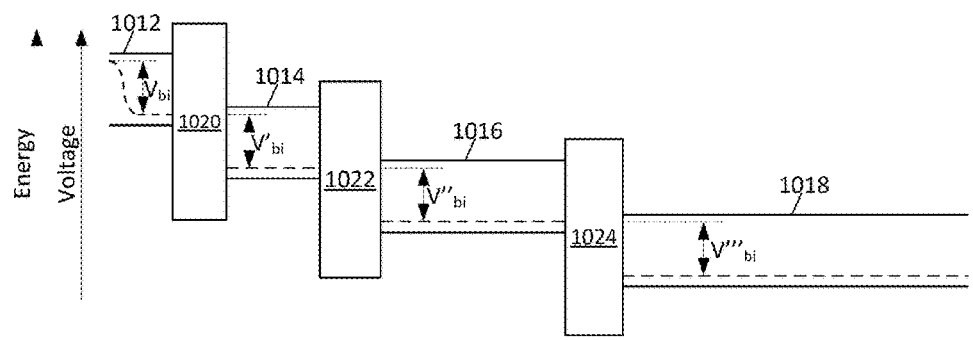
FIG. 5 shows the four segments of FIG. 3 electrically connected to each other with connecting elements.

FIG. 5 shows the four segments 1012, 1014, 1016, and 1018 electrically connected to each other with connecting elements 1020, 1022, and 1024. Each connecting element adjoins (i.e., is in contact with) two of the four segments. Each connecting element is configured to introduce an electric potential between the segments to which each connecting element is connected (electrically connected). The successive built-in electric potentials $V_{bi}$, $V'_{bi}$, $V''_{bi}$, and $V'''_{bi}$ add up to introduce a total built-in electric potential equal to $V_{total}=V_{bi}+V'_{bi}+V''_{bi}+V'''_{bi}$. When all the built-in electric potentials are equal to $V_{bi}$, $V_{total}=4*V_{bi}$.

Figure 6:
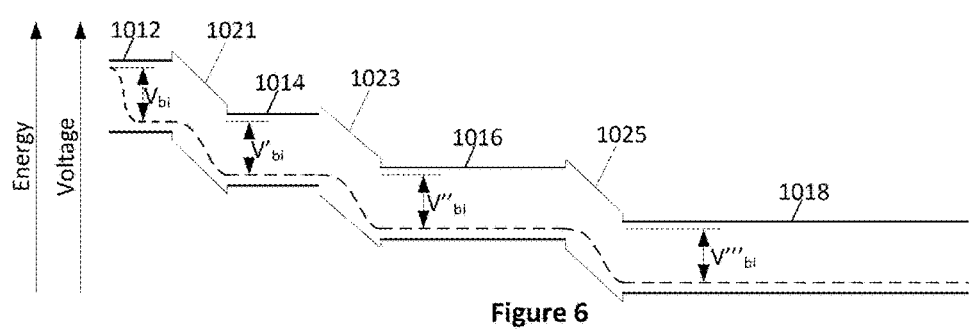
FIG. 6 shows an embodiment of a transducer of the present disclosure that has connecting elements that form tunnel diodes.

FIG. 6 shows an embodiment of a transducer of the present disclosure where the connecting elements comprise highly doped semiconductors that form tunnel diodes 1021, 1023, and 1025. One skilled in the art would know that a pair of highly doped layers comprising a highly doped n-type layer adjacent to a highly doped p-type layer can form a tunnel diode, which, when combined with other semiconductor layers can be referred to as a tunnel diode unit. The tunnel diode unit can be used to pass current from one section to another and or change the polarity of the semiconductor layer sequence in the heterostructure. The n and the p doping level can be $10^{18}$ cm$^{-3}$ or higher up to $5 \times 10^{21}$ cm$^{-3}$.

Each of FIGS. 3, 4, 5, and 6 has a pair of vertical scales, one of which corresponds to energy and the other to voltage. In each of FIGS. 3, 4, 5, and 6, the p-n diode receives light at the emitter side, which is at the n-doped region 1001 side.

FIGS. 3, 4, 5, and 6 show an equilibrium situation where no external voltage is applied and no light is present. In practice, transducers (phototransducers) operate in a forward bias mode with impinging light. A person skilled in the art will understand that the concepts of quasi Fermi levels for both electrons and holes can be introduced to better fine tune and optimize these practical situations. However, the basic principles leading to the output voltage of a transducer being higher than the input light photo-voltage (hv/e) are well known and illustrated in these Figures, which are described above.

Figure 7:
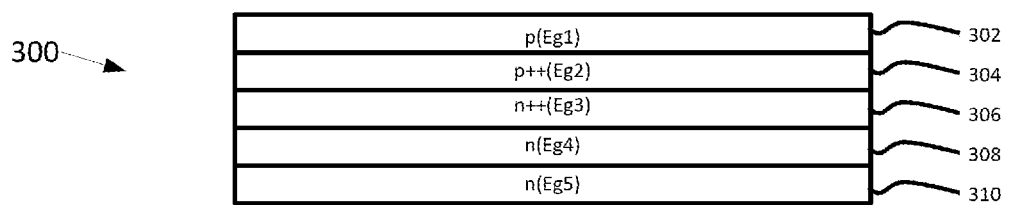
FIG. 7 shows an embodiment of a connecting element of the present disclosure.

FIG. 7 shows an example of a connecting element or connecting layer 300 that can be used as the connecting element c1 106, c2, 108, c3, 110, and/or c4 112 shown in FIG. 2; the connecting element 300 of FIG. 7 can also be used as the connecting element 1020, 1022, and/or 1024 shown at FIG. 5. The following describes the connecting element 300 in relation to base segments 1014, 1016, and 1018 of FIG. 5. The connecting element 300 comprises a first layer 302 closest to the front surface of the phototransducer (closest to the n-doped region 1001 shown at FIG. 3) and is p-doped, as are the base elements 1014, 1016, and 1018 of FIG. 4. The bandgap Eg1 of layer 302 is greater than the bandgap energy of the base elements 1014, 1016, and 1018, and, as such, the layer 302 is transparent to the optical input signal, which has a photon energy value close to that of the bandgap energy 1004 (see FIG. 3).

The connecting element 300 further comprises a second layer 304 that is electrically connected to first layer 302. The second layer 304 is also p-doped; however, the concentration of dopants in the second layer 304 is higher than in the first layer 302. The bandgap Eg2 of second layer 304 is greater than the bandgap energy of the base elements 1014, 1016, and 1018 and, as such, the second layer 304 is transparent to the optical input signal.

The connecting element 300 further comprises a third layer 306 that is electrically connected to the second layer 304. The third layer 306 is n-doped with a high concentration of dopants, the concentration of dopants in the third layer 306 is similar to that of the second layer 304. The bandgap Eg3 of layer 306 is greater than the bandgap energy of the base elements 1014, 1016, and 1018 and, as such, the second layer 304 is transparent to the optical input signal.

The connecting element 300 further comprises a fourth layer 308 electrically connected to the third layer 306 and is n-doped but preferably but at a dopant concentration that is lower than that of the third layer 306. The bandgap Eg4 of layer 308 is greater than the bandgap energy of the base elements 1014, 1016, and 1018 and, as such, the second layer 304 is transparent to the optical input signal.

The connecting element 300 further comprises a fifth layer 310 electrically connected to the fourth layer 308. The fifth layer 310 is n-doped at a similar or lower dopant concentration than the fourth layer 308. The bandgap Eg5 of layer 310 is the same or greater than the bandgap of the base elements 1014, 1016, and 1018.

Figure 8:
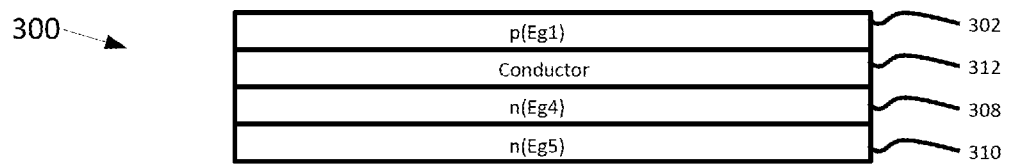
FIG. 8 shows another embodiment of a connecting element of the present disclosure.

Numerous other embodiments of the connecting elements 300 can be designed by incorporating a number of semiconductor layers either fewer or higher than the layers illustrated and described in FIG. 7, and without departing from the scope of the present disclosure. As an example, FIG. 8 shows an embodiment where, instead of having the second and third layers 304 and 306, there is a conductor layer 312. Other specific examples are described further below. N-type and p-type doping of the various layers of transducer can be effected through any suitable technique using any suitable type of dopants. For an example, for InP, GaAs, and related compounds, n-type doping can effected by, for example, Si, Ge, Te, S, Sn atoms, and p-type doping can be effected by, for example, Zn, C, Cd, Mg, Si, Ge, Cr, and Be atoms.

The number of connecting elements present in a transducer in accordance with the present disclosure will help determine the output voltage of the transducer: for example, when the output voltage of the p-n diode 999 of FIG. 3 element has a value X, then the output voltage of a transducer of the present disclosure having one connecting element will be approximately 2×, or, the output voltage of a transducer of the present disclosure designed with two connecting elements will be approximately 3×, or the output voltage of a transducer of the present disclosure designed with three connecting elements will be approximately 4×, or, the photovoltage of the a transducer of the present disclosure designed, as illustrated in FIG. 2, with 4 connecting element c1 106, c2 108, c3 110, and c4 112 will be approximately 5×. The exact value of the voltage (photovoltage) generated by each base segment may vary slightly. The variations can be caused for example because of the different thickness of the individual base segments, because of a different built-in electric fields resulting from different thicknesses or doping profiles, because of a different doping concentration in each base segment, because of the photon reabsorption from one base segment to another, or because of other growth or fabrication parameters such as the growth temperature used during the growth of the various segments, or slight variations in alloy composition during the growth. For example, a thinner base segment will typically generate a higher photovoltage, due to the higher probability of extraction of the photo-carriers. For example, the above, or other, intrinsic or extrinsic effects can result in different effective ideality factors, or n-factors, in the various base segments. Importantly, the transducer of the present disclosure can readily benefit from higher photo-voltages generated from such thinner base segments. This is in contrast to the case for which a prior art phototransducer is constructed without the multiple base segments and connecting elements disclosed herein. In the latter case, a prior art phototransducer that would be designed with a p-n junction having a thinner base would also typically exhibit a higher photovoltage than the equivalent p-n junction having a thicker base, but it would have lower overall performance because the thinner base will not be capable of absorbing all of the photons from the optical input. In the present disclosure, the input light that is not absorbed in the upper base segments is absorbed in the lower base segments, such that substantially all the photons of the optical input are absorbed. However, because each individual base segment is thinner than the base segment thickness that would be necessary to absorb all the incoming light, each base segment can generate a slightly higher photovoltage than it would if it had been thicker.

As will be understood by the skilled artisan, the number of connecting elements required may be commensurate with the desired output voltage of a transducer in accordance with the present disclosure. For example, if X is the output voltage of a p-n diode such as shown at reference numeral 999 in FIG. 3, which does not have any collecting element, the $Y=(n+1)X$ will be the output voltage of a transducer according to the present disclosure having n connecting element(s), where n is an integer number having any suitable value. For example n can be between 1 and 20, or between 1 and 10, or between 1 and 5. That is the output voltage of a transducer according to the present invention is a multiple of the output voltage of a similar transducer that does not incorporate any connecting element. Correspondingly, it could be said that the photovoltage of the phototransducer according to the present disclosure as an output photovoltage which is a harmonic value of the photovoltage of a similar PV device not incorporating the connecting elements, as illustrated in FIG. 2 and described herein. For clarity, the harmonic value or the multiplication factor of the output voltage of the present disclosure is determined by the number of connecting elements formed in the transducer.

With reference to FIGS. 1 and 2, to achieve the desired optoelectronic properties of the phototransducer of the present disclosure, the connecting elements in the embodiment of FIG. 2 divide the thickness t of the base 18 of the transducer into multiple base segments. For example the base segment s1 130, the base segment s2 132, the base segment s3 134, the base segment s4 136, and the base segment s5 138, as illustrated in FIG. 2. The thicknesses of the various base segments (s1, s2, s3, s4, s5) can be the same or they can be different by adjusting the position of the connecting elements. That is the position d1 of c1, the position d2 of c2, the position d3 of c3, and the position d4 of c4 can be adjusted to change the thicknesses of the various base segments. The values of d1, d2, d3, d4 can be chosen such that the thickness of s5 138 is greater than the thickness of s4 136, and the thickness of s4 136 is greater than the thickness of s3 134, and the thickness of s3 134 is greater than the thickness of s2 132, the thickness of s2 132 is greater than the thickness of s1 130.

The value of d1, d2, d3, d4 can be chosen such that each base segment (s1, s2, s3, s4, s5) absorbs substantially the same fraction of the photons from the optical input 100. For example s1 absorbs 20% of the photons from the optical input, s2 absorbs 20% of the photons from the optical input, s3 absorbs 20% of the photons from the optical input, s4 absorbs 20% of the photons from the optical input, and s5 absorbs 20% of the photons from the optical input. To obtain an ideal phototransducer, all the base segments taken together absorb substantially all the photons from the optical input 100. But for manufacturing or cost considerations, and depending on the application for the phototransducer, it may be desirable that all the base segments together absorb less than all the photons from the optical input 100. For example, the various base segments s1, s2, s3, s4, and s5 can absorb each 19.8% of the optical input 100. It will also be clear for one skilled in the art that the thickness t of the base 18 and the absorption coefficient of the semiconductor material used to construct the base will be important factors in determining the fraction of the optical input signal absorbed by each base segment and in total by the group of base segments all together.

Therefore, for most direct bandgap III-V semiconductors, the thickness t of the base 18 will not exceed 5 microns and will, in some embodiments, be between 3 microns and 4 microns. For example, neglecting the reflection at the surface of the transducer, which is a valid approximation for transducer having an antireflection coating at the front surface 102, the light intensity transmitted at a depth z from the surface of the semiconductor is given by $I(z)=I_o \exp(-\alpha z)$. $I_o$ is the input intensity (such as the initial intensity of the optical input signal 100 in FIG. 2) and $\alpha$ is the semiconductor absorption coefficient, which is a function of the wavelength dependent density of states of the material (i.e., $\alpha$ is wavelength dependent). For a sufficiently thick semiconductor material, only light having a wavelength longer than the semiconductor bandgap equivalent wavelength (or with an energy less than the bandgap energy) will transmit through the semiconductor layer since the density of states drops, as does $\alpha$, for photon energies less than the bandgap energy. For direct bandgap semiconductors, at wavelengths shorter than the bandgap wavelength, $\alpha$ is in the $10^4$ cm$^{-1}$ to $10^5$ cm$^{-1}$ range and each impinging photon can create a pair of photocarriers; that is, an electron and a hole.

The semiconductor in the base layer 18 can be substantially lattice-matched or pseudomorphic to the substrate 24. Epitaxial layers that do not have strain-induced defects are often called pseudomorphic layers. Pseudomorphic heterostructures can contain strained layers but only to the extent that elastic deformations are able to accommodate that strain such that no defects are generated by excess stresses or strains in the device. That is the lattice constant of the semiconductor used for the base layer 18 or the base segments 130, 132, 134, 136, and 138 is preferably substantially the same as the lattice constant of the substrate 24. Lattice-matched layers help assure good crystal quality, low defect densities, long minority carrier lifetimes, low parasitic currents, low dopant diffusion, low alloy diffusion, low shunting, and therefore higher transducer performance. Alternatively, the base layer 18 can be metamorphic and therefore have a lattice-mismatched to the substrate 24. For metamorphic layers, the buffer 22 can be used to adjust the lattice parameter of the semiconductor layers from the lattice parameter of the substrate 24 to the desired lattice constant value for the base 18. For metamorphic layers, the buffer 22 can be graded in composition or comprise various layers with different lattice constants to accommodate the stresses or the strains due to the lattice-mismatched.

Examples of lattice-matched or pseudomorphic semiconductors that can be used for the base layer 18 or the base segments 130, 132, 134, 136, and 138 for embodiments comprising a GaAs substrate 24 include: binary GaAs, AlAs, or ZnSe; or ternary $Al_xGa_{(1-x)}As$, $In_xGa_{(1-x)}P$, $Al_xGa_{(1-x)}P$; or quaternary InGaAsP, GaInNAs. As will be understood by a worker skilled in the art, other alloys can also be used such as: group IV semiconductors: Ge, SiGe; other III-V alloys of AlGaInNPAsSb; other II-VI alloys of ZnCdMnMgOSSeTe, or combinations of the above. Other embodiments can incorporate nanostructures to enhance the optical properties, electronic properties, and/or material properties. For example the base 18 could comprise layers of semiconductor quantum wells, quantum wires, or quantum dots.

Examples of lattice-matched or pseudomorphic semiconductors that can be used for the base layer 18 or the base segments 130, 132, 134, 136, and 138 for embodiments comprising a Ge substrate 24 include: latticed-matched Ge, $In_xGa_{(1-x)}As$, InAlGaAs, $In_xGa_{(1-x)}P$, $Al_xGa_{(1-x)}P$; or binary GaAs, AlAs, or ZnSe; or ternary $Al_xGa_{(1-x)}As$; or quaternary InGaAsP, GaInNAs. As will be understood by a worker skilled in the art, other alloys can also be used such as: group IV semiconductors: Ge, SiGe; other III-V alloys of AlGaInNPAsSb; other II-VI alloys of ZnCdMnMgOSSeTe. Other embodiments can incorporate nanostructures to enhance the optical properties, electronic properties, and/or material properties. For example, the base 18 could include layers of semiconductor quantum wells, quantum wires, or quantum dots.

Examples of lattice-matched or pseudomorphic semiconductors that can be used for the base layer 18 or the base segments 130, 132, 134, 136, and 138 for embodiments comprising a InP substrate 24 include: latticed-matched InP, $In_xGa_{(1-x)}As$, $In_xAl_{(1-x)}As$, $In_xGa_{(1-x)}P_yAs_{(1-y)}$, $GaAs_ySb_{(1-y)}$, $Zn_xCd_{(1-x)}Se$, $ZnSe_yTe_{(1-y)}$; or GaInNAs. As will be understood by a worker skilled in the art, other alloys can also be used alone or combined together comprising: Ge, SiGe; other III-V alloys of AlGaInNPAsSb; other II-VI alloys of ZnCdMnMgOSSeTe. Other embodiments can incorporate nanostructures to enhance the optical properties, electronic properties, and/or material properties. For example the base 18 can comprise layers of semiconductor quantum wells, quantum wires, or quantum dots.

Examples of lattice-matched or pseudomorphic semiconductors that can be used for the base layer 18 or the base segments 130, 132, 134, 136, and 138 for embodiments comprising a Si substrate 24 include: latticed-matched Si, GaP, AlP, $Al_xGa_{(1-x)}P$, ZnS, GaPN, AlPN, $Al_xGa_{(1-x)}PN$. As will be understood by a worker skilled in the art, other alloys can also be used alone or combined together comprising: Ge, SiGe; other III-V alloys of AlGaInNPAsSb; other II-VI alloys of ZnCdMnMgOSSeTe. Other embodiments can incorporate nanostructures to enhance the optical properties, electronic properties, and/or material properties. For example the base 18 can comprise layers of semiconductor quantum wells, quantum wires, or quantum dots.

Examples of lattice-matched or pseudomorphic semiconductors that can be used for the base layer 18 or the base segments 130, 132, 134, 136, and 138 for embodiments comprising a GaN, a SiC, or a Sapphire substrate 24 include: latticed-matched GaN, or AlInN. As will be understood by a worker skilled in the art, other alloys can also be used alone or combined together comprising: ZnO, or other III-V alloys of AlGaInNPAsSb; other II-VI alloys of ZnCdMnMgOSSeTe. Other embodiments can incorporate nanostructures to enhance the optical properties, electronic properties, and/or material properties. For example the base 18 could comprise layers of semiconductor quantum wells, quantum wires, or quantum dots.

Examples of lattice-matched or pseudomorphic semiconductors that can be used for the base layer 18 or the base segments 130, 132, 134, 136, and 138 for embodiments comprising a InAs or GaSb substrate 24 include: latticed-matched InAs, GaSb, CdSe, AlSb, InPSb, ZnTe, CdSTe, CdSeTe, MnSeTe. As will be understood by a worker skilled in the art, other alloys can also be used alone or combined together comprising: other III-V alloys of AlGaInNPAsSb; other II-VI alloys of ZnCdMnMgOSSeTe. Other embodiments can incorporate nanostructures to enhance the optical properties, electronic properties, and/or material properties. For example the base 18 could comprise layers of semiconductor quantum wells, quantum wires, or quantum dots.

Examples of lattice-matched or pseudomorphic semiconductors that can be used for the base layer 18 or the base segments 130, 132, 134, 136, and 138 for embodiments comprising a CdTe or InSb substrate 24 include: latticed-matched CdTe or InSb. As will be understood by a worker skilled in the art, other alloys can also be used alone or combined together comprising: other III-V alloys of AlGaInNPAsSb; other II-VI alloys of ZnCdMnMgOSSeTe. Other embodiments can incorporate nanostructures to enhance the optical properties, electronic properties, and/or material properties. For example the base 18 could comprise layers of semiconductor quantum wells, quantum wires, or quantum dots.

FIG. 2 exemplifies an embodiment of a transducer in accordance with the present disclosure where GaAs or Ge is used for the substrate 24. The substrate is p-type to have the same conductivity as the base 18 which is also preferably p type. The base layer 18 can be GaAs, or can include a fraction x of Al using an $Al_xGa_{(1-x)}As$ to optimize the phototransducer's performance according to the wavelength of the optical input 100. The thickness of the base layer is between 1 and 10 microns, or between 2 and 5 microns, or between 3 and 4 microns. A back surface field 20 made of p-type GaInP provides a good minority carrier reflector for the minority electron photo-generated in the base 18 by the optical input 100. The thickness of the back surface field is between 10 nm and 2 microns, or between 20 nm and 500 nm, or between 80 and 120 nm. A buffer layer 22 is optional but can be used to insure that the epilayer surface and/or the growth conditions are optimized before the growth of the optically active layers atop the substrate and buffer layers. The buffer layer 22 can be p-type GaAs or p-type GaInP. The thickness of the buffer is between 10 nm and 10 microns, or between 100 nm and 2000 nm, or between 200 and 500 nm. The emitter 16 can be n-type GaAs, or can include a fraction x of Al using an n-type $Al_xGa_{(1-x)}As$ to optimize the phototransducer's performance according to the wavelength of the optical input 100. Alternatively an n-type GaInP can also be used for the emitter layer 16. The thickness of the emitter layer 16 can be between 10 nm and 1000 nm, or between 20 nm and 200 nm, or between 80 and 120 nm.

A passivating window 14 (which can also be called a passivation window, or simply a window layer) made of n-type GaInP or AlInP provides a good minority carrier reflector for the minority holes photo-generated in the emitter 16 by the optical input 100. The window layer can comprise a number of layers with different values of doping and bandgap energies to optimize the optoelectronic properties of the phototransducer. The window layer can be adjacent to, and in electrical contact with the emitter layer and the contact layer. The window layer can also play other functions in the device to improve the crystal quality, to optimize the photon absorption and photo-carrier extraction, and/or to transition the growth process from one section of layers to another. The doping in the window layers can also be increased to minimize resistive losses due to the current flowing from and into the emitter of the top junction 16 to the top n-type ohmic metal contact 10. The thickness of the window can be between 10 nm and 5 microns, or between 20 nm and 2000 nm, or between 30 and 1000 nm. The window layer can be transparent to the optical input 100. Alternatively the window composition could also be $Al_xGa_{(1-x)}As$ with an Al composition x such that the band gap of the window is greater than the energy of the photons from the optical input 100 and also greater than the bandgap of the emitter 14. The window can also be divided into 2 sections: a first section adjacent to the emitter having a lower bandgap than the second section adjacent to the front surface 102 and/or the contact layer 12. For example, the first section of the window can be made of GaInP and the second section can be made of AlInP.

The ratio of the thickness of the first section over the total thickness of the window can be between 10% and 90%. The window layer can also be a stop-etch in the fabrication process of the phototransducer. For example a wet-etch solution can be chosen to stop on a layer containing a certain concentration of Al, or P, and the design of the layer composition can therefore take into considerations such elements which would facilitate the fabrication processes.

A contact layer 12 can be made of n-type GaAs. The doping level in the contact layer is made high enough to insure a good ohmic contact with a low resistivity with the metal layer 10 deposited atop the contact layer 12. The doping level of the contact layer 12 can be comprised between $5\times10^{17}$ cm$^{-3}$ and $5\times10^{20}$ cm$^{-3}$, or between $10^{18}$ cm$^{-3}$ and $10^{19}$ cm$^{-3}$. The thickness of the contact layer 12 can be comprised between 100 nm and 5000 nm, or between 20 nm and 1000 nm, or between 30 and 500 nm.

The embodiment exemplified in FIG. 2 and described herein gives an example of a n on p configuration, but a worker skilled in the art would recognize that a p on n configuration would give equivalent features and is also within the scope of the present disclosure. For a p on n configuration the doping types are reverse, for example the base 18 would be doped n-type and the emitter would be doped p type, etc.

The doping level for the base layer 18 or the base segments 130, 132, 134, 136, and 138 can be between $5\times10^{15}$ cm$^{-3}$ and $10^{19}$ cm$^{-3}$, or between $5\times10^{16}$ cm$^{-3}$ and 8E18 cm$^{-3}$, or between $5\times10^{17}$ cm$^{-3}$ and $5\times10^{18}$ cm$^{-3}$. The doping level for the emitter layer 16 can be comprised between $10^{16}$ cm$^{-3}$ and $5\times10^{19}$ cm$^{-3}$, or between $10^{17}$ cm$^{-3}$ and $10^{19}$ cm$^{-3}$, or between $5\times10^{17}$ cm$^{-3}$ and $5\times10^{18}$ cm$^{-3}$. The doping level for the window layer 14 can be comprised between $10^{17}$ cm$^{-3}$ and $10^{20}$ cm$^{-3}$, or between $5\times10^{17}$ cm$^{-3}$ and $5\times10^{19}$ cm$^{-3}$, or between $10^{18}$ cm$^{-3}$ and $10^{19}$ cm$^{-3}$. The doping level for the back surface field layer 20 can be comprised between $10^{17}$ cm$^{-3}$ and $10^{20}$ cm$^{-3}$, or between $5\times10^{17}$ cm$^{-3}$ and $5\times10^{19}$ cm$^{-3}$, or between $10^{18}$ cm$^{-3}$ and $10^{19}$ cm$^{-3}$.

As mentioned above, the connecting elements separate the base 18, into multiple base segments, each of can absorb substantially the same fraction of the optical input, and the connecting elements electrically connect adjacent base segments to each other. The connecting elements can be made of metal layers, or transparent conducting oxides layers, or tunnel junction layers, or doped semiconductor layers. The connecting elements may include a semiconductor layer that is doped oppositely to how the semiconductor base layers are doped. That is, the connecting elements may include a semiconductor layer that is n-doped when the semiconductor base layers are p-doped and, the connecting elements may include a semiconductor layer that is p-doped when the semiconductor base layers are n-doped. The various base segments can be mechanically stacked and disposed between the connecting elements or grown on top of each other while being intercalated between the connecting elements. To facilitate the transmission of the optical input from one base segment to the others, and also to facilitate the fabrication process and the quality of the semiconductor materials in the various base segments, it can be advantageous to grow all the base segments and the connecting elements using a continuous epitaxial process. Using different bandgap energy semiconductor materials for the connecting elements as illustrated in FIG. 7 can also be beneficial. It may also be desirable to optimize the doping level and doping type of the various semiconductor layers comprised in the connecting element in order to facilitate the current flow, to optimize the photo-carrier (electron and hole) extraction in presence of the connecting elements, and to allow the photovoltages and photocurrents of the various base segments to be connected. The current flow can comprise the flow of majority carriers or minority carriers within the valence bands or the conduction bands of the transducer, the tunneling of carriers from a conduction band to a valence band or from a valence band to a conduction band, the conversion of minority carriers into majority carriers using p-n junctions, the defect, trap, or mini-band assisted carrier transport, or any combination with other suitable current flows.

For an embodiment in which the base 18 is GaAs, for example p-type GaAs as shown in FIG. 2: layer 302 can be GaInP, AlGaInP, AlAs or AlGaAs with a composition chosen to give a band gap greater than the energy of the photons of the optical input, and the p-type doping level for layer 302 can be comprised between $10^{17}$ cm$^{-3}$ and $10^{20}$ cm$^{-3}$, or between $5\times10^{17}$ cm$^{-3}$ and $5\times10^{19}$ cm$^{-3}$, or between $1\times10^{18}$ cm$^{-3}$ and $10^{19}$ cm$^{-3}$. The thickness of the layer 302 can be between 10 nm and 2 microns, or between 20 nm and 500 nm, or between 80 nm and 120 nm. Layer 304 can be made of GaInP, AlGaAs, AlAs or AlInP with a composition chosen to give a bandgap energy greater than the energy of the photons of the optical input, and the p-type doping level for layer 304 can be comprised between $10^{18}$ cm$^{-3}$ and $10^{21}$ cm$^{-3}$, or between $5\times10^{18}$ cm$^{-3}$ and $5\times10^{20}$ cm$^{-3}$, or between $7\times10^{18}$ cm$^{-3}$ and $5\times10^{20}$ cm$^{-3}$. The thickness of layer 304 can be comprised between 5 nm and 2 microns, or between 10 nm and 500 nm, or between 20 and 200 nm. Layer 306 can be made of GaInP, AlGaAs, AlAs or AlInP with a composition chosen to give a bandgap energy greater than the energy of the photons of the optical input, and the n-type doping level for layer 306 can be comprised between $10^{18}$ cm$^{-3}$ and $10^{21}$ cm$^{-3}$, or between $5\times10^{18}$ cm$^{-3}$ and $5\times10^{20}$ cm$^{-3}$, or between $7\times10^{18}$ cm$^{-3}$ and $5\times10^{20}$ cm$^{-3}$. The thickness of layer 306 can be comprised between 5 nm and 2 microns, or between 10 nm and 500 nm, or between 20 and 200 nm. Layer 308 can be made of GaInP, AlGaAs, with a composition chosen to give a band gap Eg4 greater than the energy of the photons of the optical input, and the n-type doping level for layer 308 can be comprised between $10^{17}$ cm$^{-3}$ and $10^{20}$ cm$^{-3}$, preferably between $5\times10^{17}$ cm$^{-3}$ and $5\times10^{19}$ cm$^{-3}$, or between $10^{18}$ cm$^{-3}$ and $10^{19}$ cm$^{-3}$. The thickness of layer 308 can be comprised between 10 nm and 2 microns, or between 20 nm and 500 nm, or between 80 nm and 120 nm. Layer 310 can comprise GaAs, GaInP, or AlGaAs, with a composition chosen to give a bandgap energy Eg5 equal or greater than the energy of the photons of the optical input, and the n-type doping level for layer 310 can be comprised between $10^{16}$ cm$^{-3}$ and $5\times10^{19}$ cm$^{-3}$, or between $10^{17}$ cm$^{-3}$ and $10^{19}$ cm$^{-3}$, or between $5\times10^{17}$ cm$^{-3}$ and $5\times10^{18}$ cm$^{-3}$. The thickness of layer 310 can be comprised between 10 nm and 1000 nm, or between 20 nm and 200 nm, or between 80 nm and 120 nm.

For the case for which the base 18 is InP, or InGaAsP with a lattice constant similar to the one of InP, or InGaAs with a lattice constant similar to the one of InP, for example, p-type InP, p-type InGaAs, or p-type InGaAsP, the layer 302 can be made of InP, AlInAs, GaInAsP, or AlGaInP, with a composition chosen to give a bandgap Eg1 greater than the energy of the photons of the optical input, and the p-type doping level for layer 302 is between $10^{17}$ cm$^{-3}$ and $10^{20}$ cm$^{-3}$, or between $5\times10^{17}$ cm$^{-3}$ and $5\times10^{19}$ cm$^{-3}$, or between $10^{18}$ cm$^{-3}$ and $10^{19}$ cm$^{-3}$. The thickness of layer 302 can be comprised between 10 nm and 2 microns, or between 20 nm and 500 nm, or between 80 nm and 120 nm. Layer 304 can be made of InP, AlInAs, GaInAsP, or AlGaInP, with a composition chosen to give a bandgap energy Eg2 greater than the energy of the photons of the optical input, and the p-type doping level for layer 304 can be comprised between $10^{18}$ cm$^{-3}$ and $10^{21}$ cm$^{-3}$, or between $5\times10^{18}$ cm$^{-3}$ and $5\times10^{20}$ cm$^{-3}$, or between $7\times10^{18}$ cm$^{-3}$ and $5\times10^{20}$ cm$^{-3}$. The thickness of the layer 304 can be comprised between 5 nm and 2 microns, or between 10 nm and 500 nm, or between 20 nm and 200 nm. Layer 306 can be made of InP, AlInAs, GaInAsP, or AlGaInP, with a composition chosen to give a bandgap energy Eg3 greater than the energy of the photons of the optical input, and the n-type doping level for layer 306 can be comprised between $10^{18}$ cm$^{-3}$ and $10^{21}$ cm$^{-3}$, or between $5\times10^{18}$ cm$^{-3}$ and $5\times10^{20}$ cm$^{-3}$, or between $7\times10^{18}$ cm$^{-3}$ and $5\times10^{20}$ cm$^{-3}$. The thickness of layer 306 can be comprised between 5 nm and 2 microns, or between 10 nm and 500 nm, or between 20 nm and 200 nm. Layer 308 can be made of InP, AlInAs, GaInAsP, or AlGaInP, with a composition chosen to give a bandgap energy Eg4 greater than the energy of the photons of the optical input, and the n-type doping level for layer 308 can be comprised between $10^{17}$ cm$^{-3}$ and $10^{20}$ cm$^{-3}$, or between $5\times10^{17}$ cm$^{-3}$ and $5\times10^{19}$ cm$^{-3}$, or between $10^{18}$ cm$^{-3}$ and $10^{19}$ cm$^{-3}$. The thickness of layer 308 can be comprised between 10 nm and 2 microns, or between 20 nm and 500 nm, or between 80 nm and 120 nm. Layer 310 can be made of InGaAs, InP, AlInAs, GaInAsP, or AlGaInP, with a composition chosen to give a bandgap energy Eg5 equal or greater than the energy of the photons of the optical input, and the n-type doping level for layer 310 can be comprised between $10^{16}$ cm$^{-3}$ and $5\times10^{19}$ cm$^{-3}$, or between $10^{17}$ cm$^{-3}$ and $10^{19}$ cm$^{-3}$, or between $5\times10^{17}$ cm$^{-3}$ and $5\times10^{18}$ cm$^{-3}$. The thickness of layer 310 can be comprised between 10 nm and 1000 nm, or between 20 nm and 200 nm, or between 80 nm and 120 nm.

The connecting elements 300 as illustrated in FIG. 7 are disposed within the base 18 as illustrated in FIG. 2 at specific distances from the emitter. As mentioned above, these distances depend on the wavelength of the optical input 100 and on the absorption coefficient of the base material 18. A worker skilled in the art will recognize that there are many possible combinations of optical wavelengths and base materials which can be used to satisfy different applications. To exemplify an embodiment of the disclosure, the description below details example positions of the connecting elements for a phototransducer of the present disclosure using an optical input 100 with a wavelength of 830 nm. The semiconductor material for the base layer is chosen to have a bandgap energy smaller than the energy of the photons of the optical input 100. The bandgap energy can be between 500 meV and 0 meV smaller than the energy of the photons of the optical input 100. In other embodiments, the bandgap energy can be between 200 meV and 10 meV smaller than the energy of the photons of the optical input 100. Yet in other embodiments, it might be desirable to design the phototransducer with the bandgap energy to be slightly larger than the energy of the photons of the optical input 100 in the case for which the semiconductor material has residual absorption below the bandgap energy. For a wavelength of 830 nm, the photon energy is 1.494 eV, therefore the base semiconductor material can be chosen to be preferably GaAs, or $Al_xGa_{(1-x)}As$ with x comprised between 0% and 5%. If a p-type GaAs base is chosen as illustrated in FIG. 2 with a thickness 120 of t=4 microns, then the absorption coefficient α for GaAs at the optical input wavelength of 830 nm is approximately $1.2\times10^4$ cm$^{-1}$. Therefore based on the formula for the absorption $I(z)=I_o \exp(-\alpha z)$ it is straightforward to calculate that the value for the position of the connecting elements of d1=192 nm, d2=438 nm, d3=784 nm, and d4=1365 nm will divide the base into 5 segments, s1, s2, s3, s4, and s5, each absorbing 19.8% of the optical input light.

A semiconductor material with a bandgap energy larger than the optical input can be selected for the emitter 16, for example $Al_xGa_{(1-x)}As$ with x between 10% and 35% or InGaP. Alternatively, GaAs can also be selected for the emitter 16, but then the value of the thickness of the GaAs emitter layer 16 has to be subtracted from the above values of d1 to d5 because the optical input 100 will also be absorbed in the emitter layer 16. Similarly, for the layer 310 with Eg5 of the connecting layers c1, c2, c3, and c4 of this embodiment, a semiconductor material with a bandgap larger than the optical input can be selected for the layers 310, for example $Al_xGa_{(1-x)}As$ with x between 10% and 35% or InGaP. Alternatively, GaAs can also be selected for the layers 310, but then the value of the thickness of the GaAs layer 310 has to be subtracted in the calculations of the above values of d1 to d5 because the optical input 100 will also be absorbed in the layers 310. The other layers 302, 304, 306, 308 of the connecting elements 300 are all selected from a group of semiconductor material with a bandgap larger than the optical input such as for example $Al_xGa_{(1-x)}$As with x between 10% and 100%, InGaP, or AlInP. In addition to the above, graded index inhomogeneous dielectrics which can be fabricated for examples using oblique angle deposition or PECVD plasma techniques can also provide good anti-reflective coatings by themselves or can be used as part of a stack of layers. In all of the above the thickness(es) of the anti-reflection layer(s) can be estimated or calculated using multiple reflections algorithms but in general the layers' thickness will be a fraction of the wavelengths of interests namely between 5 nm and 200 nm depending on the designs and number of layers used.

As will be understood by the skilled worker, the exposed portion of the window layer 14, or a portion of the front surface 102 having had the contact layer 12 removed cap therefrom (the light-input portion of the front surface 102) can be covered by an antireflection coating made of any suitable material such as, for example, $TiO_2$, $Al_2O_3$, $SiO_2$, $Sb_2O_5$, $Ta_2O_5$, $SiN_x$, $MgF_2$, ZnSe, ZnS, zirconium oxide, zirconium dioxide or Indium-Tin-Oxide layers, or any other suitable combination of two or more of these layers, or similar dielectric layers, typically chosen with a combination of index of refraction that tend to minimize the reflections over the wavelength range of interest by essentially providing progressive steps in the index of refraction when going from the phototransducer window 14 to the surrounding medium which is typically air, an encapsulant medium, beam shaping optics or a combination of the above used to guide the optical input into the phototransducer and further protect its front surface 102 or other sensitive layers. A bi-layer combining a low index of refraction and a high index of refraction from a choice of the above dielectric typically provides good anti-reflective properties as would be known by a skilled worker. For example one of the following bi-layers can used $TiO_2/Al_2O_3$, $SiO_2/Sb_2O_5$, $SiO_2/Ta_2O_5$, $Al_2O_3/Sb_2O_5$, $SiO_2/SiN_x$, $MgF_2/ZnSe$, $Al_2O_3/Ta_2O_5$, $MgF_2/ZnS$, $SiO_2/TiO_2$, or Indium-Tin-Oxide layers combined with some of the above dielectrics.

Figure 9:
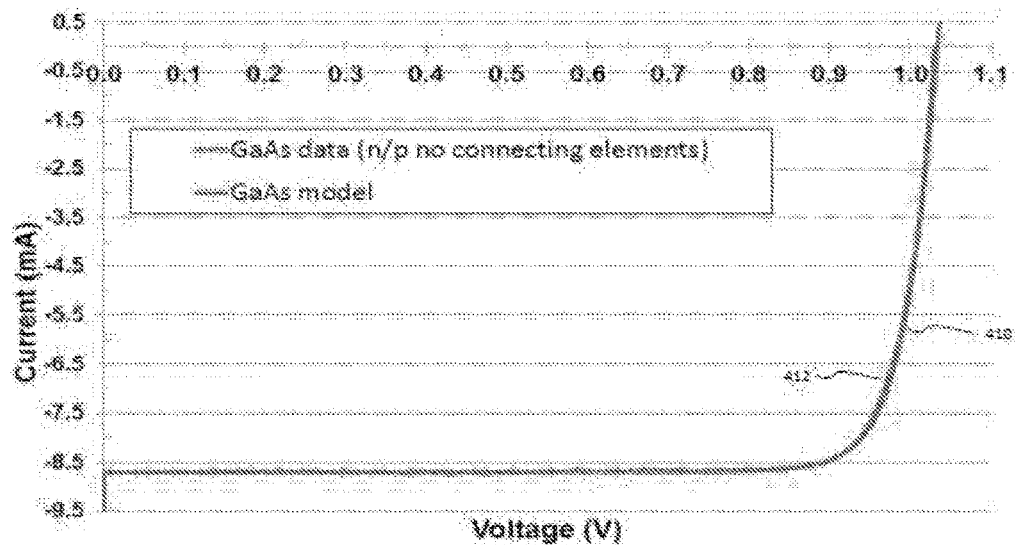
FIG. 9 is a graph of current as a function of voltage of a p-n diode having no connecting elements.

FIG. 9 shows the results for the embodiment of a transducer as illustrated in FIG. 2, comprising a base 18 using a p-type GaAs, with the thickness 120 of 3.5 microns, but comprising no connecting elements in the base 18. An example of data of an I-V measurement is plotted in curve 410 for a device temperature of 25 C. The I-V curve 410 is obtained for an illumination intensity of 1366 W/m$^2$, with an embodiment incorporating GaAs substrate 24, a GaAs buffer layer 22, a GaInP back surface field 20, a n-type GaAs emitter 16, a GaInP window 14, a dual layer antireflection coating deposited on the front surface 102, and patterned contact and metal layers 12 and 10 to extract the photocurrent and photovoltage from the phototransducer. The I-V measurement is taken between the top metal 10 and a metal contact applied to the substrate 24. The measured I-V data is modelled using the diode equation $I(V)=I_{ill}-Io[\exp(eV/nkT)-1]$, where I(V) is the diode current at the applied voltage V, IiII is the current from the illumination, Io is the saturation current of the photodiode, V is the applied voltage, n is the photodiode ideality factor (which can also be called the n-factor), k is the Boltzmann constant, and T is the temperature (here 25° C.). The diode parameters can be extracted from the measured data obtained on such a GaAs phototransducer. These diode parameters can then be used to model phototransducers of the embodiments incorporating connecting elements but otherwise based using the same type of materials and device growth and fabrication conditions. For example curve 412 in FIG. 9 shows that the model fits well the experimental data when using a saturation current Io~8.8E-12 mA/cm$^2$, and a n-factor~1.45. These diode parameters give for the curves 412 or 410 of FIG. 4: Voc~1.03V, a FF~84.6%.

Figure 10:
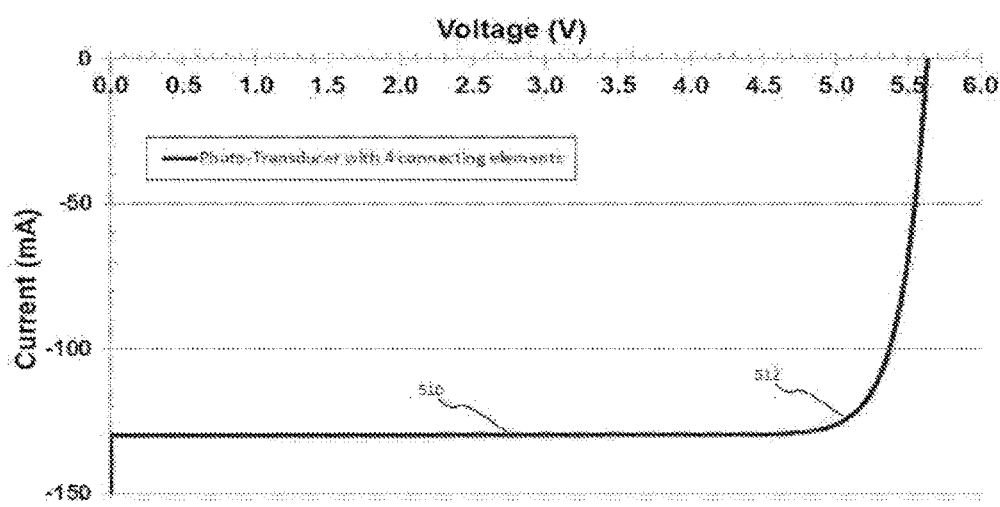
FIG. 10 is a graph of current as a function of voltage for an embodiment of a transducer in accordance with the present disclosure.

The device parameters extracted from FIG. 9 are then applied to model a phototransducer incorporating 4 connecting elements as depicted in FIG. 2 and described herein, and to predict the performance of that phototransducer under various conditions. For example, FIG. 10 shows such an I-V curve for a phototransducer with a base 18 of thickness t~4.0 microns incorporating 5. GaAs base segments s1, s2, s3, s4, and s5 which would each absorbed 19.8% of an optical input 100 impinging the front surface 102 with a wavelength of 830 nm. The detailed requirements of the various layers for this embodiment have been described above. The I-V curve 510 of FIG. 10 is produced for an optical input of 1 Watt/cm$^2$, for a phototransducer having a quantum efficiency of 97% at 830 nm. The I-V curve 510 has its maximum power point near the knee of the curve 512 and the analysis of the I-V yields the following performance metrics: Voc~5.632V, Isc~130 mA/cm$^2$, FF~86.1%, FFv~89.2%, FFi~96.6%, Vmax~5.022V, Imax 125.4 mA/cm$^2$, Pmax~630 mW/cm2, and with a conversion efficiency of Eff~63%.

The deposition or the growth of the various semiconductor layers described in the embodiments presented and described in relation to FIG. 2 and FIG. 7 can be carried out through any suitable means of semiconductor growth such as: metal organic chemical vapor deposition (MOCVD), chemical beam epitaxy (CBE), molecular beam epitaxy (MBE), solid phase epitaxy (SPE), hydride vapour phase epitaxy or by other similar hybrid systems or combinations thereof. The growth parameters can be optimized for the various layers of the embodiments, for example to maximize the device performance or its manufacturability. The growth parameters and growth conditions that can be optimized include, for example, the growth temperature, the pressure of the various gases used to grow the layers, the ratio of those pressures (for example the III/V ratio when growing III-V semiconductor layers), the alloy composition, the residual strain, the growth rate, the doping or co-doping of the various layers, the use of surfactant gases, the use of annealing cycles, etc.

The epitaxy of such layer can be done in a process using a single wafer or multiple wafers per run. Each wafer can between 25 mm and 450 mm in diameter depending on the type of substrates used and their commercial availability. The off-cut angle of the substrate, which can also be called the misalignment angle of the substrate, can also affect the growth conditions and the quality of the layers and can therefore be adjusted to optimize the device performance. For example, the growth can be done on (100), (110), or other surfaces, and off-cut angles toward various crystallographic planes can be used with angles varying between 0 degree and 40 degrees. The typical precision and control over the thickness, the composition, and the doping of the semiconductor layers grown using the above epitaxy techniques are typically well within tolerable variations of the specifications to achieve the desired embodiments as described in the present disclosure.

Furthermore, the quality of the layers of the various embodiments, and the quality of the semiconductor material comprised in these layers, can be determined by probing, post-growth, the optical properties, electronic properties, or both, of the arrangement such as the layers shown in FIG. 2. This can be achieved by measuring the optical spectral response (quantum efficiency) of the photocurrent (PC) or photovoltage (PV), photoluminescence (PL), electroluminescence (EL), time-resolved photoluminescence (TRPL), time-resolved photo-current (TRPC), electron-beam induced current (EBIC) measurements, or other characterization techniques as described in the present disclosure or other techniques known to one skilled in the art. The characterization can be performed on calibration or validation growth runs, or on the entire heterostructure, or on some of the layers comprised within the phototransducer, or with completed devices, including the connecting layers of FIG. 7. Such techniques can be used to determine the minority carrier lifetimes, the thicknesses of the layers, the optical paths of the layers, and other optoelectronic properties relevant to the device performance. It can also be used to reveal and/or assess for example the dependence of the phototransducer performance on the number of connecting layers (c1, c2, c3, c4, etc) and the position of those connecting layers (d1, d2, d3, d4, etc). Furthermore, reflection high energy electron diffraction (RHEED) and optical reflectance of the transducer of FIG. 2 for example, can also be used to obtain surface roughness and morphology information of the various layers during or after the growth of the layers of FIG. 2 or FIG. 7. Such in-situ techniques and other optical techniques can be used to give a real-time feedback on the optical properties of the layers and/or on the morphology as it progresses, and can be used to determine the quality of the layers. The in-situ techniques include reflection of photon (light) or electron beams during epitaxial growth of the arrangement of FIG. 2 for example. These techniques can also provide a measurement of the curvature of the semiconductor wafer to evaluate if there are any strain build-up or strain-relaxation events occurring during the epitaxial growth. Growth conditions/parameters can be adapted as a function of the in-situ monitoring to compensate for any undesired effects observed during growth. For example, optical probing can be performed by monitoring the reflection of an optical beam using a probe beam with similar wavelength as the optical input 100 to be used for the application of interest. Alternatively, the optical probing can be done using a wavelength that takes into consideration the different index of refraction of the semiconductor layers at the growth temperature during the epitaxy. The target parameters for the various layers can then be adjusted during the growth to achieve the desired target values for the thickness of the various based segments (s1, s2, s3, s4, etc) as monitored using such in-situ techniques.

Figure 11:
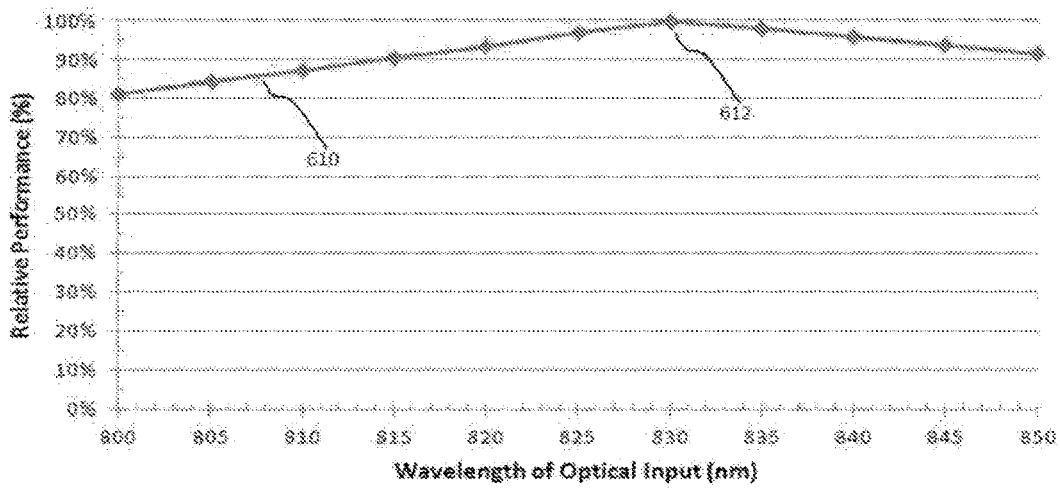
FIG. 11 shows expected performance variations for an embodiment of a transducer according to the present disclosure when the wavelength of the optical input is varied from an optimum value.

FIG. 11 shows the expected performance variations of a phototransducer according to the present disclosure when the wavelength of the optical input is varied from the optimum design value. Plot 610 of FIG. 11 displays, for various optical input wavelengths, the relative performance of a phototransducer with four connecting elements as illustrated and described in FIG. 2. The phototransducer of FIG. 11 is designed for an optical input wavelength of 830 nm. The plot 610 displays a performance maximum 612 at an optical input wavelength of 830 nm. At an optical input wavelength away from the targeted 830 nm the relative performance decrease slightly, but it still exceeds 80% of the optimal performance if the optical input wavelength is changed to ~800 nm and still exceeds 90% if the optical input wavelength is changed to ~850 nm.

Figure 12:
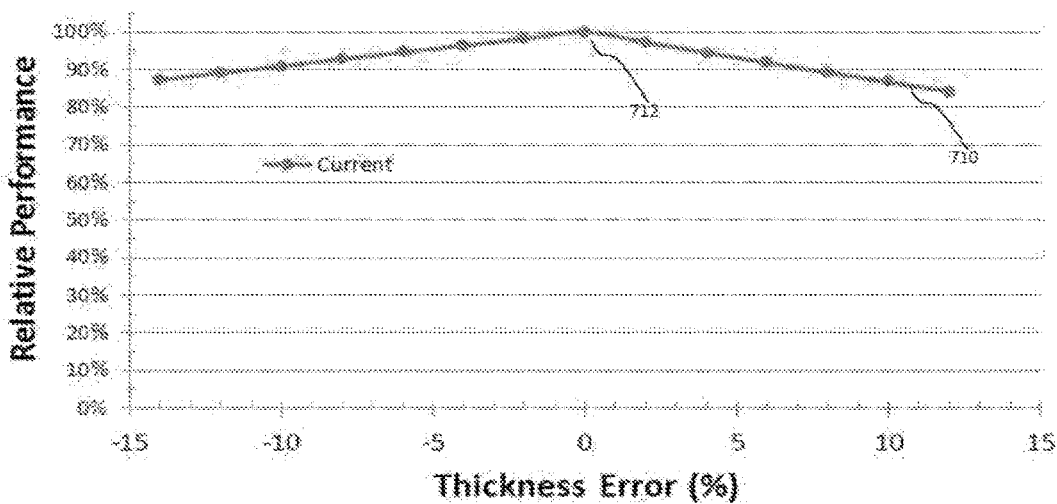
FIG. 12 shows expected performance variations of a transducer according to the present disclosure when the thicknesses of the base layer segments are varied from optimum design value.

FIG. 12 shows the expected performance variations of a phototransducer according to the present disclosure when the thicknesses of the base layer segments are varied from the optimum design value. Such thickness variations for example could occur from variations in different regions of a wafer, or from variations from wafers to wafers within a same growth, or from wafer growth to wafer growth. Plot 710 of FIG. 12 shows, as a function of the relative thickness error, the relative performance of a phototransducer with four connecting elements as illustrated and described in FIG. 2. The plot 710 shows a performance maximum 712 at zero thickness error (i.e. optimum design parameters as described in the above embodiments). As the thickness error is increased on either side of the optimum value (i.e. thinner layers or thicker layers) the relative performance decrease slightly, but it still exceeds 80% of the optimal performance if the magnitude of the thickness reaches 15%. Production epitaxy reactors can typically be controlled to values much better than +/−15%, and often well within only a few percent.

Figure 13:
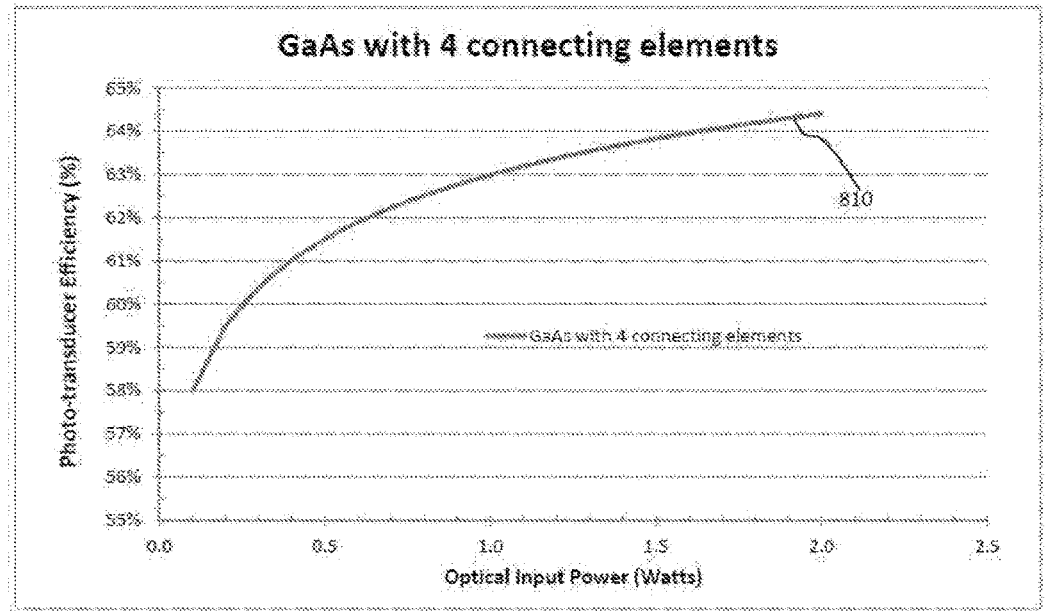
FIG. 13 shows the conversion efficiency as a function of optical input power for an embodiment of a transducer in accordance with the present disclosure.

FIG. 13 shows the phototransducer conversion efficiency as a function of the power of the optical input 100 for a phototransducer with four connecting elements as illustrated and described in FIG. 2. Plot 810 shows a non-linear dependence which increases for increasing powers of the optical input. At 100 mW input, the efficiency if Eff~58% and it increases to Eff~64.5% at about 2 W of optical input.

Figure 14:
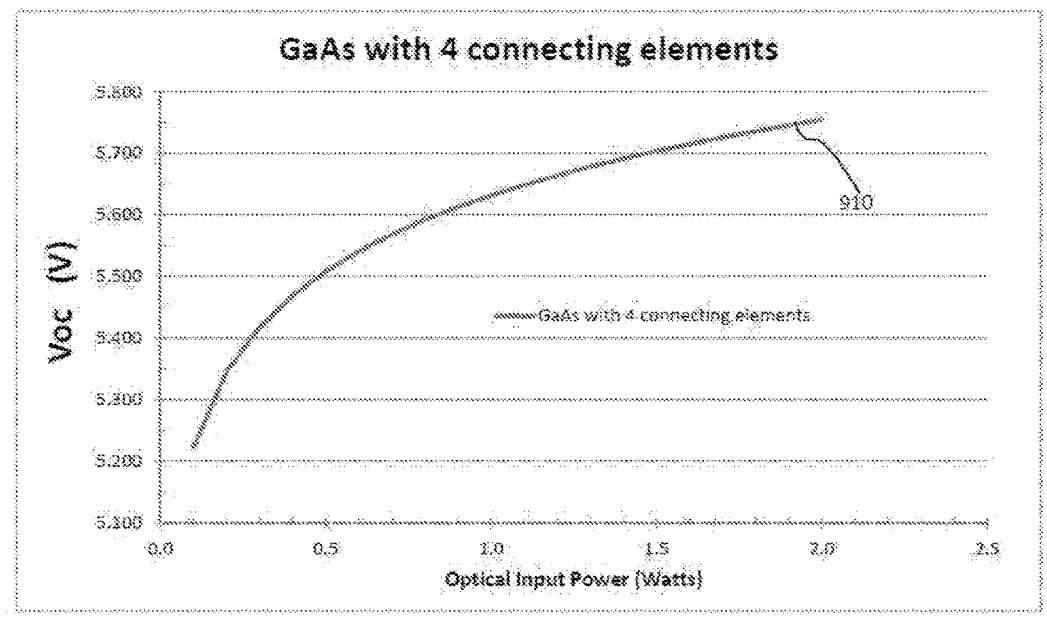
FIG. 14 shows the open circuit voltage as a function of optical input power for an embodiment of a transducer in accordance with the present disclosure.

As is shown at FIG. 14, the increase in performance observed in FIG. 13 with increasing optical input power mainly originates from the increase in photovoltage with increasing optical input power. For example, FIG. 14 plots the phototransducer Voc as a function of the power of the optical input 100 for a phototransducer with four connecting elements as illustrated and described in FIG. 2. Plot 910 shows a non-linear dependence, similar to FIG. 13, which increases for increasing powers of the optical input. At 100 mW input, the open circuit voltage is Voc~5.22V and it increases to Voc~5.76V at about 2 W of optical input.

The above embodiments exemplify the major performance parameters and phototransducer behaviors for the material parameters which correspond to the values obtained with GaAs as measured and not necessarily optimized. One skilled in the art will realize that the performance can be further optimized through device development and manufacturing processes and with further optimization of some design parameters. For example the ideality factor for the various base segments can be optimized from the material quality and various design aspects. The latter can lead to higher values of Voc. Furthermore, the optimization of the minority carrier lifetimes would also improve the Voc values. Similarly the FF can be optimized by ensuring that the layer design is favorable to an efficient current extraction and that the sheet resistances, contact resistances, and other series resistances are minimized. The optimization of the bandgap energies used for the different semiconductors in the various layers will help minimizing the thermalization losses of the photons from the optical input absorbed by the semiconductors.

The phototransducer of the present disclosure can be realized on a substrate which contains an active p-n (or n-p) junction capable of detecting photons in the optical input which could be at a different wavelength. That is the optical input 100 can have two sources, a first optical power source which will be converted by the base segments as described in the above embodiment, and simultaneously a secondary optical signal which will be detected by a p-n junction constructed within the substrate layer 24. The monolithically integrated phototransducer of this embodiment can be used for example for applications which transmit simultaneously a data signal and optical power. For example, the embodiment can comprise a GaAs base layer 18 with connecting elements as illustrated in FIG. 2 to produce a phototransducer and the embodiment can further comprise a Ge substrate that includes a p-n junction. The Ge p-n junction can be obtained by diffusion during the growth of the III-V layers on the Ge substrate, for example by diffusing group V atoms to create an n-type emitter into a p-type Ge substrate which constitute the base. The wavelength of the first optical power source preferably has a wavelength comprised between 500 nm and 880 nm, or between 750 nm and 880 nm. The wavelength of the secondary optical signal has a wavelength comprised between 1250 nm and 1700 nm, or between 1300 nm and 1650 nm. The p-n junction formed in the Ge substrate is adjacent to phototransducer on the side opposite to the front surface. To optimize the material quality the GaAs base layer 18 in this embodiment a small fraction of about 1.1% indium can be incorporated (i.e. $In_xGa_{(1-x)}As$ with x~1.1%) to insure the base segments and the other layers grown on the substrate remain lattice-matched to the Ge lattice constant. In such an embodiment, the transducer is electrically connected to transducer circuitry through a first set of electrical contacts and, the Ge p-n junction is electrically connected to data processing circuitry to process the data signal detected at the Ge p-n junction.

Figure 21:
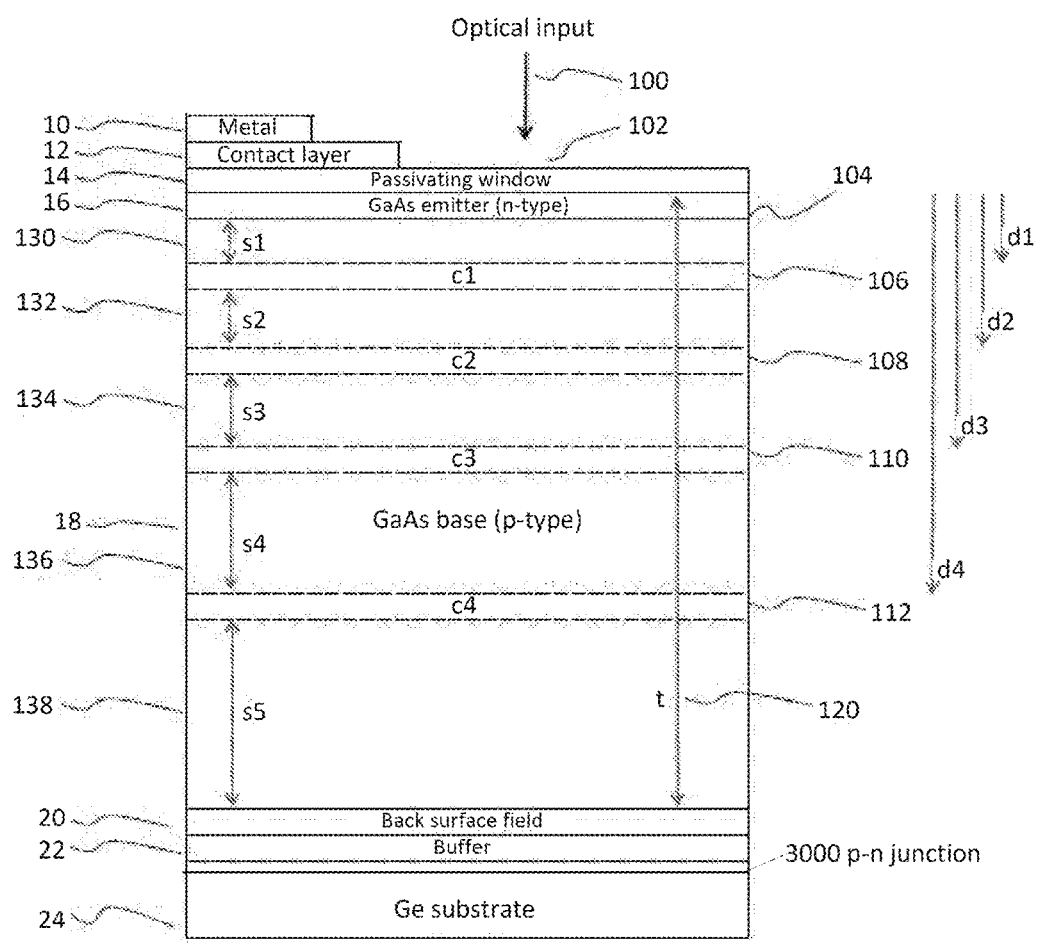
FIG. 21 shows an embodiment of a transducer and data receiver unit in accordance with the present disclosure.

FIG. 21 shows an embodiment of a transducer and data receiver unit that receives, in the optical input, optical power at a first wavelength (first energy) and a data signal at another wavelength (energy). The optical power is detected at the transducer portion, which comprises the semiconductor emitter layer 16 and at the base 18, which includes the semiconductor base layers 130, 132, 134, 136, and 138. The data signal is detected at p-n junction 3000, which is formed in the Ge substrate 24.

Photo carriers (electrons and holes) generated in the transducer of the present disclosure are collected by electrical contacts. In an embodiment, where the emitter is an n-type semiconductor, electrons arrive at the emitter and then flow laterally through the emitter layer before reaching a metal electrical contact. In another embodiment, where the emitter is a p-type semiconductor, holes arrive at the emitter and then flow laterally to the metal electrical contact. In both cases, the emitter can be doped in the range of $5 \times 10^{18}$ to $2 \times 10^{20}$ in order to minimize resistive losses. Doping at too high concentrations however can reduce the carrier mobility and hence the layer conductivity as well as the minority carrier lifetime; a compromise can be made to optimize the overall performance of the transducer. Additionally, it can be advantageous that the metal electrical contact be ohmic in nature have a low resistance per square of $1 \times 10^{-5}$ ohm-cm$^2$ or lower.

In cases where the illumination area of the photo transducer is large and carriers have to travel long lateral distances to the electrical contact, typically from a few hundred microns or more, and/or where large current are generated, the resistive losses from current flowing through the emitter layer can be significant. It is common practice in these cases to use a metal electrical contact that has a metal grid line pattern designed to reduce the lateral distances traveled by the carriers and to minimize the emitter resistance. Prior art grid lines are typically between one and 15 microns wide and are separated by 50 microns or more depending on the current densities generated for a particular application. Grid lines on the other hand, will block (shadow) some of the incident light thereby reducing the total current and efficiency of the transducer. The design optimization therefore requires a careful balance between the emitter doping levels, the grid line pattern and the metal contacts.

An alternative to grid lines is to form a transparent conductive film (TCF) on the emitter layer or on the window layer. The incident light can then propagate freely through the TCF and carriers generated underneath and travelling back into the emitter can make use of the transparent electrode as a parallel path to reach the metal contact. This embodiment eliminates shadowing of the incident light from grid lines and helps to minimize the lateral resistance. The TCF, which is a transparent electrode, can be made of indium tin oxide or ITO; fluorine doped tin oxide or FTO; zinc oxide or ZnO; aluminum doped zinc oxide or AZO; indium doped cadmium oxide; binary compounds of metal oxides; organic films using carbon nanotubes and graphene; polymers such as polyacetylene, polyaniline, polypyrrole, polythiophenes; and poly(3,4-ethylenedioxythiophene) and their derivatives.

In other embodiments the transparent electrode can be made of highly doped semiconductor materials, with doping typically comprised between $10^{18}$ to $10^{20}$ cm$^{-3}$, and with a bandgap higher than the photon energy of the incident light to allow complete transmission of the incident light. The semiconductor materials in these embodiments can include III-V or II-VI compound semiconductor materials including but not restricted to the same materials listed earlier for the passivating window 14 of FIGS. 1 and 2.

Figure 15:
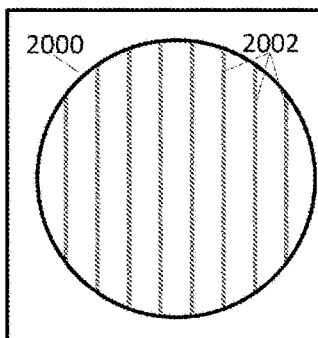
FIG. 15 shows a top view of a transducer of the present disclosure that comprises grid lines separated from each other by a distance of 325 microns.
Figure 16:
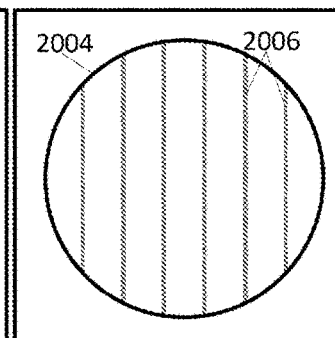
FIG. 16 shows a top view of transducer of the present disclosure that comprises separated from each other by a distance of 425 microns.
Figure 17:
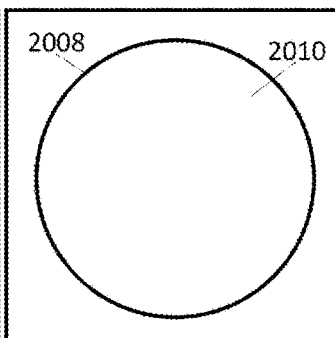
FIG. 17 shows a top view of a transducer of the present disclosure that is free of gridlines but that comprises a transparent conductive film.

FIG. 15 shows a top view of transducer 2000 of the present disclosure that comprises grid lines 2002 separated from each other by a distance of 325 microns. FIG. 16 shows a top view of transducer 2004 of the present disclosure that comprises grid lines 2006 separated from each other by a distance of 425 microns. FIG. 17 shows a top view of a transducer 2008 of the present disclosure that is free of gridlines but that comprises a TCF 2010.

Figure 18:
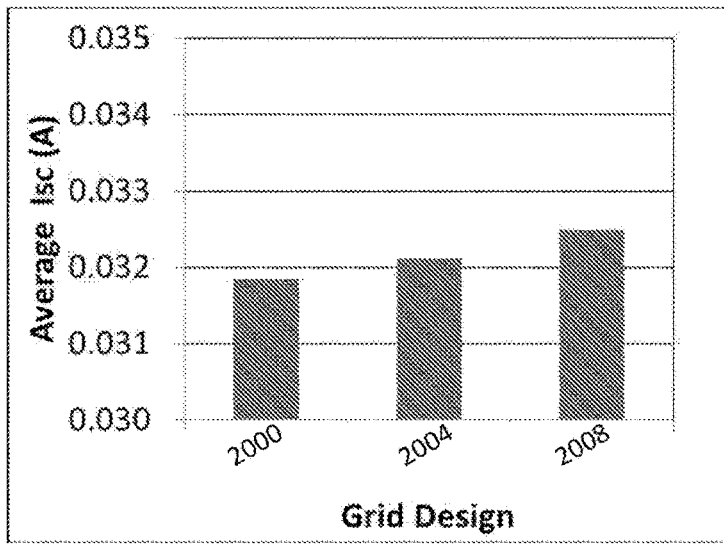
FIG. 18 shows the averaged short circuit current (Isc) for the transducers of FIGS. 15, 16, and 17.
Figure 19:
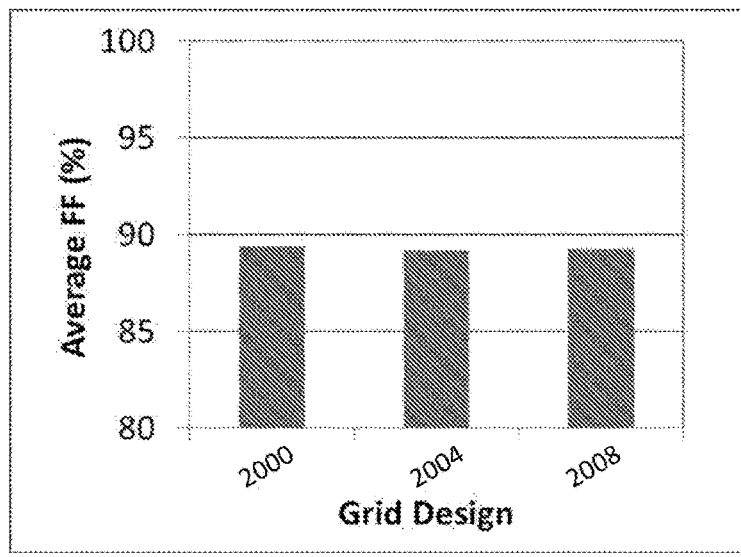
FIG. 19 shows fill factor data for the transducers of FIGS. 15, 16, and 17.

FIG. 18 shows the averaged short circuit current (Isc) for the transducers 2000, 2002, and 2004 of FIGS. 15, 16, and 17. FIG. 19 shows fill factor (FF) data for transducers 2000, 2002, and 2004 of FIGS. 15, 16, and 17. An incident beam of light with wavelengths centered around (substantially at) 850 nm was used to acquire the data. All devices had a transparent electrode made of InGaP doped to a doping level of $10^{18}$ cm$^{-3}$ and had five base segments. FIG. 18 a slightly higher Isc for the gridless transducer 2008, which is as expected. FIG. 19 shows that the FF is substantially the same for all the transducer 2000, 2004, and 2008. The FF is directly affected by the presence of any series resistance in the circuit, including that of the emitter and metal contact. The values of FF of FIG. 19 would be lower for the transducer 2008 without the presence of the transparent conductive InGaP electrode.

The transducer of the present disclosure has a well-defined and wide dynamic range response in voltage and current with respect to the optical input power. The current and Isc have a linear dependence on the input optical power and, Voc has a logarithmic response. The transducer of the present disclosure can therefore be used in applications where monitoring the intensity of a highly focused beam of monochromatic light is needed. Examples of applications may include continuous wave (CW) and pulsed laser beams and focused light from LED's or other monochromatic sources of light. The use of a design with no grid lines is particularly useful when accurate power monitoring and measurements is required. This is because focused light beams may have beam diameters or spot sizes comparable to the widths and spacing of the grid lines, thereby introducing considerable errors from shadowing if the beam falls on or in between grid lines. Furthermore, high power density light beams can be problematic for prior art technologies using photo-diodes with limited power ratings. These will often require the use of additional bulky beam splitters and attenuators also sensitive to high power densities, to quench and attenuate the incident power of the beam to monitor.

Figure 20:
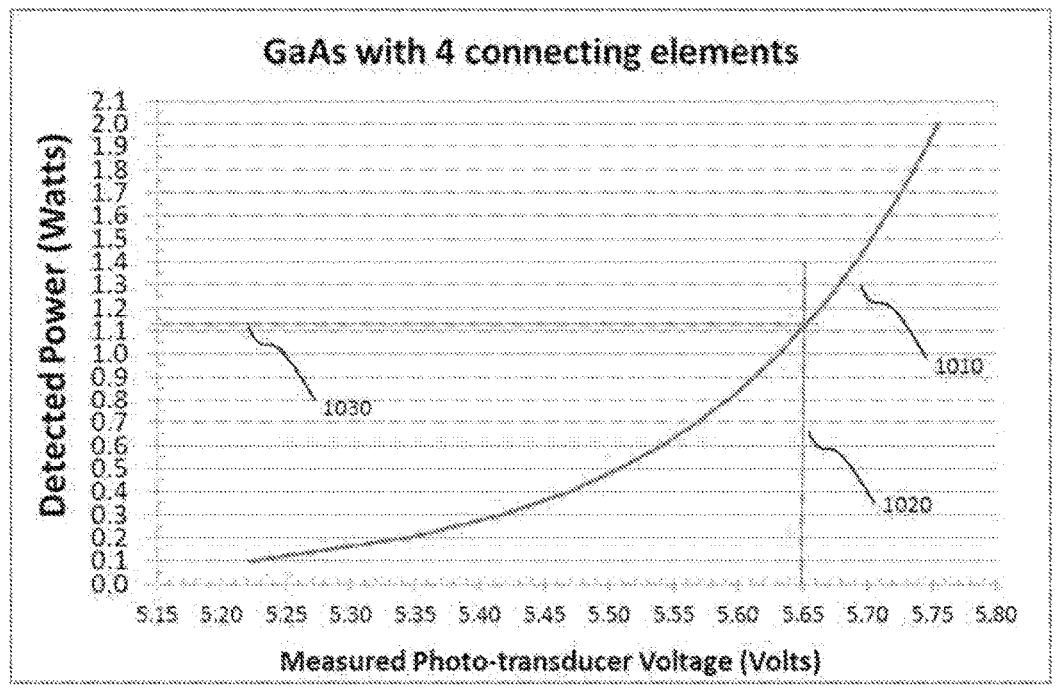
FIG. 20 shows a plot of detected power as a function of measure transducer voltage for an embodiment of a transducer of the present disclosure.

In the application for which the phototransducer of the present disclosure is used as a power meter device, the phototransducer can be equipped with a compact voltage readout circuit to compare the measured phototransducer Voc to a calibration table containing the relationship between Voc and the input optical power. For example, the latter data can be stored in memory and a programmable logic circuitry can be used to output, on a display for example, the detected power. The stored information can contain the photo-voltage response data for various input wavelengths as illustrated in previous figures. The data for a given wavelength (here 830 nm) is illustrated in FIG. 20, where curve 1010 shows the calibrated relationship between Voc and the input optical power, vertical line 1020 is an example of measured Voc which could be detected with the phototransducer, and the horizontal line 1030 which crosses the intersection of curve 1010 and line 1020 is the corresponding detected power, here expressed in Watts for FIG. 20.

As will be clear for one skilled in the art, there are several benefits in using the phototransducer of the present disclosure as a laser power meter. The benefits are not limited to, but include the following: as mentioned above, the optical input surface can be designed without any metal gridlines. The metal gridlines can absorb and scatter the laser light, giving errors in the measurements, possible increased safety hazards, and possibly leading to catastrophic failure of the power meter sensitive area in the case of high power input laser light which gets absorbed by the metal gridlines. Avoiding the gridlines is therefore advantageous. Furthermore, because of its construction based on a monolithically stacked designed with multiple base segments, the response phototransducer of the present invention is not position-sensitive. That is the laser light can impinge different positions on the optical input areas without affecting significantly the detected power. Moreover, because of the very high optical to electrical conversion efficiency of the phototransducer of the present invention, less wasted energy would be deposited in the optical active detecting head of such a power meter, therefore reducing the risk of damaging the device with the input light source.

Figure 22:
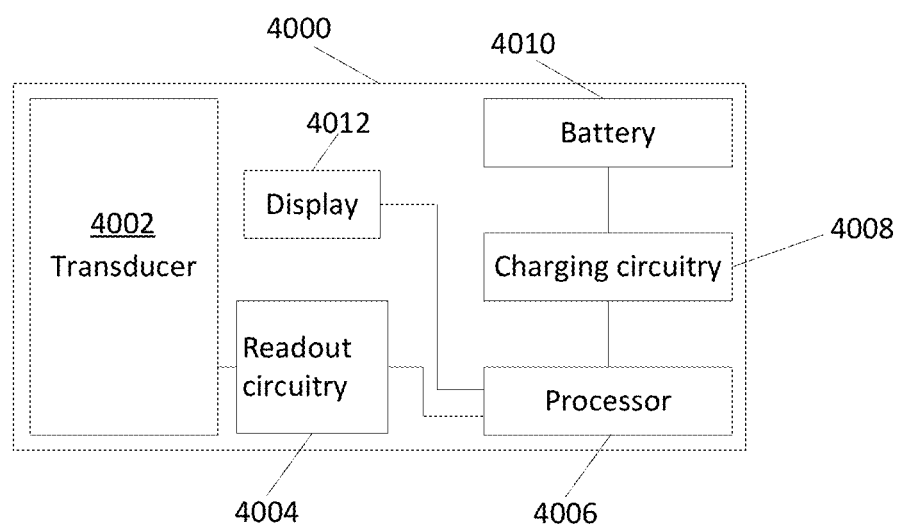
FIG. 22 shows an embodiment of a power meter in accordance with the present disclosure.

It will also be clear for one skilled in the art that such a power meter utilizing the phototransducer of the present disclosure could be operated, without departing from the scope of the present disclosure, in open circuit mode (Voc-mode), in short-circuit mode (Isc-mode), in maximum power point mode or voltage of maximum voltage power (Vmp-mode), or at other positions on the operational I-V curve of the phototransducer. As will be understood by the skilled worker, it can be advantageous to operate the device near the maximum conversion efficiency point (near Vmp) to convert as much input optical power into electrical power. The converted power will avoid the need for evacuating excessive thermal loads, and the optical power which is converted into electrical power from the optical input can be stored, in rechargeable batteries for example. The stored power can then be used to run the electronic circuitry of the power meter. The latter configuration can be advantageous to reduce or avoid the need for recharging the power meter unit into an external source such as a wall plug, or for plugging rechargeable batteries into an external source such as a wall plug. For example, a compact handheld power meter, with no need for external power source other than a light source (e.g., laser source) to be measured, can be constructed with the phototransducer of the present disclosure equipped simply with a rechargeable battery, a display, and a readout and logic circuitry to convert the measured data into displayed reading. The display can be a digital liquid crystal display or an analog dial. The power meter thus constructed could draw its power directly from the source to be measured if the laser power is high-enough. In the case for which small laser powers need to be measured, the power meter could be recharged externally from an electrical power source or an optical power source. FIG. 22 shows an example of such a power meter 4000 that comprises a transducer 4002 of the present disclosure, a readout circuitry 4004 that receives an electrical output from the transducer 4002 (e.g., the output voltage of the transducer 4002), a processor 4006 operationally connected to the readout circuitry 4004. The processor 4006 is configured to provide an electrical signal to a charging circuitry 4008, which charges a battery 4010. A display 4012 in operationally connected to the processor 4006; the display can show a value of the optical power to which the transducer 4002 is subjected.

In other embodiments, the present disclosure provides a compact handheld power meter, with no need for external power source other than a laser source to be measured. The power meter in question can comprise the phototransducer of the present disclosure equipped with a rechargeable battery and readout and logic circuitry configured to obtain data and to provide the data wirelessly to a mobile device equipped with software to read and display, on the mobile device, the data.

In general, and in the context of the present disclosure, two components are "electrically connected" when an electrical change caused by or affecting one (such as a change in voltage or current) can result in an electrical change in the other or, when an electrical signal sent by one can be received by the other. The two components need not be directly electrically connected (that is, there may be other elements interposed between them).

At least one embodiment is disclosed and variations, combinations, and/or modifications of the embodiment(s) and/or features of the embodiment(s) made by a person having ordinary skill in the art are within the scope of the disclosure. Alternative embodiments that result from combining, integrating, and/or omitting features of the embodiment(s) are also within the scope of the disclosure. Where numerical ranges or limitations are expressly stated, such express ranges or limitations may be understood to include iterative ranges or limitations of like magnitude falling within the expressly stated ranges or limitations (e.g., from about 1 to about 10 includes, 2, 3, 4, etc.; greater than 0.10 includes 0.11, 0.12, 0.13, etc.). For example, whenever a numerical range with a lower limit and an upper limit is disclosed, any number falling within the range is specifically disclosed. Additionally, the use of the term "substantially" means+/−10% of a reference value, unless otherwise stated. As an example, the phrase: "voltage A is substantially the same as voltage B" means that voltage B is within +/−10% of voltage B.

The embodiment of the transducer shown at FIG. 2 is epitaxially manufactured and has a monolithic vertical architecture that comprises portions having different compositions of semiconductor materials. As such, this type of transducer architecture can be referred to as a vertical epitaxial heterostructure architecture (VEHSA). As will be understood by the skilled worker, the composition of semiconductor compound materials will determine, at least in part, the bandgap energy of a given semiconductor compound and, manufacturing semiconductor compounds to obtain a target bandgap energy is well known in the art.

For some embodiments, the inventors have discovered that manufacturing such VEHSA transducers with a bandgap energy of its constituent semiconductor materials slightly larger than the energy of the photons of the optical light source used to operate the transducer, enables the transducers to have an efficient light to electricity conversion efficiency. Such embodiments can be referred to as sub-bandgap phototransducers or subgap phototransducers. Further, the inventors have discovered that given a VEHSA phototransducer with a set bandgap energy, selecting an optical light source that has a photon energy smaller than the bandgap energy can result in efficient light to electricity conversion efficiency.

The inventors have also discovered that manufacturing such VEHSA transducers with a bandgap energy of its constituent semiconductor materials slightly smaller than the energy of the photons of the optical light source used to operate the transducer, enable the transducers to have an improved light to electricity conversion efficiency compared to other heterotructure designs or material configurations.

The inventors have found experimentally that illuminating a VEHSA transducer with light having a photon energy that is within a small energy difference equal to the bandgap energy of the VEHSA transducer produces the best conversion efficiency of photons to electrons. The small energy difference is, in some cases, of the order of the phonon energy for the VEHSA transducer material. That is, the inventors have discovered that VEHSA transducers can also be effective and, in some cases, more effective at converting the incoming photon energy based on various subgap absorption phenomena and other linear or non-linear effects, some of which are described below, than by, as is usually done, converting light having a photon energy greater than the bandgap energy in other device configurations or even in some cases of the VEHSA transducer operated with photon energy greater than the bandgap energy.

As will be described below, embodiments of the VEHSA transducers of the present disclosure have greater light to electricity conversion efficiency when the photon energy (of the light beam) is less than the bandgap energy of the transducers in question. The higher efficiency allows the light sources to be operated at lower power than they normally would for transducers having a bandgap energy less than the photon energy. Advantageously, running the light sources at lower power increases their useful lifetimes.

Further, for transducers made of typical semiconductor materials, such as GaAs, but possibly also InP, InGaAs, AlGaAs, GaInP, GaInAsP, Si, Ge, InAs, InSb, AlSb, or combinations of such alloys, that have a bandgap energy of 1.42 eV in the case of GaAs for example, light sources having a photon energy less than the bandgap energy can be generally less expensive to manufacture than light sources that have a photon energy larger than the bandgap energy, particularly for the case of GaAs for example.

Furthermore, operating the transducers at a photon energy lower than the bandgap energy allows for the transducers to run cooler than they do when operating at photon energies greater than the bandgap energy. This can prolong the lifetime of the transducers. This can be the case for example because less thermalization energies of the photo-excited carriers are present when operating the device in these conditions, and there is therefore less dissipated heat.

As will be described below, embodiments of the transducers of the present disclosure exhibit greater light to electricity conversion efficiency when the photon energy (of the light beam) is, in some cases, less than the bandgap energy of the transducers in question. This allows the light sources to be operated at lower power than they normally would for transducers having a bandgap energy less than the photon energy. Advantageously, running the light sources at lower power increases their longevity.

Figure 23:
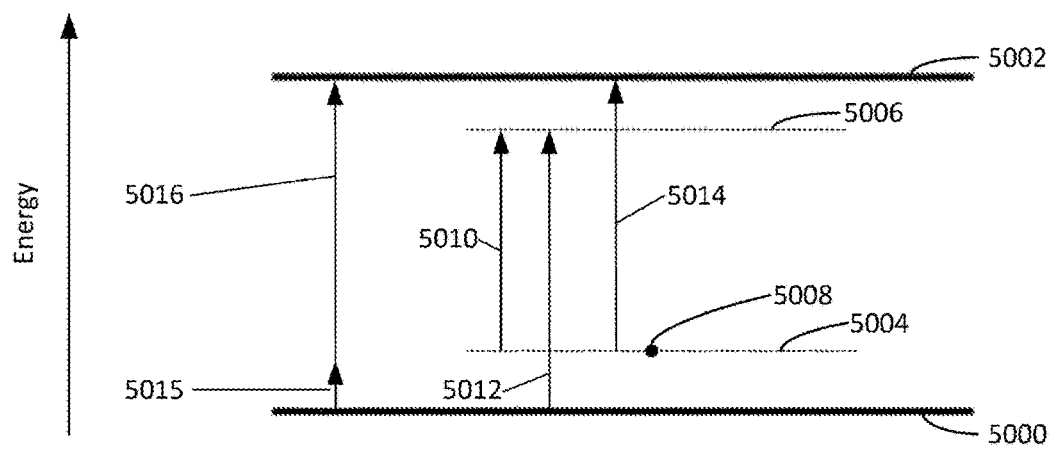
FIG. 23 shows a bandgap energy diagram for a semiconductor material.

FIG. 23 shows an example of the valence band 5000 and the conduction band 5002 of a semiconductor material, where the vertical direction in the figure represents the energy of the charged carriers within the semiconductor. One with ordinary skill in the art would therefore understand that the difference in energy between the conduction band 5002 and the valence band 5000 is often referred to as the forbidden gap, the energy gap, or the bandgap of the semiconductor material, having a value denoted by $E_{gap}$ or $E_g$, which is a characteristic property of the semiconductor material. With the value of $E_{gap}$, a threshold wavelength can be associated to the bandgap energy by the relationship $\lambda_{threshold}=hc/E_g$, where c is the speed of light and h is Planck's constant. In general, and as will be readily understood by the skilled worker, for optical wavelengths $\lambda_{input}$ longer than the threshold wavelength, $\lambda_{input}>\lambda_{threshold}$, the absorption is weak.

FIG. 23 also shows energy levels 5004 near the valence band 5000 and energy levels 5006 near the conduction band 5002. These energy levels 5004 and 5006 are within the forbidden gap, i.e. between the valence band 5000 and the conduction band 5002 and can have different density-of-states depending on the origin of the energy levels 5004 and 5006 within the gap. Energy levels near the conduction band 5006, such as energy levels 5006 can be related to donor impurities in the semiconductor material (semiconductor alloy) and are often referred to as donor levels. Similarly, energy levels 5004 near the valence band 5000 can be related to acceptor impurities in the semiconductor material and are often referred to as acceptor levels. Quantum effects in semiconductor heterostructures containing nanostructures such as quantum wells, quantum wires, or quantum dots can also effectively generate similar discrete levels and finite density of states within the energy gap.

Such energy levels within the forbidden gap can give rise to absorption due to subgap transitions. For example, FIG.

23 shows a carrier (charge carrier) 5008 in the acceptor level 5004. An incoming photon having an energy equal to or greater than the transition energy between the acceptor level 5004 and the donor level 5006, depicted by the upward arrow 5010 between the acceptor level 5004 and the donor level 5006, can be absorbed in this photocarrier excitation process. Similarly FIG. 23 shows a valence band 5000 to donor level 5006 transition 5012 and an acceptor level 5004 to conduction band 5002 transition 5014. There are various transitions that can participate in subgap photon absorption. Indirect transitions in momentum space within the heterostructure can also give rise to absorption at energies lower than the bandgap.

Another example of subgap photon absorption is associated to the Urbach energy tail. As is the case with the Urbach tail, some of the subgap absorption can depend on the temperature of the semiconductor material and/or on the intensity of the optical beam illuminating the transducer.

When the absorption varies substantially linearly with the intensity of the input beam, the effect is said to be linear, but when the absorption varies non-linearly, then a non-linear effect can appear in the device properties and performance. When the absorption saturates at higher intensities, absorption saturation or bleaching effects can be present. In other cases the absorption can increase with the input beam intensity leading to non-linear increase in performance with input intensity.

This can arise for example when the density-of-state of the levels (e.g., impurity state levels) participating in the transition and the optical input beam intensities are such that a substantial population or depletion of some levels can be achieved by optical pumping. The optical pumping can be indirect through an effective electrical forward biasing of the diode structure generated from the illuminated device (optical transducer). For example, most devices have opaque metal contacts, preventing substantial illumination under the metal in some area of the device, so by illuminating the non-metalized area of the device, the metalized area becomes effectively forward biased. In forward bias the diode will typically generate electroluminescence or possibly laser emission. Level saturation and non-linear effects can also occur when laser transitions or stimulated emission are present, or when a population inversion is achieved with electrical or optical pumping.

The sub-bandgap absorption can also be achieved in multiple steps. For example, in FIG. 23, a two-step process (transition) is shown involving a first step 5015 and a second step 5016. There are many possible combinations: the first step 5015 can be smaller than the second step 5016, or vice versa. The first step and the second step can take place simultaneously, or at different times, via virtual states, or via the population of real states such as state 5004. But in all cases, if the multiple steps added together have an energy equal or greater than the energy gap of the semiconductor, then a carrier can be promoted from the valence band 5000 to the conduction band 5002 by such multiple-step processes. Here step 5015 is depicted as having a smaller energy than step 5016 (e.g. a photon absorption transition) and could represent a phonon transition from the valence band 5000 and the corresponding phonon energy. For example, transverse optical (TO), longitudinal optical (LO), transverse acoustic (TA), and longitudinal acoustic (LA) phonons can participate to complement the input photon energy 5016 having a sub-bandgap energy (i.e. a wavelength longer than the wavelength corresponding to the threshold wavelength associated to the bandgap energy $\lambda_{input} > hc/E_g$).

A single phonon energy can be, for some semiconductor compounds, between ~0 meV and 75 meV. Whereas the subgap absorption is typically low in general for most semiconductors at low intensities, at higher input intensities, and at finite temperatures such as room temperature, it can be expected that such subgap absorption effects will become more efficient. That is because the probability for a population buildup of intermediate states increases, or the scattering rates for phonon or multi-phonon interaction, or multi-carrier interaction, such as Auger scattering, are typically higher in these conditions.

Furthermore, in a semiconductor material, the energy gap decreases with temperature. The change in the temperature will change the energy difference between the optical input, e.g. 5016 and the available energy transitions 5010, 5012, 5014, $E_{gap}$, etc. Therefore, the portion of the energy of the input beam that is not converted to electricity by the phototransducer is dissipated in heat, which can increase the temperature of the semiconductor and shift its bandgap closer to the threshold for absorption of the input wavelength by interband transitions or by sub-bandgap absorption effects as depicted in FIG. 23.

In view of the effects described above, the compositions of the VEHSA phototransducer can be modified to optimize the subgap performance with respect to efficiency. The optimization can be based, among others, on the absorption characteristics for the desired wavelengths for the application of interest. Also, an embodiment optimized for operation at other interband absorption (such as for example the wavelength range between 800 nm and 880 nm for GaAs based devices) can be used also for subgap absorption. The performance can depend on the VEHSA phototransducer configurations and the conditions of operation. For example FIG. 23 can be applied for a GaAs VEHSA phototransducer for subgap absorption in the wavelength range between 880 nm and 1000 nm and preferably between 910 and 930 nm for the optical input represented by the transition 5016. For this embodiment the base semiconductor material can be chosen to be preferably GaAs, or $Al_xGa_{(1-x)}As$ with x comprised between 0% and 5%. For p-type GaAs base, as illustrated in FIG. 2 with a thickness (120) of t=4 microns, base segment values of d1=192 nm, d2=438 nm, d3=784 nm, and d4=1365 nm can be selected to divide the base into 5 segments, s1, s2, s3, s4, and s5. The base of the VEHSA structure can be divided in a different number of segments, for example 8 segments, for the results shown in FIG. 24 (plot 5026) and FIGS. 25A and 25B (plot 5030). The number of base segment is preferably between 1 and 100. However, there can be any number of segments, without departing from the scope of the present disclosure.

Figure 24:
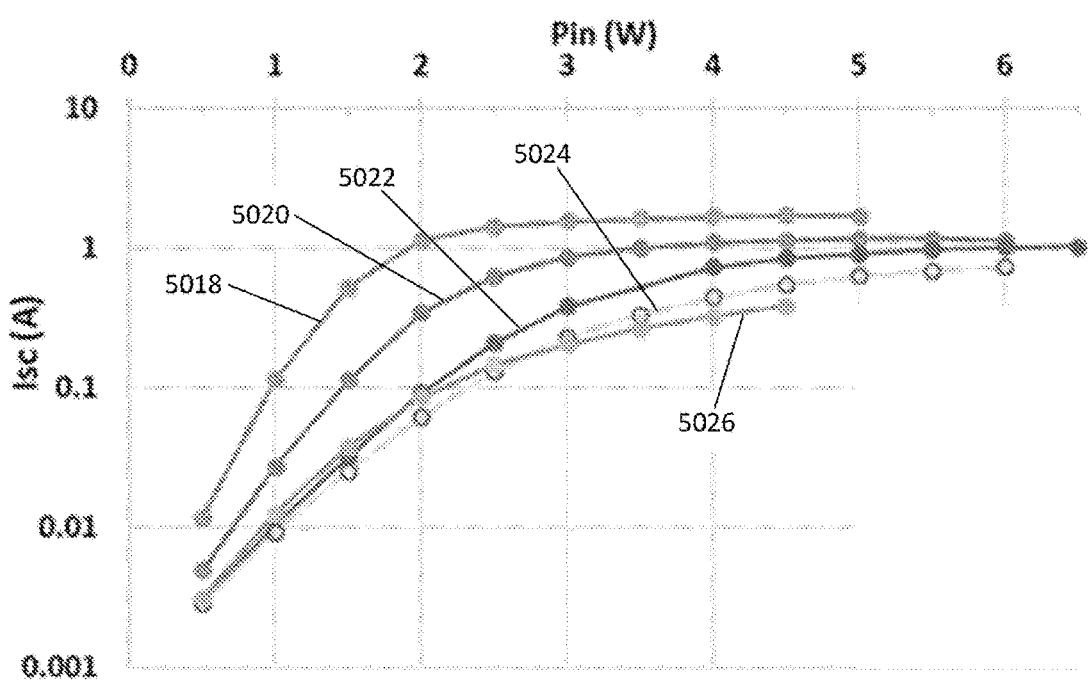
FIG. 24 shows the input power dependence of the short circuit current measured from single GaAs p/n junctions of different thicknesses.

The thicknesses of the base segments of a subgap VEHSA device can be optimized by calculating or by measuring the amount of subgap absorption at different wavelengths and at different values of input beam intensities. It can be preferable to independently measure p/n junctions of different thicknesses to quantify the subgap absorption. For example, FIG. 24 shows the input power dependence of the short circuit current measured from single GaAs p/n junctions of different thicknesses. At low optical input powers (e.g. for $P_{in}$ smaller than 1 W), the short-circuit current is very low for all the different p/n junction thicknesses shown in FIG. 24. However, as the input power is increased, the short circuit current first increases and then tends to saturate. For example, in FIG. 24, the p/n junctions of various thicknesses all produce on the order of 1 A of short-circuit current for input powers greater than 3 W. Plot 5018 is for a GaAs p/n junction having a thickness of 2636 nm; plot 5020 is for a GaAs p/n junction having a thickness of 581 nm; plot 5022 is for a GaAs p/n junction having a thickness of 346 nm; plot 5024 is for a GaAs p/n junction having a thickness of 192 nm; and plot 5026 is for a GaAs VEHSA structure with 8 base segments having all together a total thickness of 4500 nm and having its thinnest base segment with a thickness of 126 nm.

Figure 25A:
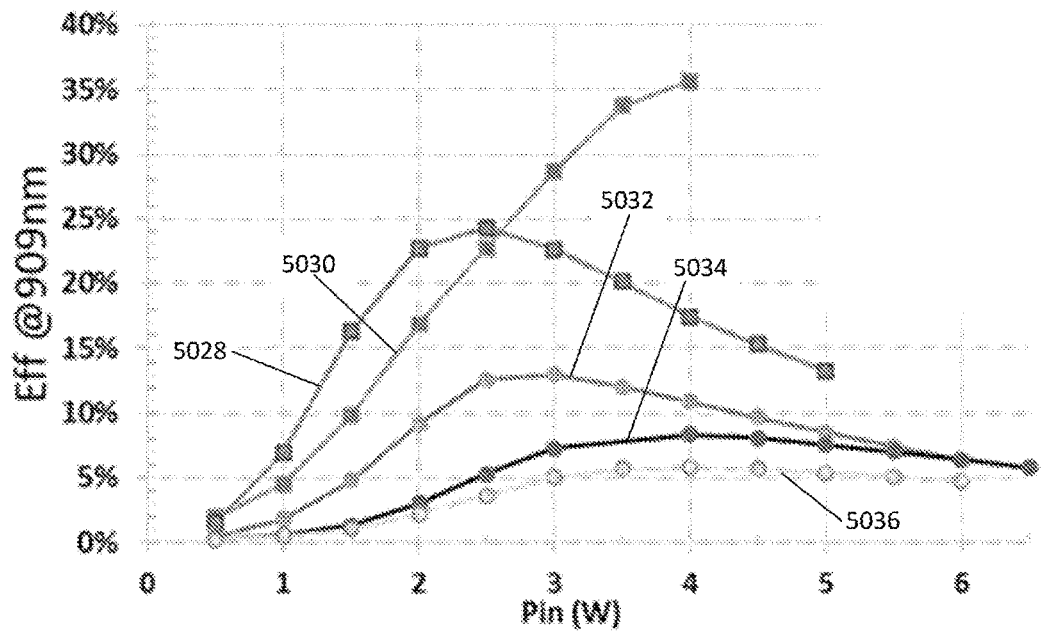
FIG. 25A shows plots of optical to electrical conversion efficiencies as a function of optical power for a series of p/n junctions.

Since p/n junctions with various thicknesses tend to give comparable photo-current values at high intensities of subgap excitations, the inventors have discovered that it can be advantageous to operate phototransducer devices based on the VEHSA design under these conditions. This is clearly demonstrated by plotting the subgap optical to electrical conversion efficiencies as a function of the optical input power. This is shown in FIG. 25A for GaAs-based devices excited with a below-gap optical power of 909 nm. In FIG. 25A, plot 5028 is for the GaAs p/n junction that has a thickness of 2636 nm; plot 5030 is for the GaAs VEHSA structure with 8 base segments having all together a total thickness of 4500 nm and having its thinnest base segment with a thickness of 126 nm; plot 5032 is for a GaAs p/n junction that has a thickness of 581 nm; plot 5034 is for the GaAs p/n junction that has a thickness of 346 nm; and plot 5036 is for the GaAs p/n junction that has a thickness of 192 nm. All devices in FIG. 25A exhibit low efficiencies at lower intensities (powers <1 W for example). The thicker p/n junction associated to plot 5028 reaches a maximum peak efficiency of ~24% at an intermediate power of ~2.5 W, but the VEHSA phototransducer with 8 base segments, associated with plot 5030, dramatically outperforms all the other configurations that are not based on a VEHSA design. In FIG. 25A, the VEHSA photo transducers have been demonstrated to exhibit a subgap conversion efficiency as high as ~36% and converted powers reaching up to 1.4 W in electrical power output under these conditions.

Figure 25B:
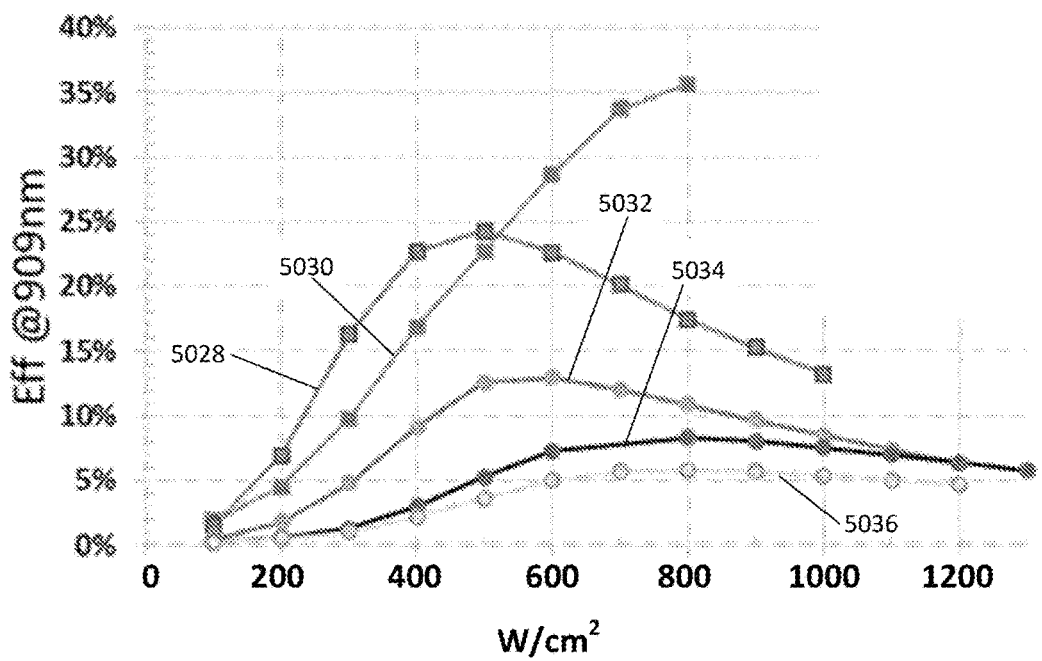
FIG. 25B shows plots of optical to electrical conversion efficiencies as a function of optical power intensity for a series of p/n junctions.

FIG. 25B shows the same data as in FIG. 25A but plotted as a function of peak power intensity. For plot 5030, which is associated to a GaAs VEHSA structure with 8 base segments, a conversion efficiency of about 10% is observed for a power intensity of about 300 W/cm$^2$ and over 35% for a power intensity of 800 W/cm$^2$. In fact, the inventor has observed, for GaAs transducers, useful conversion efficiencies are obtained for sub-gap optical inputs for power intensities ranging from 100 W/cm$^2$ to 2000 W/cm$^2$. Similarly, while phototransducers based on other semiconductor materials will have sub-gap absorption at different wavelength range, as discussed above, it can be expected that similar sub-gap conversion efficiency values can be obtained based on the above design considerations.

The short-circuit current for subgap excitation at high intensities is non-linear as shown by the nonlinear plots of FIG. 24. The efficiency is clearly increasing with the input power of the subgap excitation as shown by the plots of FIG. 25A. This means that the responsivity, defined as the photocurrent divided by the input power in A/W, of the VEHSA phototransducer is increasing with the excitation power. For VEHSA structures, the responsivity can be multiplied by the number of base segments in order to directly compare the measured responsivity values of the VEHSA devices to the values of other devices such as single p/n junction devices.

Figure 26:
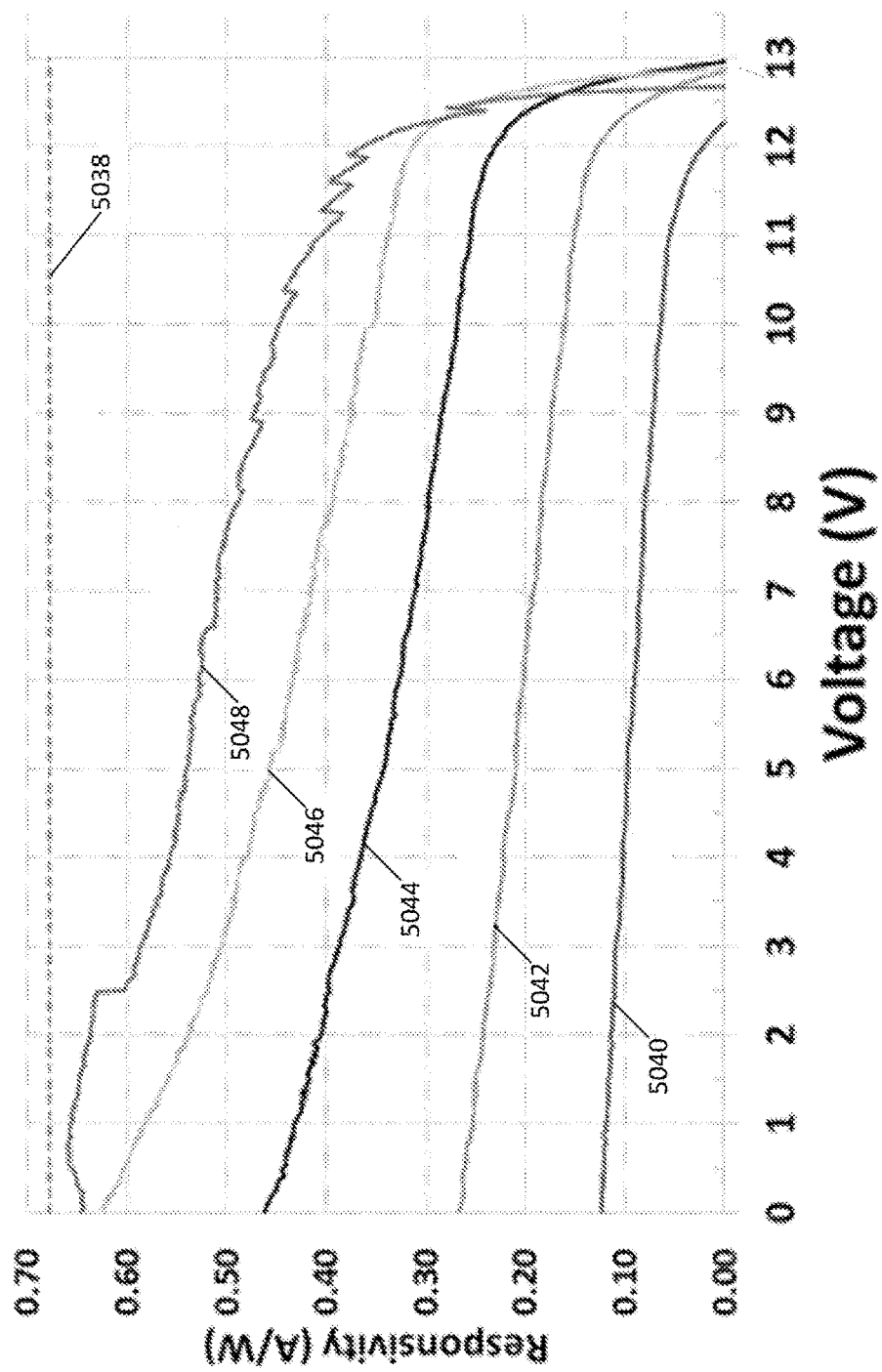
FIG. 26 shows plots of responsivity as a function of applied voltage for a same optical transducer illuminated at various optical powers.

For an optical input at a wavelength $\lambda_{input}$, the maximum theoretical responsivity is given by $R=\lambda_{input}/1239.85*QE$, where $\lambda_{input}$ is expressed in nm and QE is the quantum efficiency of the device, and R is the responsivity in A/W. The maximum theoretical responsivity is shown in FIG. 26 by the line 5038 for QE=92.5% and an optical input wavelength of 909 nm. FIG. 26 also shows, for a VEHSA transducer having twelve GaAs segments, the measured responsivity for the input powers of 1 W (200 W/cm$^2$) at plot 5040, 2 W (200 W/cm$^2$) at plot 5042, 3 W (600 W/cm$^2$) at plot 5044, 4 W (800 W/cm$^2$) at plot 5046, and 5 W (1000 W/cm$^2$) at plot 5048. Clearly the responsivity of the subgap VEHSA phototransducer device increases significantly with the value of the input power. In all cases the open circuit voltage (where the responsivity Vs. voltage plots intersect zero) generated by the subgap phototransducer is substantially 13V, despite the fact that the optical excitation energy is below that of the bandgap energy. Furthermore, the responsivity at higher optical input powers, shown at plot 5048 approached the maximum theoretical responsivity, plot 5038, for the applied voltages near 0V.

The inventors have also discovered that photon coupling effects or photon recycling effects can contribute significantly to the improvement of the responsivity in photo transducers based on the VEHSA design as shown in FIG. 26 for example. Such photon coupling and photon recycling effects can arise, for example, when one or more of the base segments of the VEHSA device generate excess photocurrent with respect to the other base segments. Since all base segments are effectively connected in series, the base segment or base segments that generate excess photocurrent will effectively become forward biased and may begin to emit photons by radiative recombination in the form of electroluminescence. The emitted photons can be reabsorbed by the base segments which are photocurrent-starved. This reabsorption of the emitted photons will in turn contribute to balance the amount of photo-generated current within the various base segments. Such photon coupling effects or photon recycling effects are more effective at higher excitation intensities when the semiconductor material can approach a radiative limit. Under these operating conditions, the non-radiative recombination channels are substantially saturated or are not competing effectively with the radiative processes. The photon emission from a given base segment will normally be at an energy near the edge of the semiconductor bandgap; for GaAs at room temperature this emission will be around 1.42 eV.

Continuously illuminating a transducer can generate excess heat. The heat arises from the non-converted optical power. A higher efficiency phototransducer will therefore generate less heat than a lower efficiency phototransducer. The generated heat needs to dissipate in the surrounding environment which can include the package in which the transducer is mounted, the connections to the package, the mounting apparatus (e.g. a board to which the transducer package is mounted), heatsinks, and the surrounding air, gases, or another cooling medium including liquid cooling. The residual heat can increase the temperature of the p/n junctions in the phototransducer device. Such an increase in temperature will typically reduce the open circuit voltage and the efficiency of the phototransducer. At least for that reason, it can be advantageous to operate the phototransducer with pulsed operation instead of continuous operation. This can be achieved by pulsing the power of the optical input. The ON duty factor in the pulsed phototransducer operation can be preferably between 100% (always ON) and 1/1000000 (ON 0.0001% per time period). The pulse width can be preferably between 1 fs and 10 s. The pulses width and the repetition rate can be adjusted to operate the phototransducer in pulse width modulation (PWM) mode.

For non-continuous (or non-CW) operation, the area of the device can impact the response time of the phototransducer. The response time of the phototransducer will be affected by the capacitance (C) of the phototransducer and the resistance (R) of the system (the load to which is electrically connected the transducer). The product of the capacitance and the resistance can be expressed as an RC constant which will impact the response time in pulsed operations. The VEHSA design is advantageous for such operations because the vertical series-connected architecture effectively combines the p/n junction capacitance in series. Combining the several capacitance in series reduces the resulting capacitance and therefore increase the response time of the device. For applications where relatively fast switching is important, small capacitance and a relatively small phototransducer area can be preferable. Smaller VEHSA phototransducers can also be advantageous for a given optical input power because the VEHSA device will operate at higher intensities and, as described above, the higher intensities enable more efficient photon coupling and photon recycling effects. For the efficient operation of VEHSA structures with subgap optical inputs, it can therefore be advantageous to select a smaller active area size, and correspondingly a smaller diameter of the optical input beam, in order to be effectively operating the phototransducer at higher intensities. The size of the active area of the VEHSA phototransducer can be preferably between 10 micrometers on the side (or in diameter) and 10 cm on the side (or in diameter), and most preferably between 100 micrometers and 30 mm.

Figure 27:
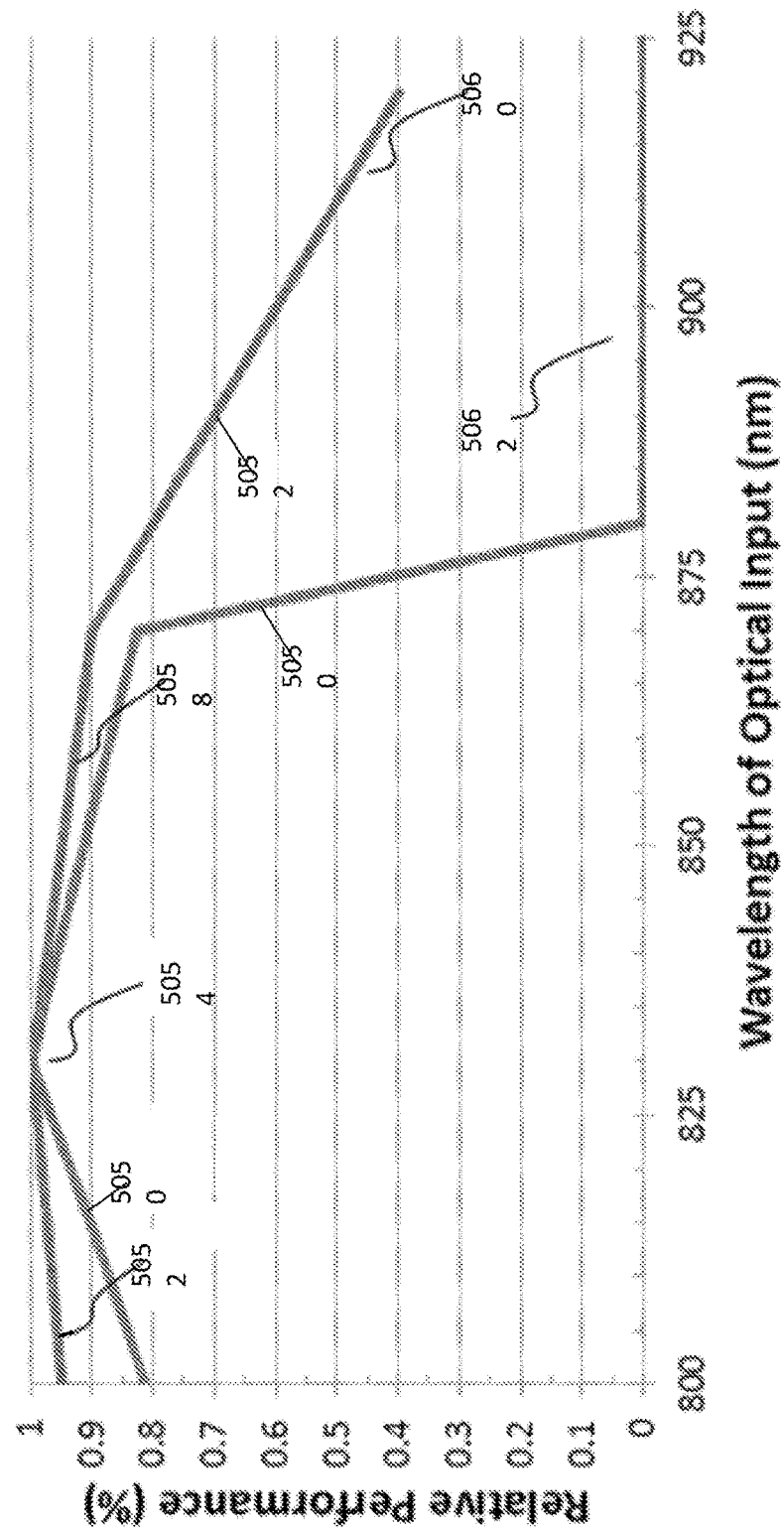
FIG. 27 shows the relative performance of a same photo transducer as a function of the wavelength of the optical input for two different illumination powers.

FIG. 27 shows the relative performance of a same photo transducer as a function of the wavelength of the optical input. FIG. 27 shows the expected performance variations of a phototransducer according to the present disclosure when the wavelength of the optical input is varied from the optimum design value. Plot 5050 and plot 5052 of FIG. 27 show an example, for various optical input wavelengths, of the relative performance of a phototransducer with four connecting elements as illustrated and described in FIG. 2. The phototransducer associated with FIG. 27 is designed for an optical input wavelength of 830 nm (i.e. the base segment thicknesses have been chosen to obtain a current-matching condition for a wavelength of 830 nm). The plots 5050 and 5052 therefore display a performance maximum 5054 at an optical input wavelength of 830 nm. Plot 5050 corresponds to the performance of the phototransducer when the intensity of the optical input is relatively low, for example for an input power between 0 W and about 1 W as shown in FIG. 25A. At an optical input wavelength shorter than 830 nm the relative performance decreases slightly, but it still exceeds 80% of the optimal performance if the optical input wavelength is changed to ~800 nm and still exceeds 90% if the optical input wavelength is changed to ~850 nm. However, under the low intensity the subgap performance 5056 is low, or can be close to zero, because the absorption coefficient of the material of the base segments is very small.

Plot 5052 corresponds to the performance of the phototransducer when the intensity of the optical input is relatively high, for example for an input power between 1 W and 5 W as seen in FIG. 25A. In these conditions, at an optical input wavelength away from the targeted 830 nm the relative performance decrease slightly, but it still exceeds 95% of the optimal performance if the optical input wavelength is changed to ~800 nm and still exceeds 90% if the optical input wavelength is changed to ~875 nm. The increase in the relative performance for wavelength away from the peak response (part 5058 of plot 5052) is likely due to the photon recycling or photon coupling effects that are present when higher optical intensities are used for the input. Furthermore, when the intensity of the optical input is relatively high, the subgap performance (area 5060 of plot 5052) is now much higher than at the low intensity portion 5062 of plot 5050. The good subgap performance at high intensities originates a substantial absorption of the material of the base segments due to the effects disclosed in the other sections above. The plots in FIG. 27 illustrated a rough example of the performance behavior for different input powers (intensities) and wavelengths, one with ordinary skill in the art will understand that the details of the behavior can vary depending on the experimental conditions, but the general increase in performance for the higher input intensities at various wavelengths will remain valid by following the guidance of the discovery hereby disclosed.

Figure 28:
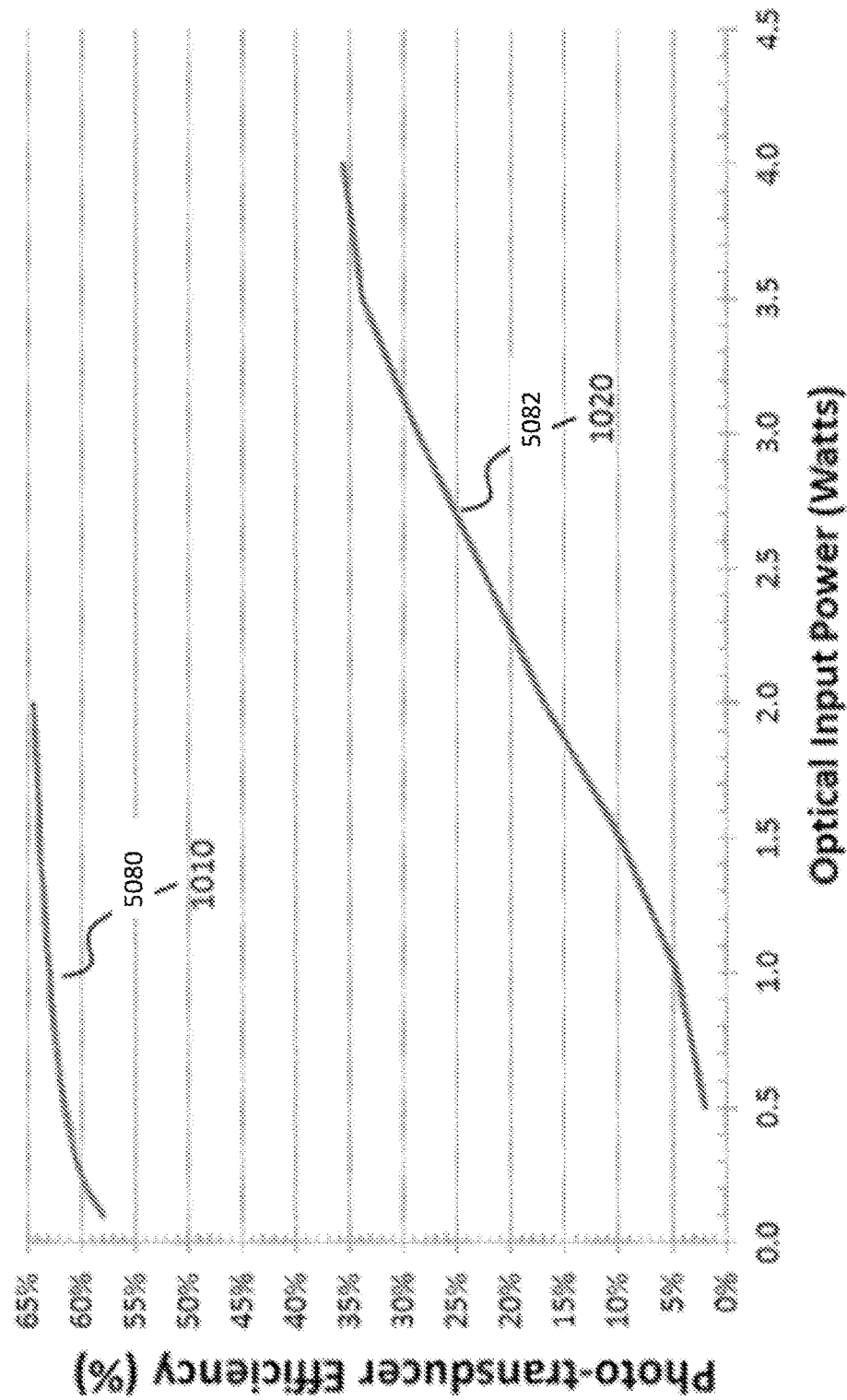
FIG. 28 shows the relative performance of a same photo transducer as a function of optical input power at two different illumination wavelengths.

FIG. 28 shows the phototransducer conversion efficiency as a function of the power of the optical input 100 for a phototransducer with four connecting elements as illustrated and described in FIG. 2. Plots 5080 and 5082 show increasing efficiencies as a function of optical input power. Plot 5080 is for an optical input at a photon energy greater than the bandgap energy of the material of the base segments. For example in these conditions, at 100 mW input, the efficiency can be Eff~58% and it increases to Eff~64.5% at about 2 W of optical input. Plot 5082 is for an optical input at a photon energy below the bandgap energy of the material of the base segments. For example in these conditions, at 500 mW input, the efficiency can be Eff~1% but it increases progressively to Eff~35% at about 4 W of optical input. The good subgap performance at high intensities originates from substantial absorption of the photons by the material of the base segments due to the effects disclosed in the sections above.

The following relates to a GaAs transducer at a temperature of 298 K (about 25° C.). At this temperature, the bandgap energy is 1.423 eV. With respect to LO phonons, the energy value of an LO phonon in GaAs is 36.1 meV, which means that illuminating the GaAs transducer with light having a wavelength of 893.8 nm (1.387 eV) would, with the participation of an LO phonon (36.1 meV), suffice to promote a carrier from the valence band to the conduction band.

Also at 298 K and but respect to TO phonons, the energy value of a TO phonon in GaAs is 33.2 meV, which means that illuminating the GaAs transducer with light having a wavelength of 891.9 nm (1.390 eV) would, with the participation of an TO phonon (33.2 meV), suffice to promote a carrier from the valence band to the conduction band.

Also at 298 K but with respect to LO and TO phonons, the energy value of an LO phonon plus the energy of a TO phonon in GaAs is about 69.3 meV, which means that illuminating the GaAs transducer with light having a wavelength of 915.7 nm (1.354 eV) would, with the participation of an LO phonon and a TO phonon (69.3 meV), suffice to promote a carrier from the valence band to the conduction band.

The following relates to a GaAs transducer at a temperature of 313 K (about 25° C.). At this temperature, the bandgap energy is 1.417 eV. With respect to LO phonons, the energy value of an LO phonon in GaAs is 36.1 meV, which means that illuminating the GaAs transducer with light having a wavelength of 898.2 nm (1.381 eV) would, with the participation of an LO phonon (36.1 meV), suffice to promote a carrier from the valence band to the conduction band.

Also at 313 K and but respect to TO phonons, the energy value of a TO phonon in GaAs is 33.2 meV, which means that illuminating the GaAs transducer with light having a wavelength of 896.3 nm (1.383 eV) would, with the participation of an TO phonon (33.2 meV), suffice to promote a carrier from the valence band to the conduction band.

Also at 313 K but with respect to LO and TO phonons, the energy value of an LO phonon plus the energy of a TO phonon in GaAs is about 69.3 meV, which means that illuminating the GaAs transducer with light having a wavelength of 920.3 nm (1.347 eV) would, with the participation of an LO phonon and a TO phonon (69.3 meV), suffice to promote a carrier from the valence band to the conduction band.

There is also the possibility of illuminating the transducer at phonon energies slightly larger than the bandgap such that the phonon energy minus the various phonon energy equals to the bandgap. For example, at 298 K, illuminating a GaAs transducer at a phonon energy of 1423 meV (bandgap energy of GaAs)+69.3 meV (LO+TO phonon)=1489.9 meV (832.2 nm) would/could result in a conversion efficiency better than would be when illuminating the transducer with light having a substantially larger photon energy. The improved conversion efficiency at 832.2 nm would be explained by the generation of an LO and a TO phonon.

Also at 333 K (GaAs bandgap of 1.407 eV) but with respect to a donor or an acceptor energy level as illustrated in FIG. 23, for example for an acceptor energy level (such as C in GaAs for example) the energy value of the acceptor level can be 40.7 meV, which means that illuminating the GaAs transducer with light having a wavelength of 907.2 nm (1.367 eV) would, with the participation of the acceptor level energy (40.7 meV), suffice to promote a carrier from the acceptor level to the conduction band. And where the impurity energy levels can themselves be populated or de-populated from the available thermal energy $k_B T$.

Figure 29:
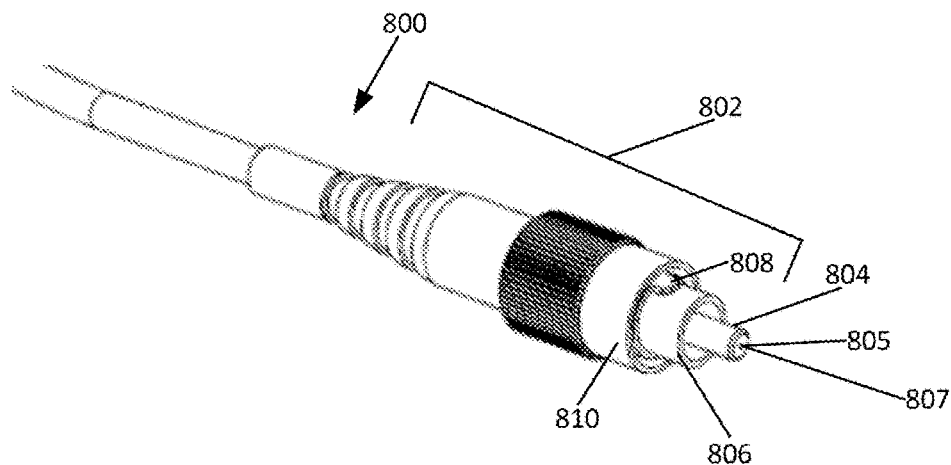
FIG. 29 shows a cutaway perspective view of a prior art optical fiber cable assembly.

With respect to another aspect of the present disclosure, FIG. 29 shows a cutaway view of a prior art optical fiber cable assembly 800 that has a connector end portion 802. The connector end portion 802 has a ferrule 804, a sleeve 806 and a key 808 formed on the sleeve 806. The ferrule 804 has on optical fiber 805 located therein. Light coupled to the optical fiber cable assembly 800 at the remote end (not shown) of the optical fiber cable assembly 800 will the exit connector end portion 802, from the optical fiber 805. The connector end portion 802 also has a threaded sleeve 810 configured for securing the fiber cable assembly 800 to a connector. To connect the connector end portion 802 to a connector, care must be taken to precisely align the ferrule 804 to the center of the connector. An example of such a connector is shown at FIG. 30.

In the context of the present disclosure, the optical fiber cable assembly can include a simple optical fiber connected to the connector end portion and, the connector end portion can be referred to as a delivery end to deliver light propagating through the fiber towards the delivery end; the optical fiber can be a single mode fiber or a multimode fiber without departing from the scope of the present disclosure.

As discussed above, such connectors typically includes alignment features requiring tight mechanical precision, based on ceramic and metal elements. Small deviations from tight specifications during manufacturing can result in male and female parts that do not fit (connect) well together. Bad connection fittings can be dangerous due to potential disconnections and laser light exposures or due to poor performances due to higher than normal optical losses. The inventor has invented a new connector that allows for easily connecting an optical fiber cable to a transducer of the present disclosure. The following describes embodiments of such a connector that has higher manufacturing tolerances and allows for more easily connecting optical fiber cables to such connectors, which leads to easier field installation or testing.

Figure 30:
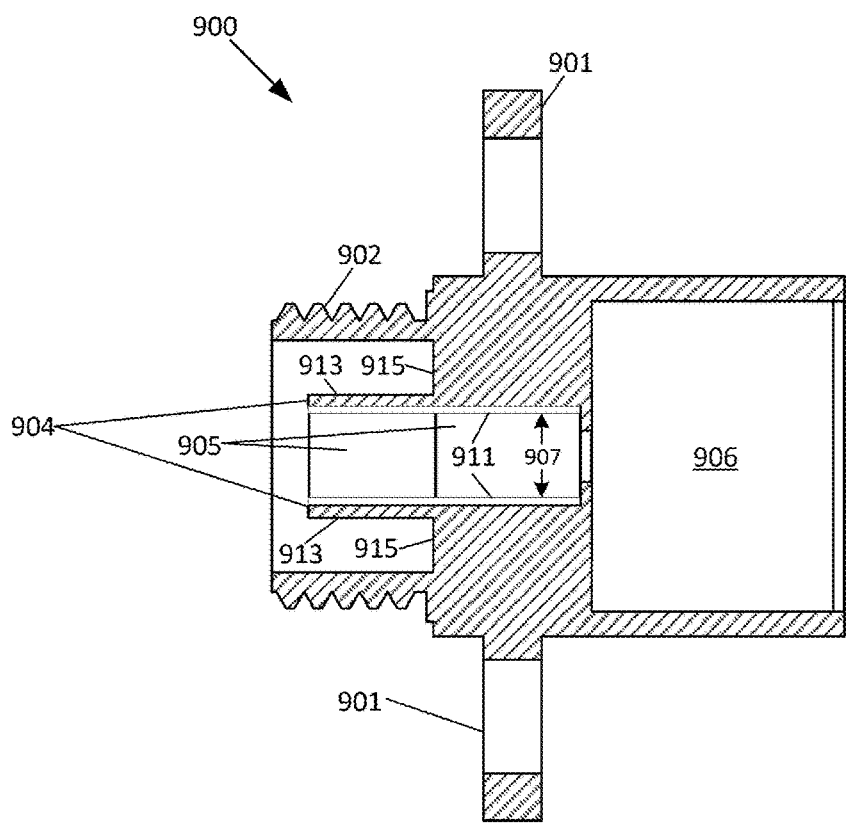
FIG. 30 shows a cross-sectional view of a prior art flange mount connector.

FIG. 30 shows a cross-sectional view of a prior art flange mount connector 900, which comprises a threaded sleeve 902 and a ferrule sleeve 904. The ferrule sleeve 904 has a portion 913 that extends away from a wall 915. The ferrule sleeve 904 defines a ferrule cavity 905 in which a cylindrical insert 911 is disposed. The cylindrical insert 911 can be made of ceramic or metal and has a diameter 907 that closely matches that of the ferrule 804 (FIG. 29). Such a diameter can be, for example, 2.5 mm. In most prior art embodiments the cylindrical insert 911 is coextensive with the ferrule cavity length. The tolerance of the diameters between the ferrule 804 and the cylindrical insert 911 typically has to be of the order of a few thousandths of an inch or less. Similarly, the outside diameter of the portion of the ferrule sleeve 904 that extends away from the wall 915 is typically about 4.5 mm and must have tight tolerances to fit inside diameter of the sleeve 806 (FIG. 29). Similarly, the inside diameter of the threaded sleeve 902 is typically 6.18 mm and must have tight tolerances to fit to the outside diameter of the sleeve 806 (FIG. 29).

The connector 900 defines a device cavity 906 in which a device (e.g., a photonic device) can be placed and secured through any suitable means such as, for example, an adhesive or solder. The connector 900 is designed to allow precise fiber to device alignment (the "device" to be located in the cavity 906). To connect the optical fiber cable assembly 800 (FIG. 29) to the connector 900, a technician is required to grip the connector end portion 800, align the ferrule 804 with the cylindrical insert 911, push the connector end portion 800 so the ferrule 804 penetrates the cylindrical insert, and then screw the threaded sleeve 810 onto the threaded sleeve 902. As will be appreciated by the skilled worker, this operation must be carried out carefully, especially in view of the tight tolerances mentioned above, in order to avoid scratching the face of the ferrule 807 and damaging the optical fiber 805, or possibly breaking, scratching, or chipping the ceramics of the assemblies from an improperly angled alignment during the connection process. For example, the cylindrical insert 911 and/or the ferrule 804 can be prone to breaking when proper care is not taken when connecting the optical fiber cable assembly 800 to the connector 900.

The phototransducers of the present disclosure are not very sensitive to beam misalignments or to beam non uniformities and do not require very precise alignment with a light source. That is, the phototransducers of the present disclosure have a strong tolerance to beam misalignments or to beam non uniformities; this is due to the monolithic vertical architecture of the phototransducer's VEHSA design. The vertical architecture ensures that each base segments receives substantially the same photon flux, independently of the beam position on the active area, and independently of the beam profile.

As such, the prior art connectors designed for precise alignment of an optical fiber to a device, such as the connector 900 of FIG. 30, are not required when aligning a connector end portion to a phototransducer of the present disclosure. Unfortunately, connectors for low alignment sensitivity applications appear to be unavailable and only high precision connectors such as connector 900 can readily be obtained. It is also commonly found that the tolerances of the prior art commercial connectors are not always consistent between various vendors. These variations in the tolerance of the commercial male connectors (connector end portion 802 of FIG. 29) make it difficult to manufacture a universal connector matching the female connector of the prior art as shown in FIG. 30.

Figure 31:
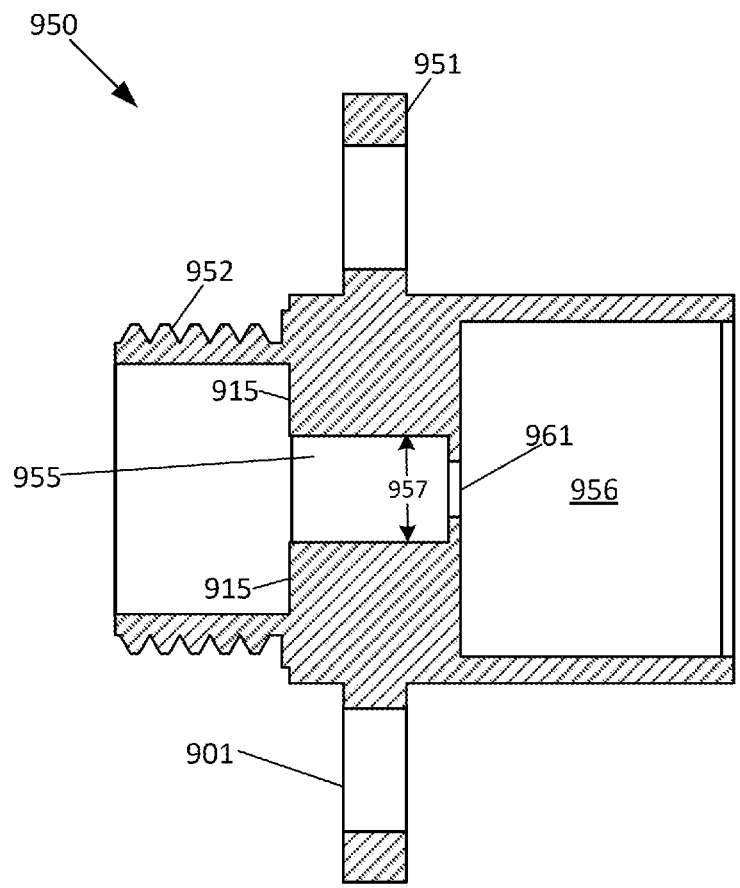
FIG. 31 shows a cross-sectional view of an embodiment of a connector in accordance with the present disclosure.

FIG. 31 shows a cross-sectional view of an embodiment of such a connector 950, which, as the connector 900 of FIG. 30 is a flange mount connector. The connector 950 has a flange 951, a threaded sleeve 952 and a ferule cavity 955. The connector 950 defines a device cavity 956 in which a device (e.g., a photonic device) can be placed and secured through any suitable means such as, for example, an adhesive or solder. Light exiting the ferrule (not shown) propagates from the ferrule cavity 955, through the aperture 961 and reaches the device cavity 956.

The ferrule cavity 955 any portion that extends away from the wall 915. The diameter 957 of the ferrule cavity 955 of the connector 950 is larger than the diameter 907 of the cylindrical insert 911 of the prior art connector 900. The diameter 957 must be greater than 2.5 mm to accommodate the 2.5 mm ferrule 804 of FIG. 29. The connector 950 can clearly offer much greater tolerance to accommodate for easy manufacturability and different tolerances from various vendors of male connectors 802. For example, the diameter 957 can be between 2.55 mm to 6.0 mm, and preferably between 2.6 mm and 3.6 mm.

Figure 32:
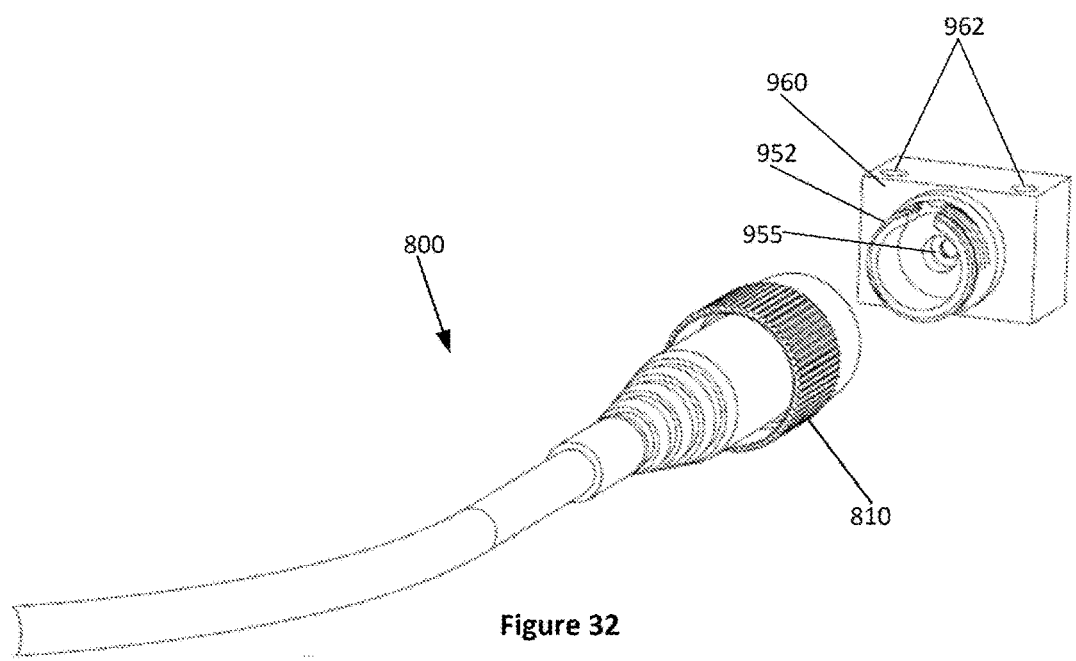
FIG. 32 shows a top front perspective view of an optical fiber cable assembly facing a board mount connector in accordance with the present disclosure.

The connector 950 is a flange mount connector; however, other types of connector mounts are also within the scope of the present disclosure. For example, FIG. 32 shows a top front perspective view of an optical fiber cable assembly 800 facing a board mount connector 960, which has a threaded sleeve 952 and a ferrule cavity 955. The board mount connector 960 differs from the flange mount connector 950 in how the connector is mounted to another piece of equipment. As will be understood by the skilled worker, the board mount connector 960 mounts to a board by using fasteners inserted in holes 962; the flange mount connector 950 mounts to a partition or wall of some sort through fasteners inserted in holes 951 (FIG. 31).

Figure 33:
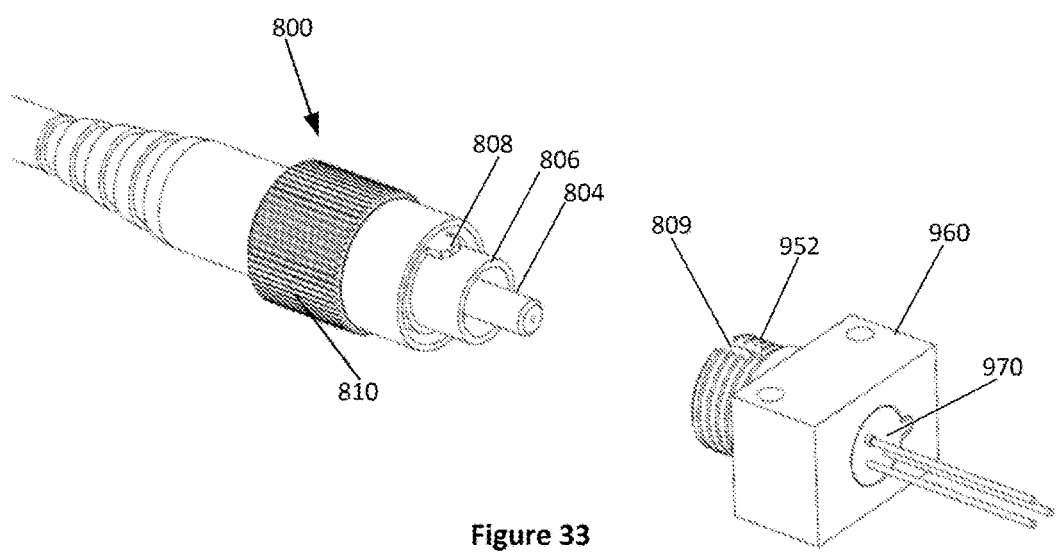
FIG. 33 shows a top back perspective view of the connector and the optical fiber optic cable of FIG. 32.

FIG. 33 shows a top back perspective view of the connector 960 and the optical fiber optic cable 800 of FIG. 32. Shown in FIG. 33 is the ferrule 804, the sleeve 806, the threaded sleeve 810 and the key 808. Also shown is a notch 809 defined by the threaded sleeve 952. The notch is for receiving the key 808. Further, a transducer 970 is shown secured to the surface mount connector 960.

As will be understood by the skilled worker, neither the notch 809 nor the key 808 are required for connecting the optical fiber cable to the surface mount connector. However, due to the omnipresence of keyed optical fiber cables, having notched connectors available is important.

Figure 34:
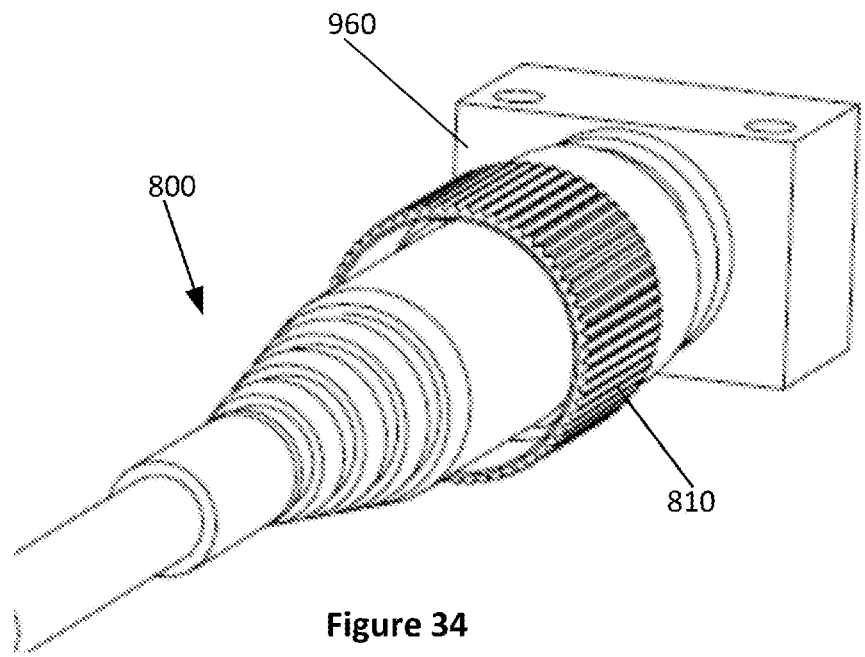
FIG. 34 shows mated the optical fiber cable assembly and the board mount connector of FIGS. 32 and 33.

FIG. 34 shows the optical fiber cable assembly 800 mounted (connected) to the board mount connector 960.

As will be understood by the skilled worker, the optical fiber cable 800 described in the embodiments above is an FC optical fiber cable. However, the connectors of the present disclosure are not limited to connectors for FC optical fiber cables.

Several other optical fiber cable types exist commercially, including ST and SMA optical fiber cables. While the details of the dimensions and of the connection mechanisms can be different for ST and SMA connectors than for the connector embodiment described above, the principles exemplified with the above FC connectors are applicable to other types of connectors. Similarly, while the ferrule 804 of FIG. 29 typically has an outside diameter of 2.5 mm in outside diameter, male FC connectors with other ferrule diameters can be readily accommodated with the connector embodiment discussed above or by modifying the embodiment in question within the scope of the proposed design.

Figure 35:
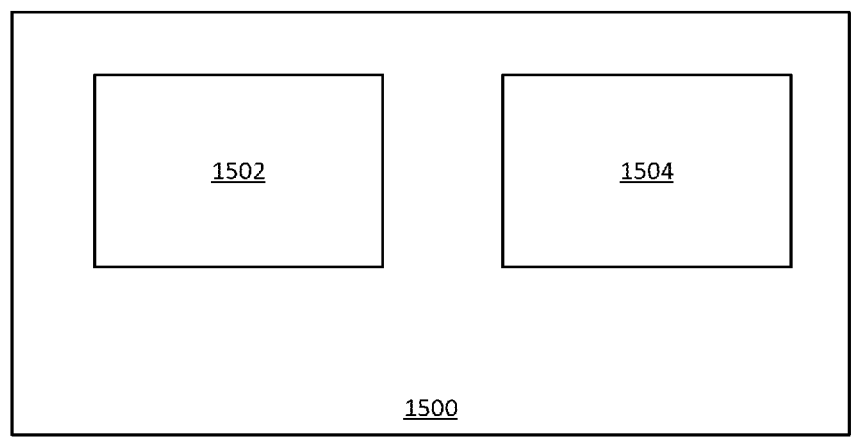
FIG. 35 shows an embodiment of a system in accordance with the present disclosure.

FIG. 35 shows an embodiment of a system 1500 in accordance with the present disclosure. The system comprises a light source 1502 that is configured to generate light that has a pre-determined photon energy. The system 1500 further comprises a transducer 1504 that is configured to receive light from the light source and to convert optical energy to electrical energy. The transducer has a plurality of semiconductor layers electrically connected to each other in series. Each semiconductor layer has substantially a same composition that has associated thereto a substantially same bandgap energy. The bandgap energy is greater than the predetermined photon energy.

Figure 36:
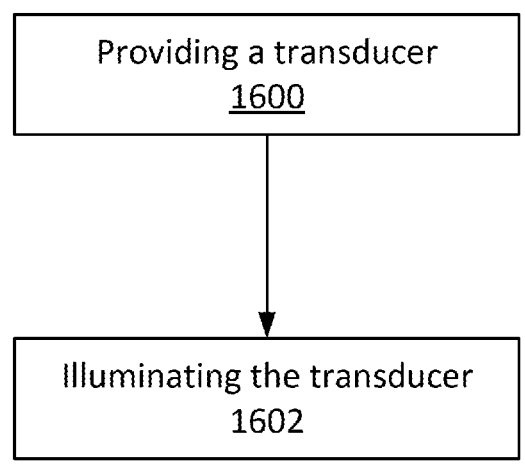
FIG. 36 shows a flowchart of method according to an embodiment of the present disclosure.

The light source can include an optical fiber or an optical fiber cable that has a delivery end to deliver light to the transducer. The system can further comprises a connector to which the delivery end is secured. The connector is configured to align the delivery end and the transducer when the delivery end is secured to the connector. FIG. 36 shows a flowchart of a method in accordance with the present disclosure. At action 1600, a transducer is provided. The transducer has a plurality of semiconductor layers electrically connected to each other in series. Each semiconductor layer has substantially a same composition that has associated thereto a substantially same bandgap energy. At action 1602, the transducer is illuminated with light that has associated thereto a photon energy that is less than the bandgap energy.

Figure 37:
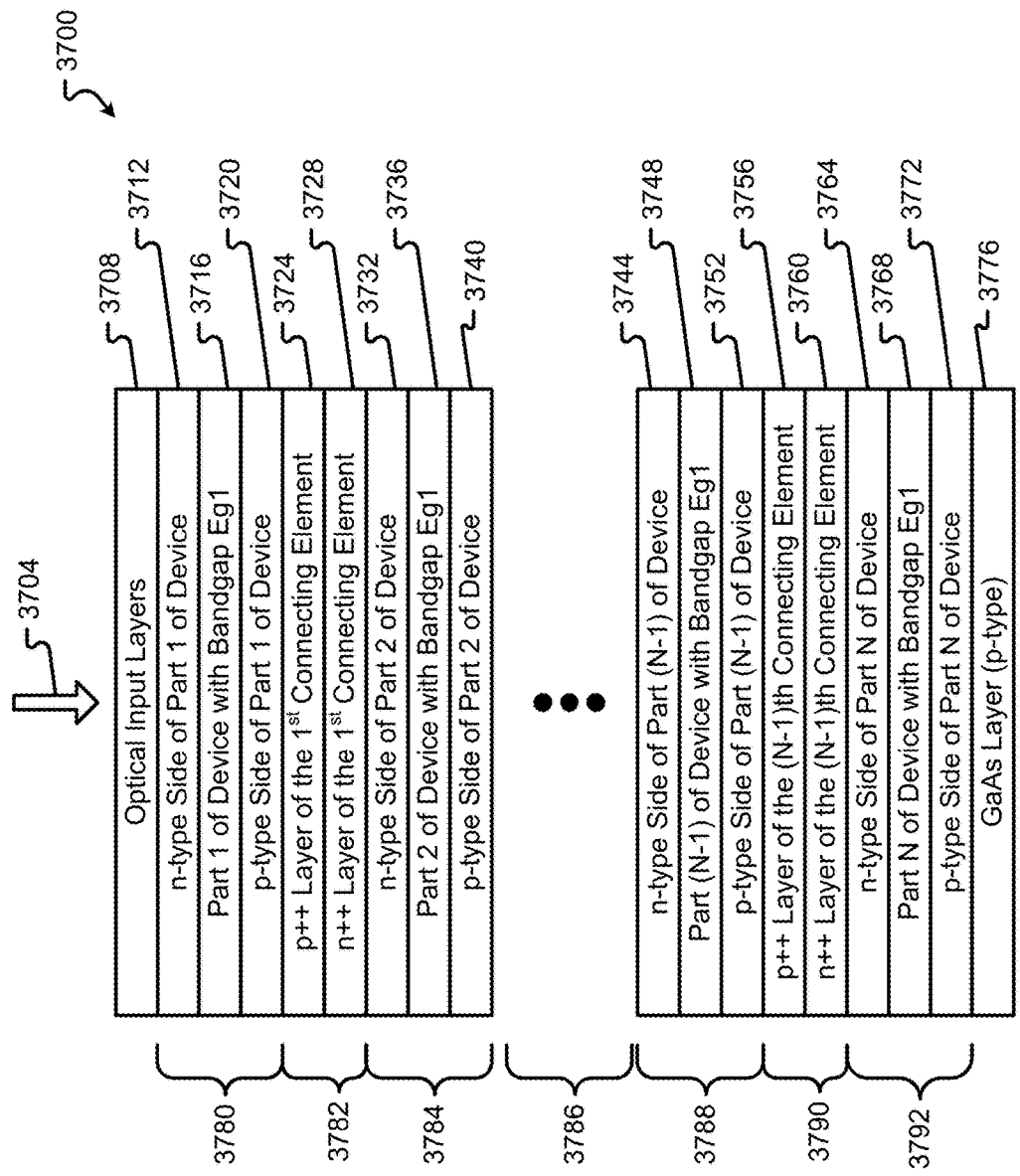
FIG. 37 shows another prior art p-n junction.

Another aspect of the present disclosure provides a monolithic semiconductor connecting element structure or connecting layer(s) to electrically connect at least two different parts of an optoelectronic device grown by epitaxy. The connecting element, in some embodiments, provides high transparency for photons impinging the input active area of the device that need to be transmitted through the connecting element with no significant optical absorption. The low electrical resistance is obtained by pseudomorphically growing a low resistance tunnel junction via use of an epitaxy processes. The low resistance properties of the tunnel junction are obtained by achieving p++ and n++ layers with high doping concentrations, which have an average lattice constant that does not deviate significantly from the underlying layer upon which it is grown (also known as pseudomorphic growth). For example, in devices that are lattice-matched to the GaAs lattice constant (a~0.56575 nm), the high p-type doping concentration (sometimes also called p++ layer) of a tunnel junction can often be achieved by doping that semiconductor layer with carbon (C) to a level between 1E18 cm-3 to 5E21 cm-3, and preferably to a level between 5E19 cm-3 to 5E20 cm-3. An example of such a device 3700 is depicted in FIG. 37.

Similarly, in devices that are lattice-matched to the GaAs lattice constant (a~0.56575 nm), the high n-type doping concentration (sometimes also called n++ layer) of a tunnel junction can often be achieved by doping that semiconductor layer with carbon (Te) to a level between 1E18 cm-3 to 5E21 cm-3, and preferably to a level between 5E19 cm-3 to 5E20 cm-3. Other dopants can be used, but the epitaxy process must allow achieving the targeted doping levels. For example, Se, S, or O could be used instead of Te. Depending on the energy gap of the active layer that are on the side opposite to the optical input active area, the above semiconductor layers comprised in the connecting element can be chosen to be latticed matched GaAs or a quasi-lattice-matched AlxGa(1−x)As alloy, with x for example between 0% and 100%, and most preferably between 0% and 40%.

There exists epitaxy processes that can be used to readily achieve the desired n++ and p++ doping profile, as mentioned above, for such GaAs or AlxGa(1−x)As. It will be apparent for one skilled in the art that such a design will result in low-resistance lattice-matched or pseudomorphic tunnel junctions, which can be used as connecting elements that feature the desired low-resistivity and high-transparency properties on GaAs layers. Typically the low resistivity desired will results in a drop in voltage preferably lower than 100 mV and most preferably lower than 10 mV, depending on the current passed through the optoelectronic devices. For concentrated photovoltaic devices or for laser power converter devices, the current passing through such connecting element can be of the order of several amperes (for example typically smaller than 10 A), and the device area is preferably less than 10 mm×10 mm but can be sometimes a few cm x a few cm depending on the application, and most preferably less than 6 mm×6 mm. The is no limit on how small the device area can be other than practical geometrical limits, but preferably the device area is larger than 0.1 mm×0.1 mm, and most preferably larger than 1.0 mm×1.0 mm. The device area can be square, rectangular, or have any arbitrary geometry depending on the application, and the particularity of the geometry of the device area is not affecting the generality of the present disclosure.

The thicknesses of the p++ and the n++ layers described above are typically between 1000 nm and 0.1 nm, preferably between 100 nm and 1 nm, and most preferably between 90 nm and 10 nm. The thickness of the p++ layer can be designed to be about the same as that of the n++ layer, or similar results can be obtained in the case for which the thickness of the p++ layer can be different than that of the n++ layer. The determination of the optimal thickness for these layers can typically take into consideration carrier depletion effects at interfaces, diffusion effects in the growth or post growth processes, the ramp up and ramp down time of the dopant profile during the epitaxial growth with respect to the growth rate of the alloys used in the n++ and p++ layers, the thickness of the depletion regions in the formation of these layers, the Coulomb effects for the carriers in the formation of these layers, the effects of the portion of the activated dopants, the surface segregation effects of the dopants or of the alloys during the epitaxy process, surface reconstruction effects, surface morphology effects, dopant incorporation efficiency effects, lattice contraction or expansion effects caused by heavy dopant concentrations, quantum well or low-dimensionality tunneling effects, space-charged effects, or any other effects affecting the active carrier concentrations, the effective electric fields participating in the quantum tunneling phenomena, the residual optical absorption in these layers, or the doping profiles.

For example, FIG. 37 depicts prior art connecting elements based on such tunnel junctions grown with the GaAs lattice on a GaAs layer 3776. In particular, FIG. 37 shows two such connecting elements 3782 and 3790. Other connecting elements are not shown but can be incorporated within the other layers 3786, which can comprise other parts of the structure 3700 and other such connecting elements for structure comprising a multitude of repeated parts. As will be understood by one with ordinary skill in the art, while FIG. 37 depicts prior art connecting elements, such prior art connecting elements can in some instances be used to create novel embodiments, but in other instances, the prior art connecting elements might be too limiting to construct other novel embodiments as described in more details further below.

In FIG. 37, the connecting element 3782 connects a first part of the structure 3780 to a second part of the structure 3784. Similarly, the connecting element 3790 connects a N−1 part of the structure 3788 to a N part of the structure 3792. The incoming photons 3704 impinge on the optical input layers 3708 and are transmitted to the first part of the structure 3780, which can absorb some of the photons 3704. The photon spectrum transmitted through structure 3780 is then passed through the connecting element 3782. The connecting element 3782 is said to have high optical transparency if it does not significantly absorb the spectral content of the optical input 3704 that was transmitted through the first part of the structure 3780 and impinge on the connecting element 3782. In such case, substantially all the light impinging from one side of the connecting element 3782 is transmitted to the other side to the second part of the structure 3784. Similarly, the connecting element 3782 can be said to have a low resistivity (or equivalently a high-conductivity), if the electrical resistance across the connecting element 3782 is smaller than 100 millohms, and preferably smaller than 10 milliohm for example. The exact value of the resistance that will define a low resistivity will depend on the application of the device and the area of the device used. In such a device, the p++ layers 3724, 3756 of the connecting elements 3782, 3790, respectively, can be for example a single layer of GaAs(C) and the n++ layers 3728, 3760 of the connecting elements 3782, 3790, respectively, can be a single layer of GaAs(Te) for example. The doping level of the n++ and p++ layers 3724, 3728, 3756, 3760 can be chosen with doping values as mentioned above. Furthermore, the GaAs 3776 is lattice-matched to the GaAs lattice constant so the layers can readily be grown by epitaxy using commercial reactors for example.

The epitaxy can be carried out through any suitable means of semiconductor growth such as: metal organic chemical vapor deposition (MOCVD), chemical beam epitaxy (CBE), molecular beam epitaxy (MBE), solid phase epitaxy (SPE), hydride vapor phase epitaxy or by other similar hybrid systems or combinations thereof. The growth parameters can be optimized for the various layers of the embodiments, for example to maximize the device performance or its manufacturability. The growth parameters and growth conditions that can be optimized include, for example, the growth temperature, the pressure of the various gases used to grow the layers, the ratio of those pressures (for example the III/V ratio when growing III-V semiconductor layers), the alloy composition, the residual strain, the growth rate, the doping or co-doping of the various layers, the use of surfactant gases, the use of annealing cycles, etc.

As shown in FIG. 37, the structure 3700 may include the optical input layer(s) 3708 built on top of a first part of the structure 3780, which is built on top of a first connecting element 3782, which is built on top of a second part of the structure 3784, . . . , which is built on top of an N−1 part of the structure 3788, which is built on top of another connecting element 3790, which is built on top of an Nth part of the structure 3792, which is built on top of the GaAs layer 3776. It should be appreciated that each of the parts and connecting elements may include one, two, three, or more layers. For example, the first part of the structure 3780 is shown to include an n-type side 3712, a first part with bandgap Eg1 3716, and a p-type side 3720. Similarly, the second part of the structure 3784 is shown to include an n-type side 3732, a second part with bandgap Eg1 3736, and a p-type side 3740. Furthermore, the N−1 part of the structure 3788 is shown to include an n-type side 3744, an N−1 part with bandgap Eg1 3748, and a p-type side 3752. Lastly, the N part of the structure 3792 is shown to include an n-type side 3764, an N part with bandgap Eg1 3768, and a p-type side 3772. As can be appreciated, each part of the structure includes at least a p-type layer and an n-type layer. Each p-type layer and n-type layer may have a built-in photovoltage that is substantially similar to the built-in photovoltage of all other parts of the structure.

Figure 38:
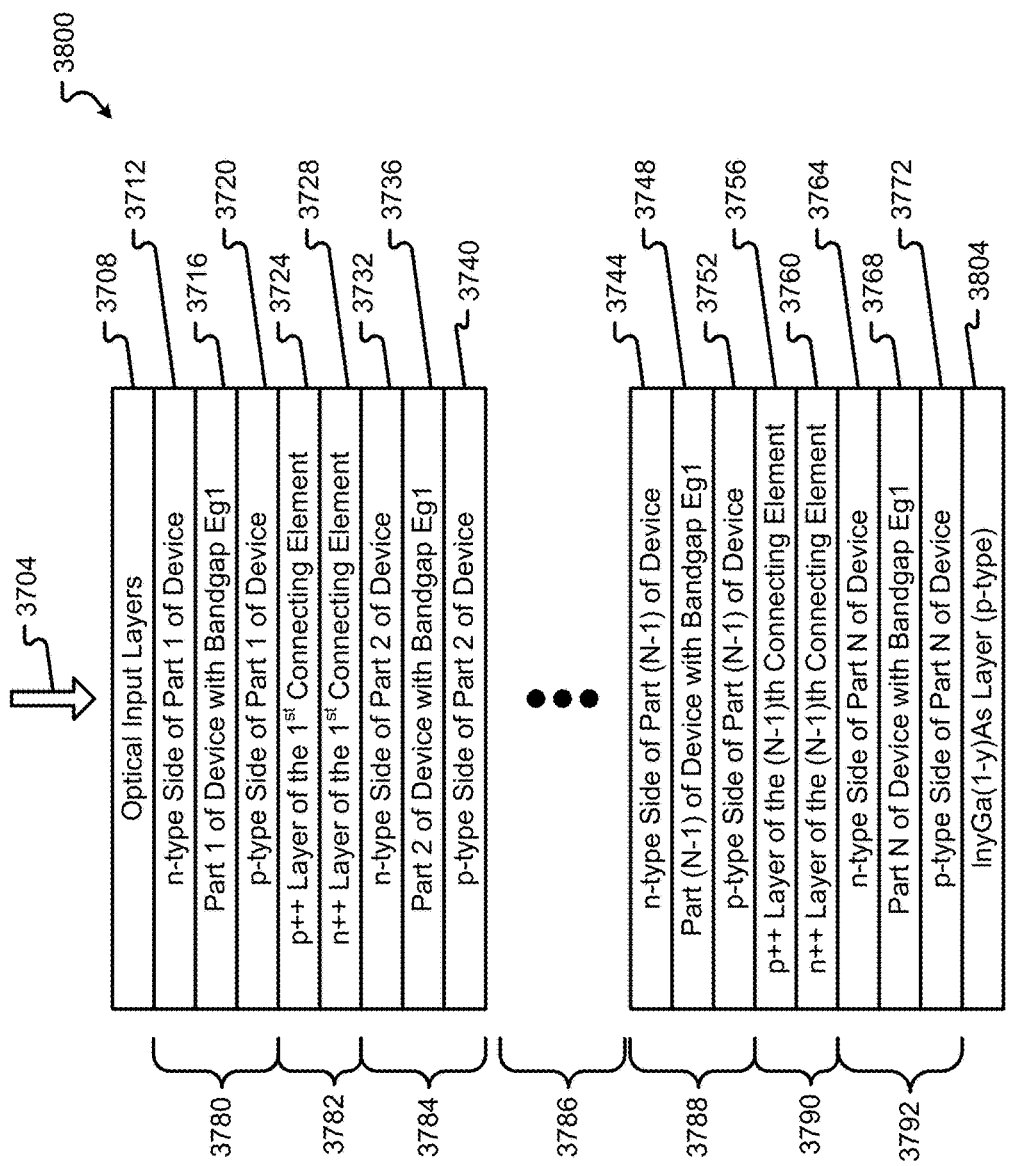
FIG. 38 shows a connecting layer according to an embodiment of the present disclosure.

The stack 3700 is also shown to have a plurality of connecting elements or connecting layers 3782, 3790 that are sandwiched between two adjacent p-n stacks, thereby providing electrical communication between the adjacent stacks. Because there exists applications that require different optical properties than the ones described in FIG. 37, variations of the structure 3700 may be useful. For example, for some applications it is desirable to have a lower bandgap than the bandgap of GaAs as exemplified above with the structure depicted in FIG. 37. For such applications, it can be desirable to construct a device 3800 on the basis of an $In_yGa(1-y)As$ layer 3804, as shown in FIG. 38. The device 3800 may be similar to device 3700 in that a stack of p-n layers and connecting elements are built on top of a substrate. It should be appreciated, however, that the difference between layer 3804 and 3704 may result in different materials, dopants, and/or doping concentrations used in some or all of the p-n layers and/or connecting elements. While similar reference numbers as used in FIG. 37 will be used to describe some of these p-n layers and connecting elements of FIG. 38, it should be appreciated that the p-n layers and/or connecting elements may be different in substance.

The $In_yGa(1-y)As$ layer 3804 can be a metamorphic layer or a virtual substrate, for example. In that case, however, one skilled in the art would recognize that the lattice constant of the base layer is larger. For example, for y=12%, the lattice constant of layer 3804 is now approximately 0.57016 nm, and the In0.12Ga0.88As will have a bandgap of 1.247 eV at 20° C. which would correspond to a threshold absorption bandage wavelength of 994 nm. Such an embodiment is useful for infrared applications, for example.

The In0.12Ga0.88As semiconductor alloy can be used for example in laser power converting devices for an optical input 3704 based on a high-power 976 nm laser source. Such lasers are readily available commercially with high powers, good reliability, and are also cost-efficient optical power sources. Because the base layer 3804 now has a different lattice constant, it is also desirable to change the design of the connecting elements 3782, 3790 to maintain the pseudomorphic epitaxial growth. Indeed, if a connecting element is not lattice-matched or pseudomorphically grown to its underlying layers, then defects are expected to form after a critical thickness and the defected material can be expected to have poor electrical properties. The value of the critical thickness that can be attained before the formation of defects is dependent on the lattice-mismatch with the adjacent layers. A high density of defects in the connecting element 3782, 3790 is expected to trap the carriers and reduce the peak tunneling current. The peak tunneling current is the characteristic current of a tunneling diode before its current-voltage behavior enters into a negative different resistance (NDR) regime, whereby the current through the device starts to decrease with increasing voltage. For a tunnel junction to be highly conductive, it is desirable to operate the tunnel junction at a current significantly lower than its peak tunneling current. It is, therefore, desirable to realize tunnel junctions with high peak tunneling currents. In practice, this translates into the constraints of maintaining pseudomorphic layers for the tunnel junction design, and achieving high doping levels in these layers.

Figure 39:
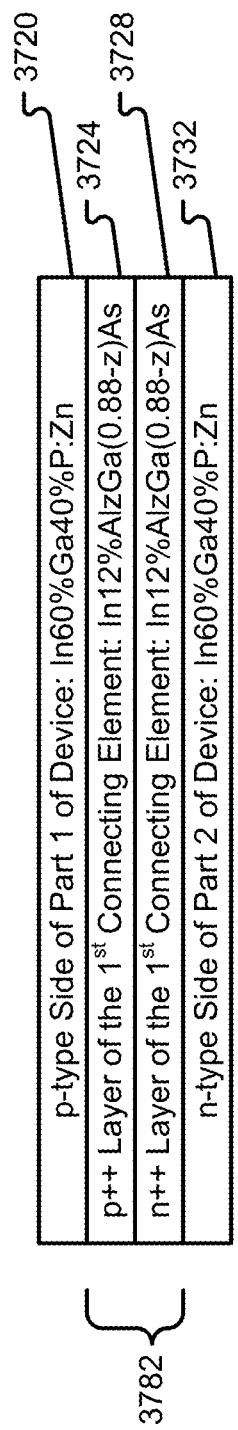
FIG. 39 shows details of a connecting layer according to an embodiment of the present disclosure.

FIG. 39 illustrates an embodiment for the above example based on an In0.12Ga0.88As semiconductor alloy for the base layer 3804. A high bandgap InGaP 3732 will be lattice-matched to the In0.12Ga0.88As based layer 3804 for an indium composition of 60%. It will have a bandgap of 1.768 eV and can be doped n-type using Si, for example. Similarly, the p-type cladding layer 3720 can be designed with In60% Ga40% P by doping with Zn for example. For the p++ layer 3724 and the n++ layer 3728, a design based on an $In12\% AlzGa(0.88-z)As$ alloy will be lattice-matched to the In0.12Ga0.88As based layer 3804. The aluminum composition of layer 3724 and 3728 can be set between 0% and 100%, and preferably between 5% and 35% to maintain a good transparency of the connecting element 3782 for the impinging photons. Although FIG. 39 depicts details of a connecting element 3782, it should be appreciated that connecting element 3790 and other connecting elements may be similarly or identically constructed.

However, while the embodiment of FIG. 39 satisfies the lattice-matching constraint, it also introduces a significant alloy fraction of indium into the n++ and p++ tunnel junction layers 3724, 3728. The indium composition of these layers can make it difficult to reach the desired doping level. For example, in MOCVD, it is difficult to reach high p-type doping with C when In is present in the layer. Similarly, the presence of indium can make it difficult or impossible to reach the required n++ doping level by using Te or Se as a dopant. Other dopant species or growth conditions can be attempted to reach the required doping levels, but typically yield unsatisfactory results and/or growth conditions that are not favorable in view of manufacturing or cost considerations.

The following discloses a solution that will overcome the above problems of obtaining the required n++ and p++ doping level while maintaining the required pseudomorphic structural properties for the infrared optoelectronic applications requiring a bandgap lower than GaAs, such as $In_xGa1-xAs$, including In0.12Ga0.88As.

Figure 40:
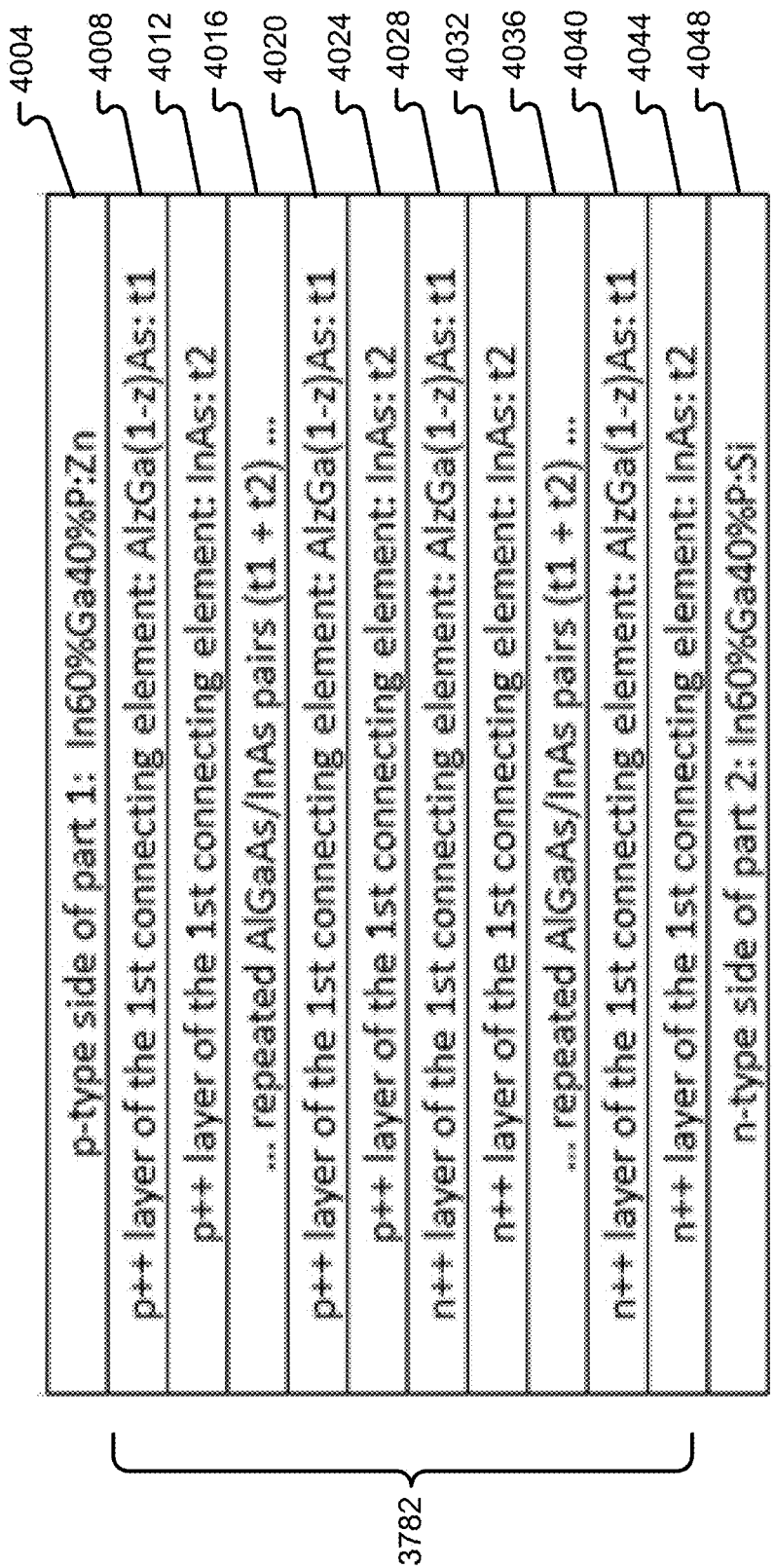
FIG. 40 shows a series of layer pairs used to construct a connecting layer according to an embodiment of the present disclosure.

More specifically, FIG. 40 shows an embodiment whereby a series of layer pairs are used to construct the connecting element 3782 and/or 3790 that are illustrated in FIG. 38. In some embodiments, the layers depicted in connection with FIG. 40 and/or FIG. 38 may correspond to a stack of layers operating as a power over fiber or a laser power converter device.

Layers 4008, 4020, 4028, 4040 are designed based on an $Al_zGa1-zAs$ with a thickness t1. Layers 4012, 4024, 4032, 4044 are designed based on the binary semiconductor InAs with a thickness t2. The Al composition z is then chosen to obtain the desired optical transparency while the values of t1 and t2 are selected to maintain pseudomorphic epitaxial layers of high quality. An advantage of this embodiment is that the $Al_zGa1-zAs$ layers are designed to not comprise any indium. They can therefore be readily doped n++ and p++ with the desired doping level using standard epitaxy processes. For example, in MOCVD for example, the Te is known to incorporate well to achieve high doping values in AlGaAs. Similarly, in MOCVD for example, C is known to incorporate well to achieve high doping values in AlGaAs. We can therefore refer to layers 4008, 4020, 4028, 4040 as doping tunnel junction layers, or layers made of highly dopable material; and we can refer to layers 4012, 4024, 4032, 4044 as adjustor tunnel junction layer. Therefore, the present disclosure resolves the doping constraint of for connecting element for the infrared optoelectronic applications requiring a bandgap lower than GaAs, such as $In_xGa1-xAs$, including In0.12Ga0.88As. It will then become clear from one skilled in the art that many other useful configurations will be useful for other applications, for example, for an optical input around 910 nm, a similar embodiment can be constructed with a In0.08Ga0.92As base layer, and by making the related adjustments in the thicknesses t1 and t2 of the above embodiment.

For example, to further describe the example of FIG. 40, whereas the base layer is In0.12Ga0.88As, the values of t1=2.2 nm and t2=0.3 nm will result in an average lattice constant equal to In0.12Ga0.88As (here a~0.57016 nm at 20° C.). The values of t1 and t2 above have been selected such that the individual layers are below the critical thickness at which dislocations will start to form. Furthermore, since the t1 and t2 are thin in view of the electron and hole wave functions in these material, the wavefunction coupling will form an effective coherent or partially-coherent state that will substantially behave as a monolithic alloy. A skilled artisan will recognize that other values of t1, t2, and alloy compositions will similarly result effective pseudomorphic alloys with the desired properties. The main considerations in the selection of t1 and t2 are that each individual layer thickness remains below the critical thickness, and that the weighted average of the respective lattice constants yields an average lattice constant matched to the base layer (here In0.12Ga0.88As in this example). For example, the critical thickness for InAs is known to be about 1.5 monolayer. Since an InAs thickness of t2=0.3 nm would correspond roughly to 1 monolayer, the growth will proceed in a planar layer-by-layer growth mode, and the resulting layer sequence will proceed pseudomorphically.

The effective bandgap of the connecting element 3782, 3790 can be evaluated for various values of Al composition z. The effective bandgap estimate can be approximated by using the weighted average of the individual bandgaps. This approximation can be refined by calculating the quantized energy levels in the selected design. For the example in FIG. 40, with t1=2.2 nm and t2=0.3 nm, and z=15%, the weighted average estimate predicts an effective bandgap of 1.462 eV, whereas the quantum heterostructure calculation predicts an effective bandgap of 1.446 eV (16 meV lower). For both estimates, the optical input beam impinging at a wavelength of 976 nm will not be absorbed within the connecting element 3782, 3790.

Figure 41:
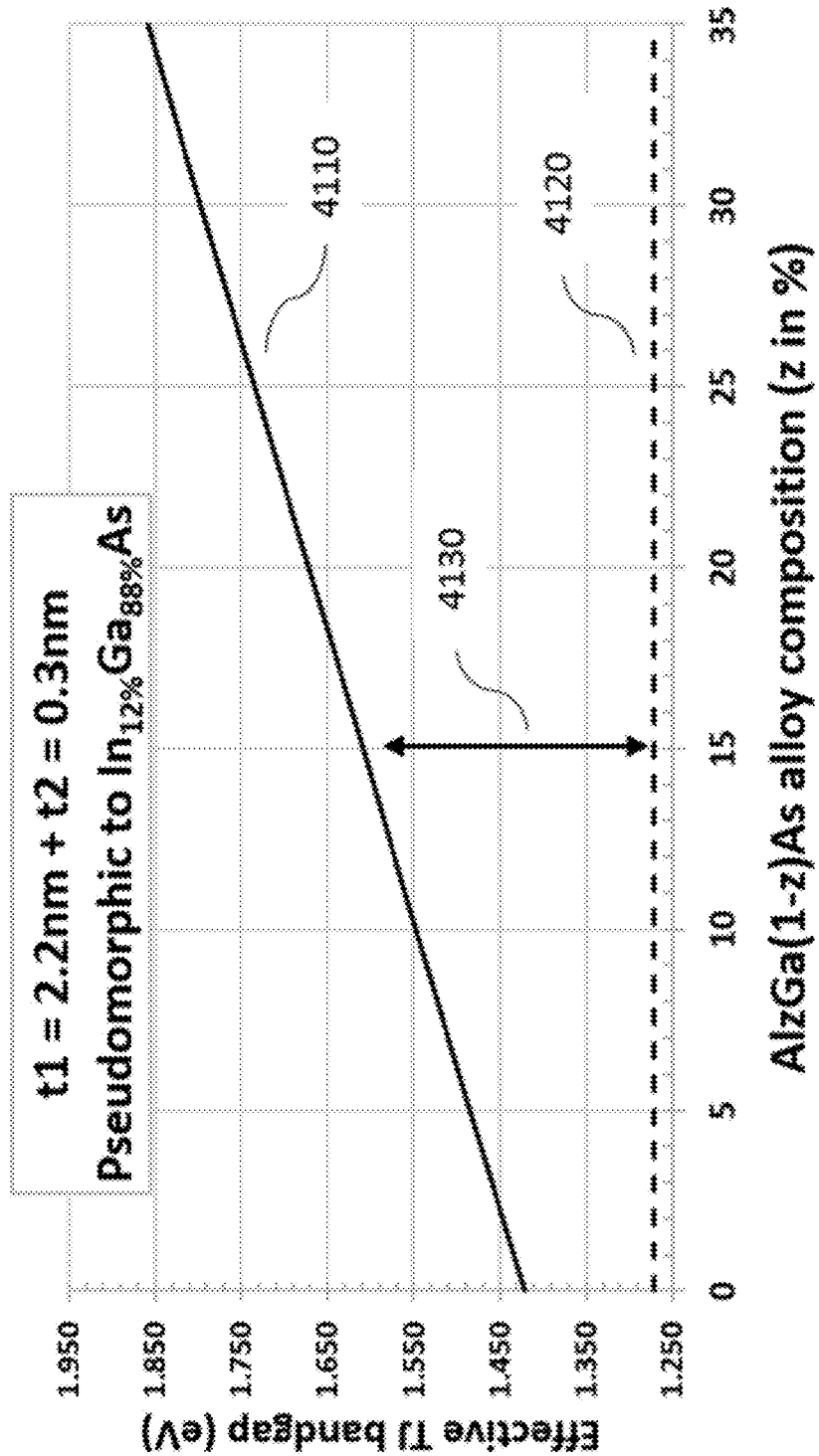
FIG. 41 shows effective bandgap estimation as a function of aluminum composition according to an embodiment of the present disclosure.

FIG. 41 summarizes the effective bandgap evaluation (curve 4110) as a function of the aluminum composition of the AlzGa(1−z)As alloy for an embodiment based on t1=2.2 nm and t2=0.3 nm. For all values of z, the connecting element layers are pseudomorphic to In12% Ga88% As. This embodiment is therefore suitable for example for an input optical power impinging at 976 nm. Curve 4120 depicts the optical input beam energy. By selecting an appropriate energy difference (curve 4130) between the optical input beam (curve 4120) and the effective bandgap of the resulting connecting element (curve 4110), the high optical transparency of the connecting element can be insured. As mentioned above, the desired n++ and p++ doping levels are achieved by doping the AlGaAs layers 4008, 4020, 4028, 4040, etc with Te and with C respectively for example. The desired high peak current of the resulting tunnel junction is therefore achieved by doping the AlGaAs layers 4008, 4020, etc with carbon (C) to a level between 1E18 cm-3 to 5E21 cm-3, and preferably to a level between 5E19 cm-3 to 5E20 cm-3; and by doping the AlGaAs layers 4028, 4040, etc with carbon (Te) to a level between 1E18 cm-3 to 5E21 cm-3, and preferably to a level between 5E19 cm-3 to 5E20 cm-3. As shown in FIG. 40, repeating AlGaAs/InAs pairs 4020, 4036 may be provided between p++ pairs and n++ pairs.

Figure 42:
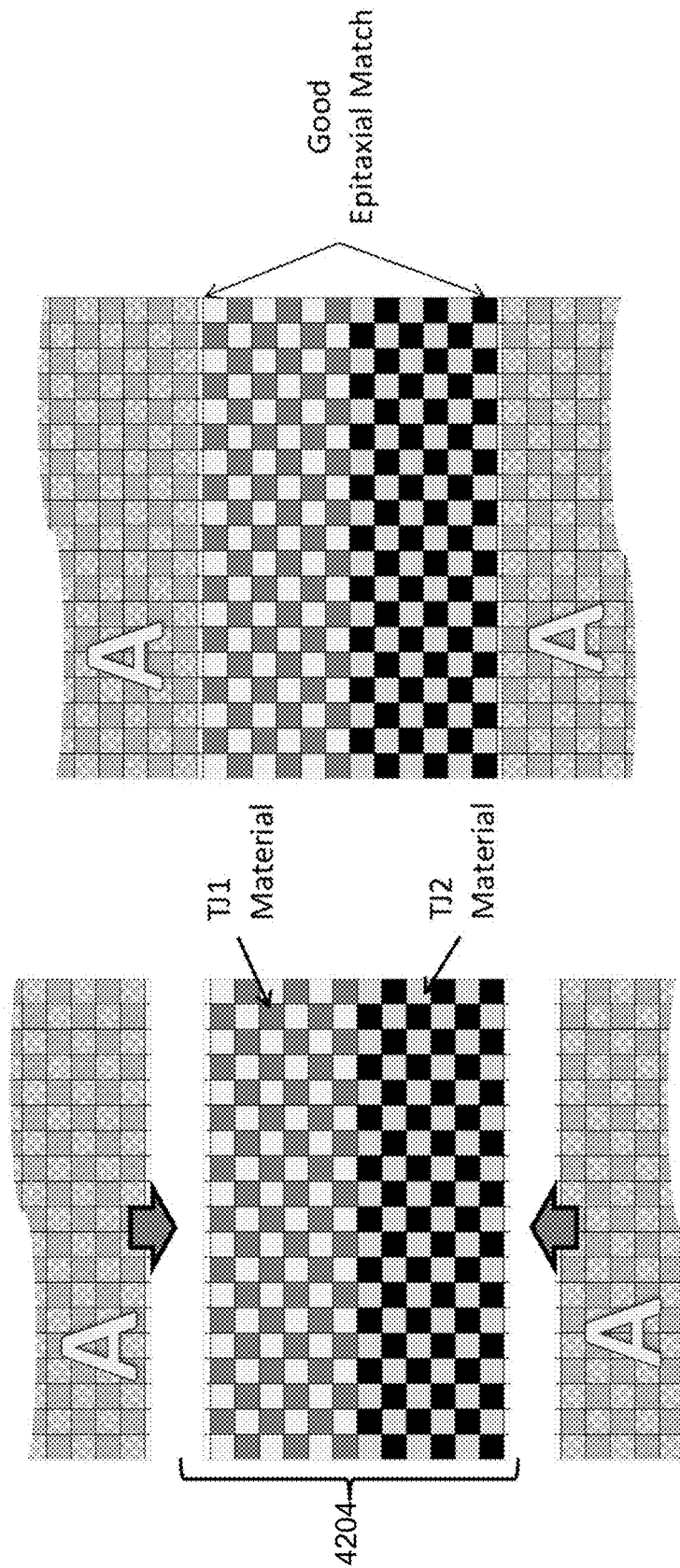
FIG. 42 is a cross-sectional view of a prior art tunnel junction.

As shown in FIG. 42, in addition to the high optical transparency requirements mentioned in the description above, the standard tunnel junctions 4204 have two key attributes related to achieving their requirement of low resistivity: 1) they should have high doping levels to be highly conductive and 2) they should match the lattice spacing of the material A to connect to prevent dislocations and defects. Tunnel junctions 4204 are basic building blocks that can be used in some semiconductor devices namely, stacked lasers, solar cells and photo-transducers or photo-converters. Embodiments of the present disclosure contemplate that any type of tunnel junction depicted and described herein can be used in a transducer, stacked laser (or similar light-emitting device), solar cells, photo-converters, or any other semiconductor device.

However, this is restricted to materials (e.g., material A) with a lattice constant identical or substantially identical to that of the standard tunnel junctions. Materials with different lattice constants generally cannot be connected without dislocations, defects and other faults that prevent proper working of the connection. As a more specific example, for materials with a different lattice spacing, the standard tunnel junctions may not have a lattice spacing with the proper match. This will lead to dislocations and defects at the interfaces. The difficult problem is that materials with different lattice spacing are desirable for lasers or photo-transducers operating in specific wavelength ranges.

Figure 43:
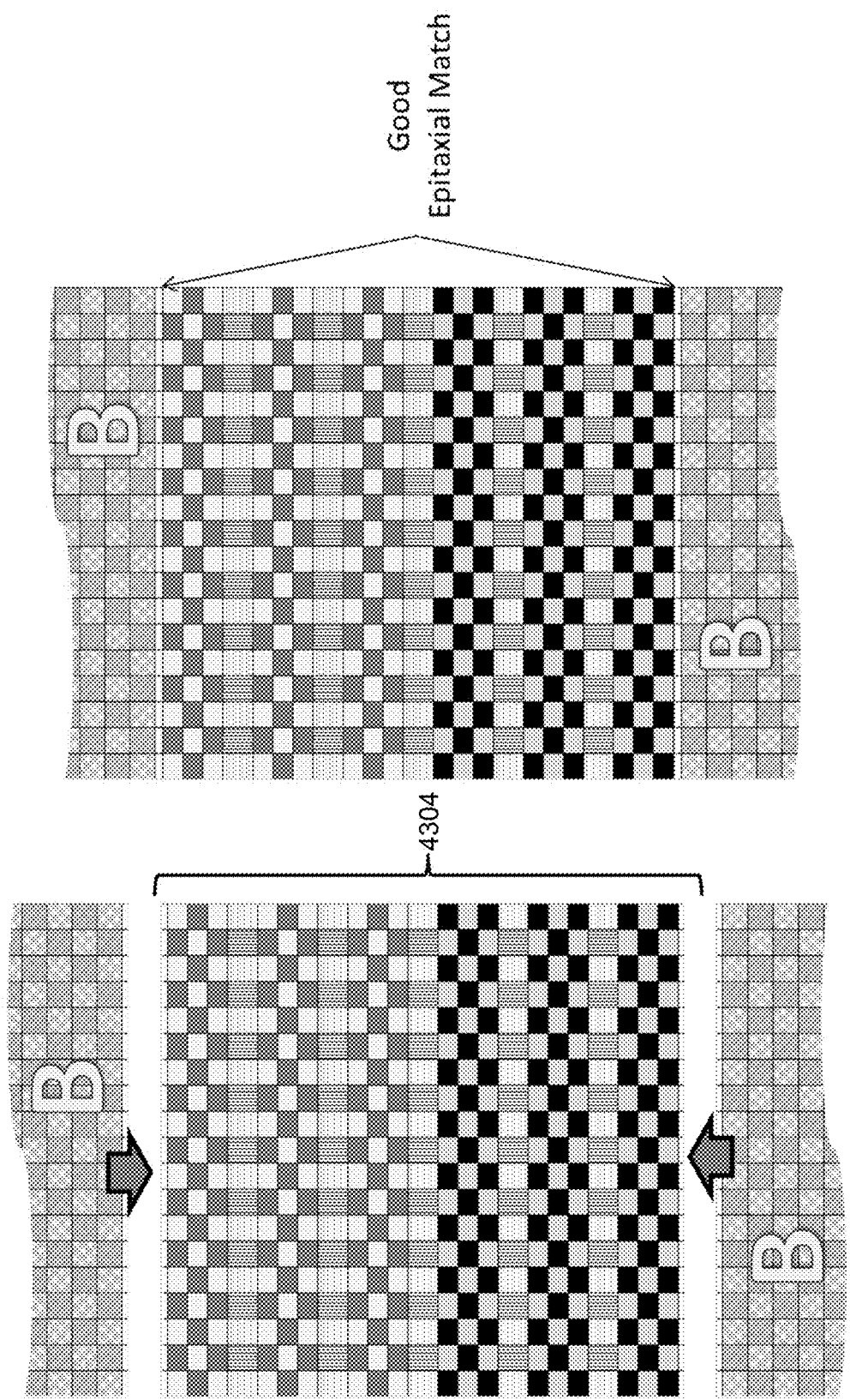
FIG. 43 is a cross-sectional view of a tunnel junction according to an embodiment of the present disclosure.
Figure 44:
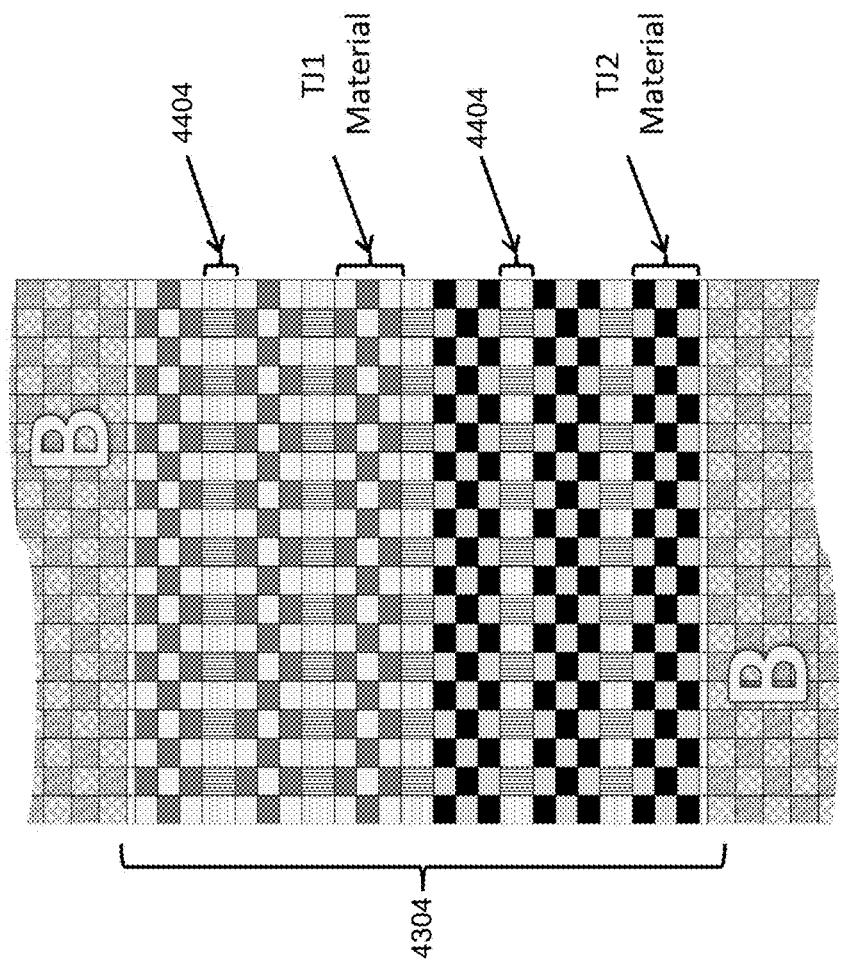
FIG. 44 is a detailed cross-sectional view of a tunnel junction according to an embodiment of the present disclosure.

In accordance with at least some embodiments of the present disclosure, and as shown in FIGS. 43 and 44, an improved tunnel junction 4304 is provided that includes standard tunnel junction materials TJ1 and TJ2 periodically interspaced by an additional material, which may be referred to herein as a lattice adjuster or (LA) 4404, that forces the tunnel junction 4304 to adopt the lattice constant of a material B to be connected. As mentioned in the above description, the lattice adjuster layer 4404 can therefore also be refer to as an adjustor tunnel junction layer. This approach gives a good epitaxial connection without dislocations and defects. As shown in FIG. 44, the standard tunnel junction materials TJ1 and TJ2 are either stretched or compressed to match the other material lattice spacing by the presence of the lattice adjuster material 4404, which has the opposite stress/strain. For example, two different materials TJ1 and TJ2 for a tunnel junction 4304 would be stretched and the lattice adjuster material 4404 would be compressed to counteract the stretching of the tunnel junction materials TJ1 and TJ2.

In epitaxial semiconductor growth, stretching/compression occurs when a material is grown with a "natural" (bulk) lattice constant smaller than that of the substrate. As the material grows it is forced to adopt the larger lattice constant and it is stretched in the plane of the substrate. It should be noted that it is also compressed in this case in the direction perpendicular to the substrate. The resulting effect is that the wafer or substrate will be bowed upwards. There is a limit to this elastic behavior and too much difference in the lattice constants lead to dislocations, breaking defects, or the like. For compression the opposite behavior is revealed, i.e. trying to grow a material with a "natural" (bulk) lattice constant larger than that of the substrate. In this situation, bowing will occur in the opposite direction. Embodiments of the present disclosure overcome these issues by presenting a tunnel junction 4304 with one or more lattice adjuster materials 4404.

It should also be appreciated that the wavelength of interest determines the materials to select. For example, if it is desired to convert light from a laser at a wavelength of 975 nm, a good candidate for the absorber material is the ternary compound In(12%)Ga(88%)As with a bandgap with an energy only slightly smaller to the incoming photons with a wavelength of 975 nm. This ternary material however will not grow well on known epitaxial wafer substrates like GaAs, Si, InP, Ge, or others. It can, however, grow well on so-called "metamorphic" layers or virtual substrates. Once the substrate and p-n junctions material are chosen, the materials for the tunnel junction 4304 can be selected. As stated earlier, the choice of tunnel junction material is limited because of the high doping and the optical transparency requirements. Accordingly, a material like AlGaAs—GaAs can be selected, which is not lattice matched to the ternary/metamorphic substrate. This material selection may otherwise be subject to dislocations and/or breaking if not appropriately addressed. Embodiments of the present disclosure address these potential problems by introducing the lattice adjustor 4404 layers between tunnel junction materials TJ1, TJ2. The lattice adjustor materials 4404 provide the opposite stress within the tunnel junction 4304 to manage the stress build-up.

Similar considerations would apply, for example, when implementing high-performance tunnel junctions on other material for other applications. For example on InP, the p++ dopable material could can be p++AlGaAs(C) and the n++ dopable material could can be n++AlGaAs(Te), whereby the lattice adjustor layers 4404 could again be InAs (or equivalently (InGaAs with a high In fraction), but now thicker to properly take into account the different lattice constant requirements. As also mentioned above, other examples can be envisioned, such as In(8%)Ga(92%)As which would be useful for applications in the 900-910 nm range. It should also be appreciated that the tunnel junction 4304 and lattice adjustor materials 4404 provided therein can be useful for different types of devices such as lasers or emitters instead of power converters or transducers.

At least one embodiment is disclosed and variations, combinations, and/or modifications of the embodiment(s) and/or features of the embodiment(s) made by a person having ordinary skill in the art are within the scope of the disclosure. Alternative embodiments that result from combining, integrating, and/or omitting features of the embodiment(s) are also within the scope of the disclosure. Where numerical ranges or limitations are expressly stated, such express ranges or limitations may be understood to include iterative ranges or limitations of like magnitude falling within the expressly stated ranges or limitations (e.g., from about 1 to about 10 includes, 2, 3, 4, etc.; greater than 0.10 includes 0.11, 0.12, 0.13, etc.). For example, whenever a numerical range with a lower limit and an upper limit is disclosed, any number falling within the range is specifically disclosed. Additionally, the use of the term "substantially" means+/−10% of a reference value, unless otherwise stated. As an example, the phrase: "voltage A is substantially the same as voltage B" means that voltage B is within +/−10% of voltage B.

In the preceding description, for purposes of explanation, numerous details are set forth in order to provide a thorough understanding of the embodiments. However, it will be apparent to one skilled in the art that these specific details are not required. In other instances, well-known electrical structures and circuits are shown in block diagram form in order not to obscure the understanding. For example, specific details are not provided as to whether the embodiments described herein are implemented as a software routine, hardware circuit, firmware, or a combination thereof.

The above-described embodiments are intended to be examples only. Alterations, modifications and variations can be effected to the particular embodiments by those of skill in the art without departing from the scope, which is defined solely by the claims appended hereto.

What is claimed is:

1. A transducer configured to convert optical energy to electrical energy, the transducer comprising:
    a plurality of p-n stacks, wherein each p-n stack comprises at least a p-layer and an n-layer, and formed therein a built-in photovoltage between the p-layer and the n-layer, wherein all of the p-layers in the plurality of p-n stacks comprise substantially the same p-type material in the substantially the same composition, and wherein all of the n-layers in the plurality of p-n stacks comprise substantially the same n-type material in substantially the same composition such that each p-n stack in the plurality of p-n stacks has a substantially similar built-in photovoltage;
    a plurality of connecting layers, each connecting layer in the plurality of connecting layers being sandwiched between two adjacent p-n stacks for electrically connecting the two adjacent p-n stacks, wherein each of the p-n stacks in the plurality of p-n stacks is arranged such that the built-in photovoltage of each p-n stack additively contributes to an overall electric potential of the transducer; and
    wherein each p-n stack in the plurality of p-n stacks has a lattice spacing layer and wherein each connecting layer in the plurality of connecting layers comprises a doping tunnel junction layer having a lattice spacing type of either a stretched type or a compressed type relative to the lattice spacing layer of the p-n stack as well as an adjustor tunnel junction layer having a lattice spacing type which is opposite the doping tunnel junction layer.

2. The transducer of claim 1, wherein each connecting layer in the plurality of connecting layers comprises a group of layers with material or composition different than an adjacent p-layer and different than an adjacent n-layer.

3. The transducer of claim 1, wherein each p-n stack in the plurality of p-n stacks further comprises a least a bandgap energy layer sandwiched between the p-layer and the n-layer thereof.

4. The transducer of claim 1, further comprising a passivation layer facing a light source, wherein one of the p-layer and n-layer of each p-n stack comprises a photon catching region with a thickness that increases away from the passivation layer to the photon catching region such that a substantially similar amount of photons are captured in each photon catching region.

5. The transducer of claim 1, wherein each connecting layer further comprises a plurality of additional doping tunnel junction layers and a plurality of additional adjustor tunnel junction layers.

6. The transducer of claim 5, wherein:
    the doping tunnel junction layer and the plurality of additional doping tunnel junction layers have a first tunnel junction thickness;
    the adjustor tunnel junction layer and the plurality of additional adjustor tunnel junction layers have a second tunnel junction thickness; and
    the first tunnel junction thickness and the second tunnel junction thickness are selected such that the connecting layer adopts the lattice spacing of the p-n stack.

7. The transducer of claim 1, wherein the doping tunnel junction layer has a p-type doping tunnel junction layer and an n-type doping tunnel junction layer.

8. The transducer of claim 1, wherein the adjustor tunnel junction layer has a p-type adjustor tunnel junction layer and an n-type adjustor tunnel junction layer.

9. An optoelectronic device configured to convert electrical energy to optical energy, comprising:
   a plurality of p-n stacks, wherein each p-n stack comprises at least a p-layer and an n-layer, wherein all of the p-layers in the plurality of p-n stacks comprise substantially the same p-type material in the substantially the same composition, and wherein all of the n-layers in the plurality of p-n stacks comprise substantially the same n-type material in substantially the same composition; and
   a plurality of connecting layers, each connecting layer in the plurality of connecting layers being sandwiched between two adjacent p-n stacks for electrically connecting the two adjacent p-n stacks, wherein each p-n stack in the plurality of p-n stacks has a lattice spacing layer and wherein each connecting layer in the plurality of connecting layers comprises a doping tunnel junction layer having a lattice spacing type of either a stretched type or a compressed type relative to the lattice spacing layer of the p-n stack as well as an adjustor tunnel junction layer having a lattice spacing type which is opposite the doping tunnel junction layer.

10. The optoelectronic device of claim 9, wherein each of the p-n stacks in the plurality of p-n stacks is arranged such that the built-in photovoltage of each p-n stack additively contributes to an overall electric potential of the optoelectronic device.

11. The optoelectronic device of claim 9, wherein each connecting layer in the plurality of connecting layers comprises a group of layers with material or composition different than an adjacent p-layer and different than an adjacent n-layer.

12. The optoelectronic device of claim 9, wherein each p-n stack in the plurality of p-n stacks further comprises a least a bandgap energy layer sandwiched between the p-layer and the n-layer thereof.

13. The optoelectronic device of claim 9, wherein:
   each connecting layer further comprises a plurality of additional doping tunnel junction layers and a plurality of additional adjustor tunnel junction layers;
   the doping tunnel junction layer and the plurality of additional doping tunnel junction layers have a first tunnel junction thickness;
   the adjustor tunnel junction layer and the plurality of additional adjustor tunnel junction layers have a second tunnel junction thickness; and
   the first tunnel junction thickness and the second tunnel junction thickness are selected such that the connecting layer adopts the lattice spacing of the p-n stack.

14. The optoelectronic device of claim 9, wherein the doping tunnel junction layer has a p-type doping tunnel junction layer and an n-type doping tunnel junction layer.

15. The optoelectronic device of claim 9, wherein the adjustor tunnel junction layer has a p-type adjustor tunnel junction layer and an n-type adjustor tunnel junction layer.

16. The optoelectronic device of claim 9, wherein the optical energy emitted by the optoelectronic device comprises a collimated beam of light having a predetermined wavelength.

17. A semiconductor, comprising:
   a first p-type layer having a p-type material of a first composition;
   a second p-type layer having the p-type material of the first composition;
   a first n-type layer having an n-type material of a second composition;
   a second n-type layer having the n-type material of the second composition;
   a first connecting layer sandwiched between the first p-type layer and the first n-type layer, wherein the first connecting layer electrically connects the first p-type layer with the first n-type layer, wherein the first connecting layer comprises a first tunnel junction that includes at least two tunnel junction layers separated by a first lattice adjustor layer that at least partially counteracts a stress or strain induced by the at least two tunnel junction layers of the first connecting layer; and
   a second connecting layer sandwiched between the second p-type layer and the second n-type layer, wherein the second connecting layer electrically connects the second p-type layer with the second n-type layer, wherein the second connecting layer comprises a second tunnel junction that includes at least two tunnel junction layers separated by a second lattice adjustor layer that at least partially counteracts a stress or strain induced by the at least two tunnel junction layers of the second connecting layer.

18. The semiconductor of claim 17, wherein the first p-type layer and the first n-type layer form a first p-n stack, wherein the second p-type layer and the second n-type layer form a second p-n stack, and wherein the wherein first p-n stack and second p-n stack are arranged such that the built-in photovoltage of each p-n stack additively contributes to an overall electric potential of the semiconductor.

19. The semiconductor of claim 18, wherein the first p-n stack and the second p-n stack bother have a lattice spacing layer and wherein the first connecting layer and the second connecting layer both comprise a doping tunnel junction layer having a lattice spacing type of either a stretched type or a compressed type relative to the lattice spacing layer of the p-n stack as well as an adjustor tunnel junction layer having a lattice spacing type which is opposite the doping tunnel junction layer.

* * * * *